(12) United States Patent
Senda et al.

(10) Patent No.: US 7,944,259 B2
(45) Date of Patent: *May 17, 2011

(54) CLOCK SIGNAL GENERATING CIRCUIT, DISPLAY PANEL MODULE, IMAGING DEVICE, AND ELECTRONIC EQUIPMENT

(75) Inventors: Michiru Senda, Kanagawa (JP); Hiroshi Mizuhashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/327,878

(22) Filed: Dec. 4, 2008

(65) Prior Publication Data

US 2009/0146711 A1    Jun. 11, 2009

(30) Foreign Application Priority Data

Dec. 5, 2007  (JP) ................................ 2007-314635

(51) Int. Cl.
*H03L 7/06* (2006.01)
(52) U.S. Cl. ........................................ 327/158; 327/149
(58) Field of Classification Search .................. 327/147, 327/149, 156, 158
See application file for complete search history.

(56) References Cited

U.S. PATENT DOCUMENTS

| | | | | |
|---|---|---|---|---|
| 6,259,754 B1 * | 7/2001 | Jeong | | 375/375 |
| 6,310,498 B1 * | 10/2001 | Larsson | | 327/158 |
| 6,384,867 B1 * | 5/2002 | Seino et al. | | 348/558 |
| 6,625,242 B1 * | 9/2003 | Yoo et al. | | 375/376 |
| 6,686,784 B2 * | 2/2004 | Chang | | 327/157 |
| 6,690,243 B1 * | 2/2004 | Henrion | | 331/117 R |
| 6,809,567 B1 * | 10/2004 | Kim et al. | | 327/160 |
| 7,242,733 B2 * | 7/2007 | Iwata | | 375/355 |
| 7,583,117 B2 * | 9/2009 | Lin et al. | | 327/158 |
| 2007/0121773 A1 * | 5/2007 | Kuan et al. | | 375/376 |
| 2007/0216456 A1 * | 9/2007 | Kook et al. | | 327/158 |
| 2007/0247201 A1 * | 10/2007 | Lin et al. | | 327/158 |
| 2007/0247202 A1 * | 10/2007 | Lin et al. | | 327/158 |
| 2009/0096906 A1 * | 4/2009 | Senda et al. | | 348/312 |
| 2010/0052749 A1 * | 3/2010 | Rim | | 327/158 |

FOREIGN PATENT DOCUMENTS

| | | |
|---|---|---|
| JP | 2000-078000 | 3/2000 |
| JP | 2002-100982 | 4/2002 |
| JP | 2003-204261 | 7/2003 |

(Continued)

OTHER PUBLICATIONS

Japanese Office Action issued on Dec. 22, 2009 in connection with corresponding JP Application No. 2007-314635.

*Primary Examiner* — Lincoln Donovan
*Assistant Examiner* — Adam D Houston
(74) *Attorney, Agent, or Firm* — SNR Denton US LLP

(57) ABSTRACT

A delay synchronization loop type clock signal generating circuit includes: a delay line for delaying a first clock signal by a set delay amount and outputting; a delay time length setting unit for setting a delay time length of the delay line, based on phase difference between a second clock signal output from an output terminal and the first clock signal; a phase relation determining unit for determining whether or not the phase relation of the first clock signal and the second clock signal are in a particular phase relation; and a phase inversion/non-inversion unit for performing phase inversion of the first clock signal on a transmission path including the delay line, at the time of detecting the particular phase relation.

6 Claims, 52 Drawing Sheets

FOREIGN PATENT DOCUMENTS

| | | |
|---|---|---|
| JP | 2004-050650 | 2/2004 |
| JP | 2005-020711 | 1/2005 |
| JP | 2005-038557 | 2/2005 |
| JP | 2006-074580 | 3/2006 |
| JP | 2006-287641 | 10/2006 |
| JP | 2007-006517 | 1/2007 |

* cited by examiner

FIG. 6

| Q1 | Q2 | PHASE STATE |
|---|---|---|
| CONSTANTLY L | CONSTANTLY L | LOCKED STATE |
| H FIRST, DEPENDING ON PHASE DIFFERENCE (L AFTER RESETTING) | DELAYED H, DEPENDING ON PHASE DIFFERENCE (L AFTER RESETTING) | CLK2 IN DELAYED STATE |
| DELAYED H, DEPENDING ON PHASE DIFFERENCE (L AFTER RESETTING) | H FIRST, DEPENDING ON PHASE DIFFERENCE (L AFTER RESETTING) | CLK2 IN ADVANCED STATE |

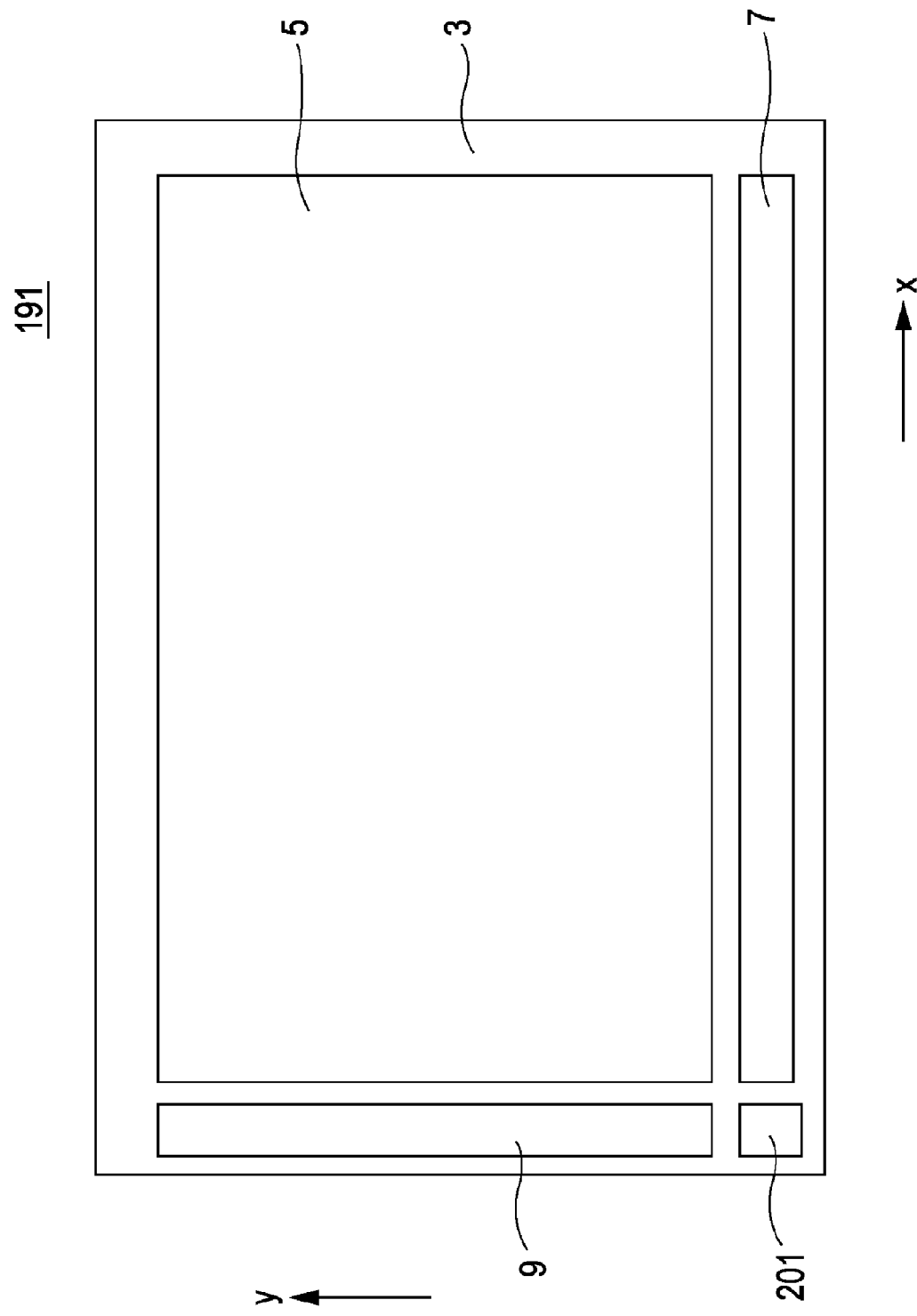

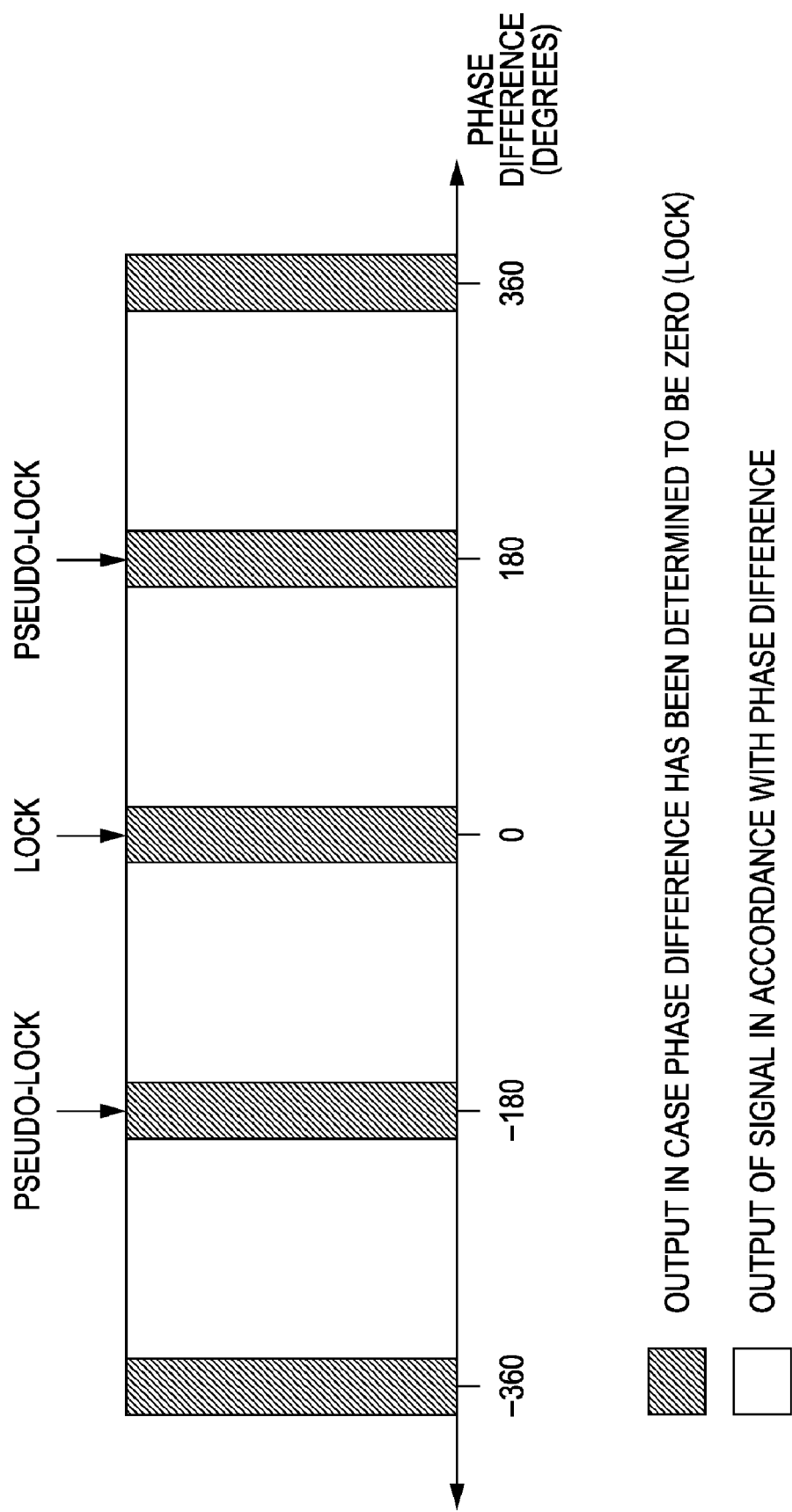

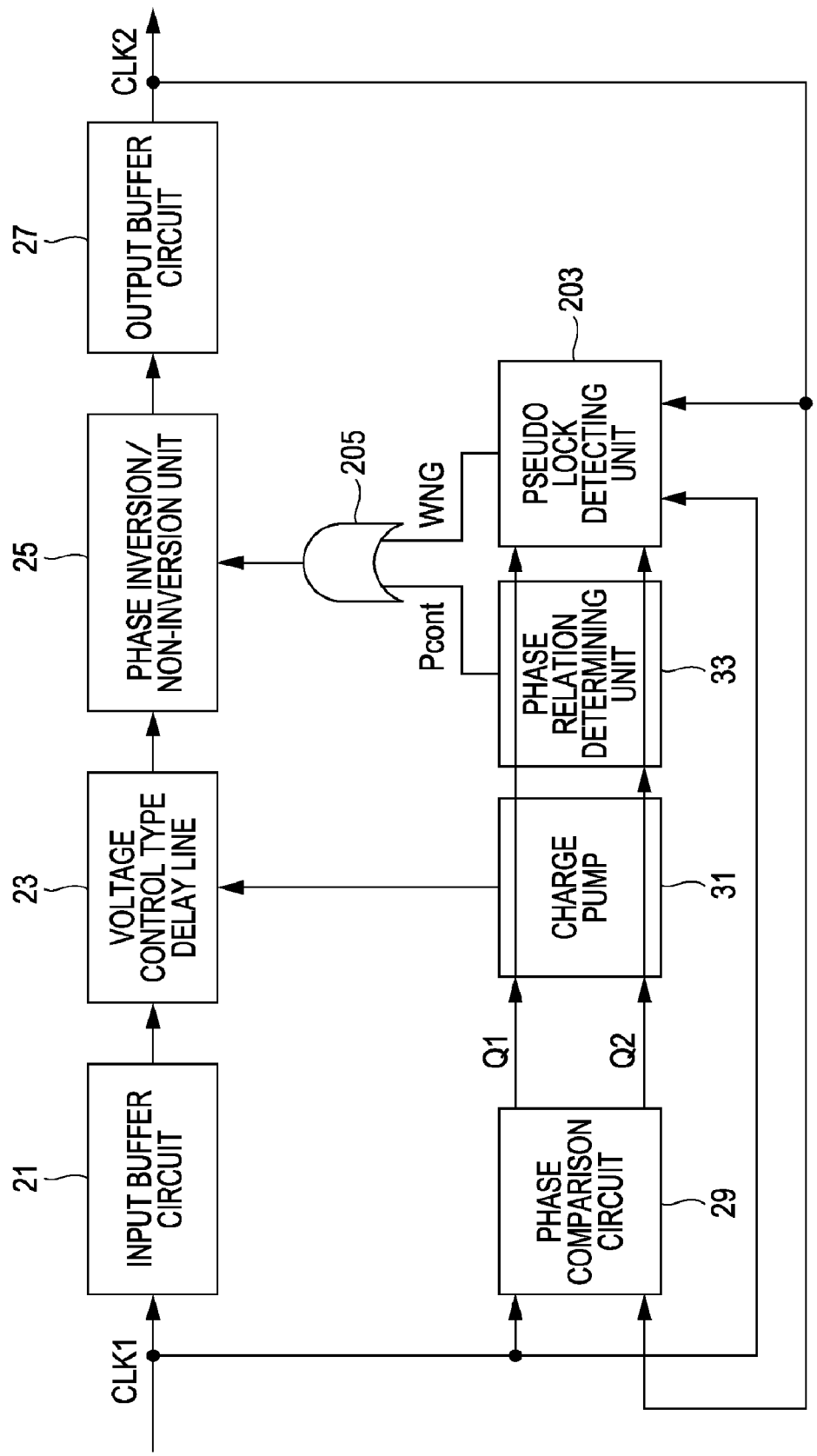

FIG. 38

| CLK1 | CLK2 | Q1 | Q2 | WNG |
|------|------|----|----|-----|
| L | L | L | L | L |
| L | L | L | H | L |
| L | L | H | L | L |
| L | H | L | L | H |
| L | H | L | H | L |
| L | H | H | L | L |
| H | L | L | L | H |
| H | L | L | H | L |
| H | L | H | L | L |
| H | H | L | L | L |
| H | H | L | H | L |
| H | H | H | L | L |

| Q | PHASE STATE |
|---|---|
| H | LOCKED STATE |
| H | STATE WHERE CLK2 IS DELAYED |
| L | STATE WHERE CLK2 IS ADVANCED |

CLOCK SIGNAL GENERATING CIRCUIT, DISPLAY PANEL MODULE, IMAGING DEVICE, AND ELECTRONIC EQUIPMENT

CROSS REFERENCES TO RELATED APPLICATIONS

The present invention contains subject matter related to Japanese Patent Application JP 2007-314635 filed in the Japanese Patent Office on Dec. 5, 2007, the entire contents of which are incorporated herein by reference.

BACKGROUND OF THE INVENTION

1. Field of the Invention

The present invention relates to a delay synchronization loop type signal generating circuit, and in particular, that which is preferably applicable to cases wherein active elements are formed using thin-film formation techniques and printing techniques. The present invention also can serve as a display panel module, an imaging device, and electronic equipment.

2. Description of the Related Art

As of recent, there is demand for high definition display resolution with not only large-screen displays but also middle-to-small range displays as well. Accordingly, higher frequency input clock signals and video signals are being used. For example, with a system display where functional circuits are integrated on a display substrate, signal frequency is reduced by conversion of video signals from serial to parallel, thereby improving operating margin.

SUMMARY OF THE INVENTION

However, the problem of circuit delay and operating margin still remains for the circuit portion upstream of parallel conversion of the video signals. Particularly, with recent system displays where the input frequency of video signals is very high, difference in delay between the clock signal generated at the display substrate and the video signal can lead to sampling error.

An example of a delay synchronization loop type signal generating circuit is disclosed in Japanese Unexamined Patent Application Publication Nos. 2006-287641 and 2007-6517.

A method has been conceived to reduce the delay difference between clock signals and video signals by using a phase regulator circuit such as a PLL (phase-locked loop) or DLL (delay-locked loop) circuit so as to approximate zero for the delay difference between clock signals and video signals.

However, there is a problem with forming or printing active elements making up the clock signal generating circuit on the insulating substrate as thin-film transistors, in that inclusion on the panel is difficult due to the circuit scale thereof. This is due to the fact that the size of thin-film transistor devices formed on printed on the insulating substrate is greater in comparison with transistors formed on a silicon (semiconductor) substrate. Particularly, a problem can be easily foreseen where the circuit scale becomes great in the event of configuring portions regarding which delay amount is to be set in the form of digital circuits. Increased circuit scale leads to poor theoretical yield, which in turn leads to increased costs.

A delay synchronization loop type clock signal generating circuit according to an embodiment of the present invention includes: a delay line for delaying a first clock signal by a set delay amount and outputting; a delay time length setting unit for setting a delay time length of the delay line, based on phase difference between a second clock signal output from an output terminal and the first clock signal; a phase relation determining unit for detecting whether or not the phase relation of the first clock signal and the second clock signal are in a particular phase relation; and a phase inversion/non-inversion unit for performing phase inversion of the first clock signal on a transmission path including the delay line, at the time of detecting the particular phase relation.

The delay synchronization loop type clock signal generating circuit may further include: a pseudo lock state detecting unit for detecting a pseudo lock state between the first clock signal and the second clock signal; and a pseudo lock state disengaging unit for instructing the phase inversion/non-inversion unit to perform phase inversion upon detecting a pseudo lock state. Including this function enables operation of the clock signal generating circuit, mistaking a pseudo lock state for a proper locked state, to be avoided in a sure manner.

The phase relation determining unit may determine whether or not the particular phase relation has occurred during a reset period, and instruct inversion or non-inversion to the phase inversion/non-inversion unit following ending of the reset period. This is because the delay amount is fixed during the reset period, so the phase relation can be accurately detected.

In the event that the particular phase relation implies a state in which the phase of the second clock signal is advanced as to that of the first clock signal, the phase is preferably adjusted only in a state wherein the phase of the second clock signal is delayed as to that of the first clock signal. Accordingly, the phase adjustment range can be halved.

In the same way, in the event that the particular phase relation implies a state in which the phase of the second clock signal is delayed as to that of the first clock signal, the phase is preferably adjusted only in a state wherein the phase of the second clock signal is advanced as to that of the first clock signal. Accordingly, the phase adjustment range can be halved.

Active elements configuring the delay synchronization loop type clock signal generating circuit may be formed on an insulating substrate using thin-film forming techniques or printing techniques. In this case, while a great number of active elements are generally used to reduce the effects of property irregularity, the circuit scale can be reduced due to reduction in the number of elements since the phase adjustment range has been narrowed.

Also proposed are a display panel module, imaging apparatus, electronic equipment, and so forth. The panel module may be configured of a display panel, a clock signal generating circuit of a configuration described above, and a driving circuit for driving the display panel based on the second clock signal which is the output clock thereof.

The active elements of the clock signal generating circuit may be thin-film transistors formed or printed on an insulating substrate. The display panel preferably is a liquid display panel or organic EL panel, for example.

Also, an imaging apparatus according to an embodiment of the present invention includes: an imaging device; a clock signal generating circuit of a configuration described above; and a driving circuit for driving the imaging device based on the second clock signal which is the output clock of the clock signal generating circuit.

Also, electronic equipment according to an embodiment of the present invention includes: a clock signal generating circuit of a configuration described above; a system control unit for controlling operations of the entire system; and an operation input unit for accepting operation input to the system control unit.

Employing the clock signal generating circuit with the above configuration enables the adjustment range of delay amount to be halved, whereby circuit area can be reduced even when configuring the clock signal generating circuit with thin-film transistor having high resistance.

Also, the number of stages of delay devices forming the delay line are reduced, whereby reduction in electric power consumption can be realized. Further, the time up to phase lock can be reduced, due to the number of stages of delay devices forming the delay line being reduced.

BRIEF DESCRIPTION OF THE DRAWINGS

FIG. 6 is a diagram illustrating the relation between determination output and phase state;

FIG. 34 is a diagram illustrating a plan configuration example of a display panel according to a fifth embodiment;

FIG. 35 is a diagram for explaining a pseudo lock state;

FIG. 36 is a diagram illustrating a configuration example of a clock signal generating circuit according to the fifth embodiment;

FIG. 38 is a diagram illustrating the input/output relation of the pseudo lock detecting unit;

DESCRIPTION OF THE PREFERRED EMBODIMENTS

Figure 1:
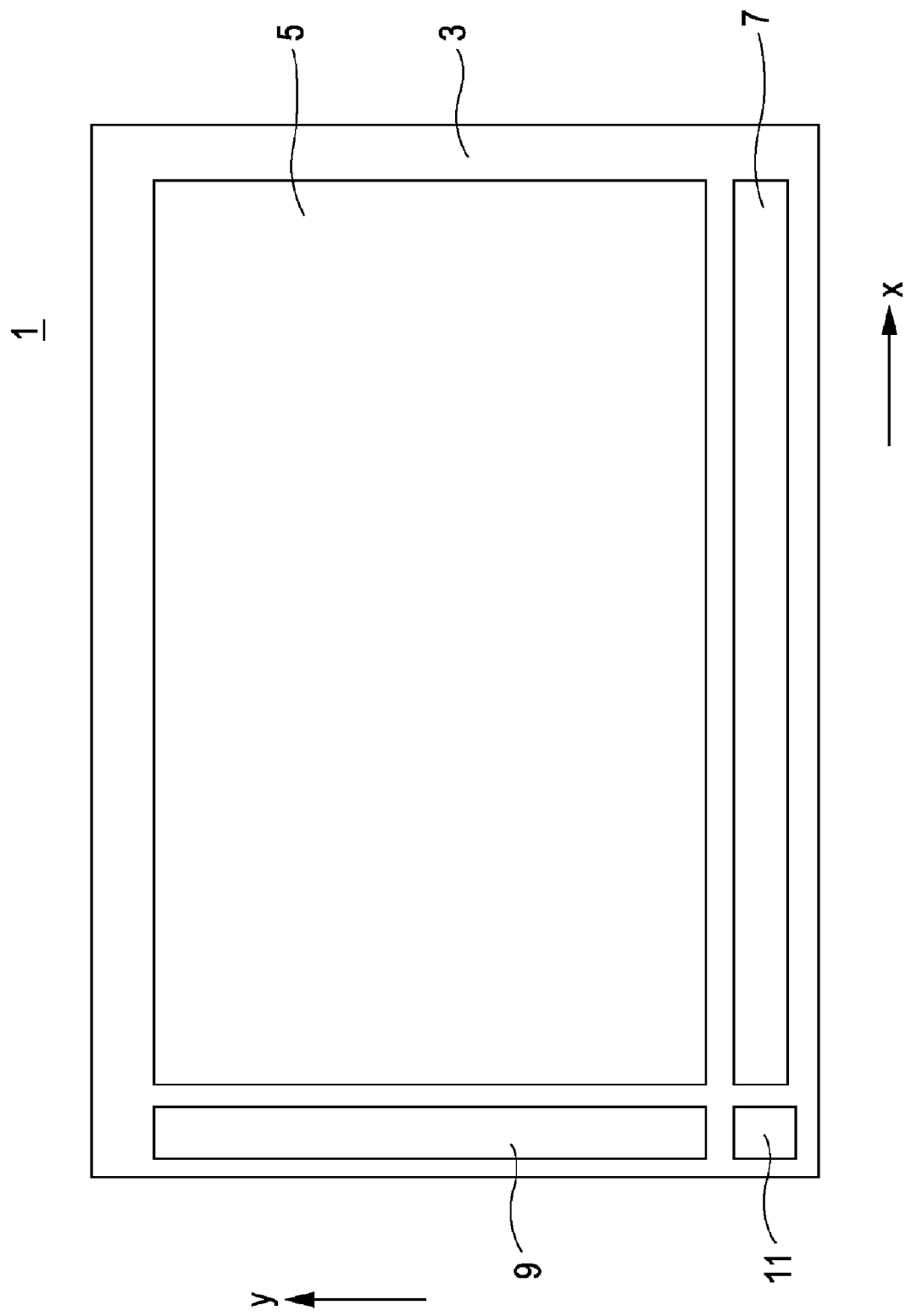
FIG. 1 is a diagram illustrating a plan configuration example of a display according to a first embodiment.

Cases of applying the present invention to a system display will be described. Note that portions not particularly illustrated in the drawings or description in the Specification should be assumed to be applying related art. Also note that the following description is but embodiments of the present invention, and that the present invention is not restricted thereby.

A First Embodiment

A-1 Configuration of Display Panel

FIG. 1 illustrates a plan view configuration of a display panel 1 to be described in the present embodiment. In the case of this embodiment, a display region 5 and the peripheral circuits thereof are formed together with the same process on the face of the glass substrate 3. That is to say, we will assume a case wherein the display panel 1 is a system panel.

Gate lines and signal lines are formed in lattice form on the display region 5 in accordance with the resolution, and pixel circuits are formed at each intersection position thereof. That is to say, the display region 5 has a panel configuration corresponding to the active matrix driving method. Note that gate lines are wiring extending in the x direction of the display region, and signal lines are wiring extending in the y direction of the display region.

At each pixel circuit, a switching transistor configured of a thin-film transistor, and a retentive capacity Cs for holding signal voltage written thereto, are formed. Note that the gate electrode of the switching transistor is connected to the gate line, and one main electrode is connected to the signal line, while the other main electrode is connected to a pixel electrode.

The pixel electrode generates an electric field between itself and an unshown facing electrode, variably controlling the alignment direction with this electric field. Note that in the case of the present embodiment, the structure of the pixel circuit is irrelevant. For example, the embodiment may be applied to a method wherein the pixel electrodes and facing electrode are provided of different panel substrates so as to face one another, IPS (In-Plane Switching) where the pixel electrodes and facing electrode are provided on the same panel substrate, or other methods as well.

Formed around the display region 5 are a signal line driver 7, gate line driver 9, clock signal generating circuit 11, and so forth, as functional circuits.

The signal line driver 7 is a driving circuit for applying signal voltage according to write timing to the corresponding signal lines. The signal line driver 7 is configured of a shift register of a number of flip-flops equivalent to the number of pixels in the x direction, digital/analog conversion circuits for latching the signal values at the output of each flip-flop and converting the latch output to analog voltage, and so forth.

The gate driver 9 is a driving circuit for sequentially providing gate lines with the write timing of the signal voltage. The gate driver 9 is configured of a number of flip-flops equivalent to the number of pixels in the y direction. The signal line driver 7 and the gate driver 9 are driven by clock signals provided from the clock signal generating circuit 11 (later-described CLK2).

Incidentally, the clock signal generating circuit 11 is a circuit to which an input clock, synchronized with the video signal, is input, and an output clock CLK2 synchronized with the input clock CLK1 as described later is generated. The clock signal generating circuit 11 is also provided with a new function, namely, a function for adjusting the phase in a state wherein the phase of the output clock CLK2 is delayed as the phase of the input clock CLK1.

While details will be described later, due to this function, the phase adjustment range of the clock signal generating circuit 11 is only half of the usual 360°, i.e., is 180°. Accordingly, the number of stages of delay lines is only half the number for a general clock signal generating circuit, and the time till phase-lock can also be cut in half. In the case of this embodiment, we will say the active elements making up the clock signal generating circuit 11 have been formed on the glass substrate 3, which is an insulating substrate, using a semiconductor process.

Driving signals to the signal line driver 7, gate line driver 9, and clock signal generating circuit 11, are supplied via unshown wiring. Incidentally, an unshown facing glass is disposed on the face of the glass substrate 3 which is the lower substrate, so as to seal in the liquid crystal layer.

A-2 Configuration of Clock Signal Generating Circuit (Delay Amount Analog Control Type)

Figure 2:
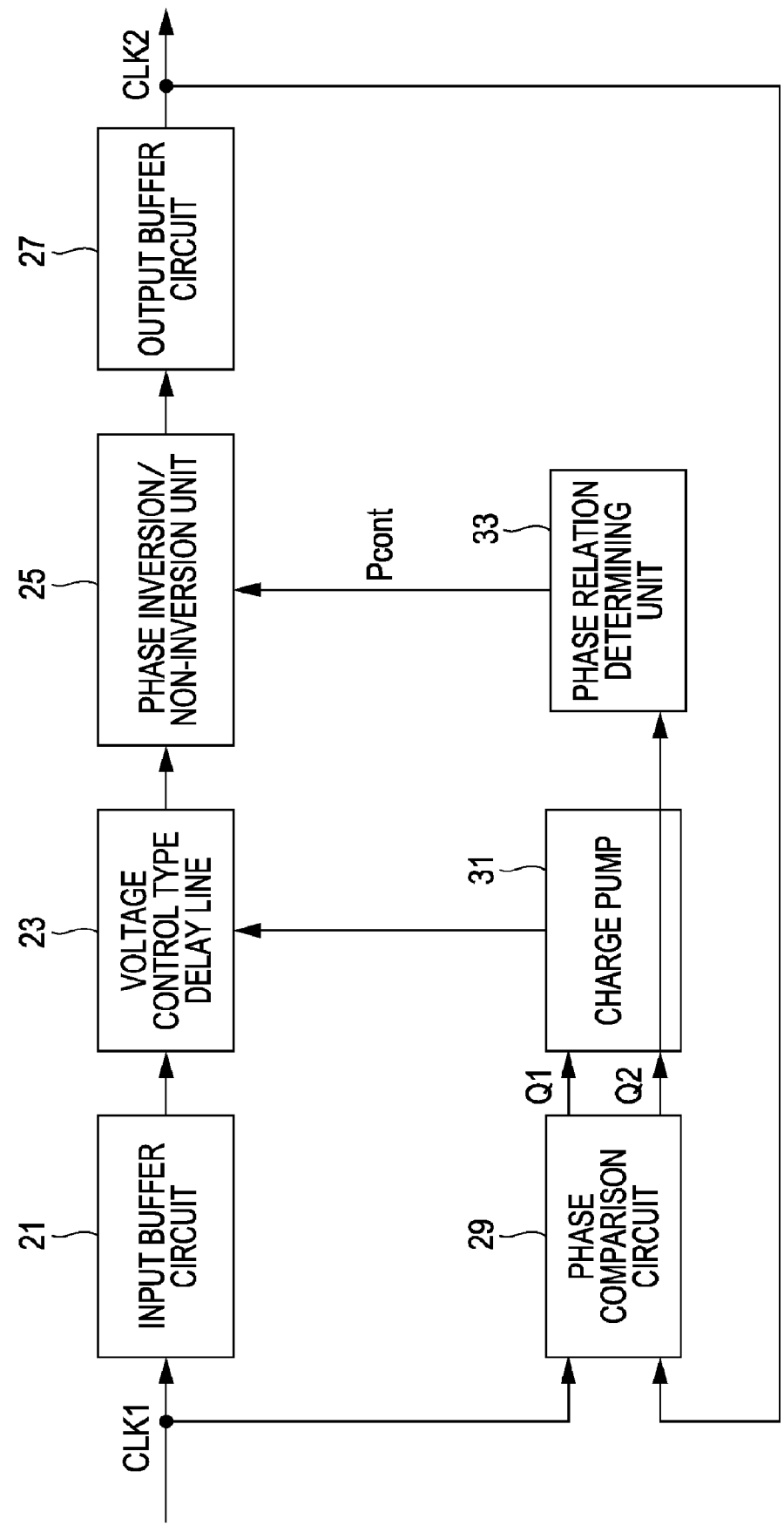
FIG. 2 is a diagram illustrating a configuration example of a clock signal generating circuit according to the first embodiment.

FIG. 2 illustrates an internal configuration example of a delay synchronization loop type clock signal generating circuit 11, proposed by the present Inventors in the present Specification. The clock signal generating circuit 11 includes an input buffer circuit 21, a voltage control type delay line 23, a phase inversion/non-inversion unit 25, an output buffer circuit 27, a phase comparison circuit 29, a charge pump 31, and a phase relation determining unit 33.

The input buffer circuit 21 and the output buffer circuit 27 are each circuits wherein multiple inverter circuits are connected serially. The input clock CLK1 input to the input buffer circuit 21 will also be referred to as "first clock", and the output clock CLK2 output from the output buffer circuit 27 will also be referred to as "second clock".

The voltage control type delay line 23 is a delay line capable of analog control of the delay amount of the input clock CLK1. The voltage control type delay line 23 is a type of delay line which can control the delay amount by variably controlling the bias voltage Vbias of a transistor pair connected between the output stage of each inverter circuit and load capacitance.

Figure 3:
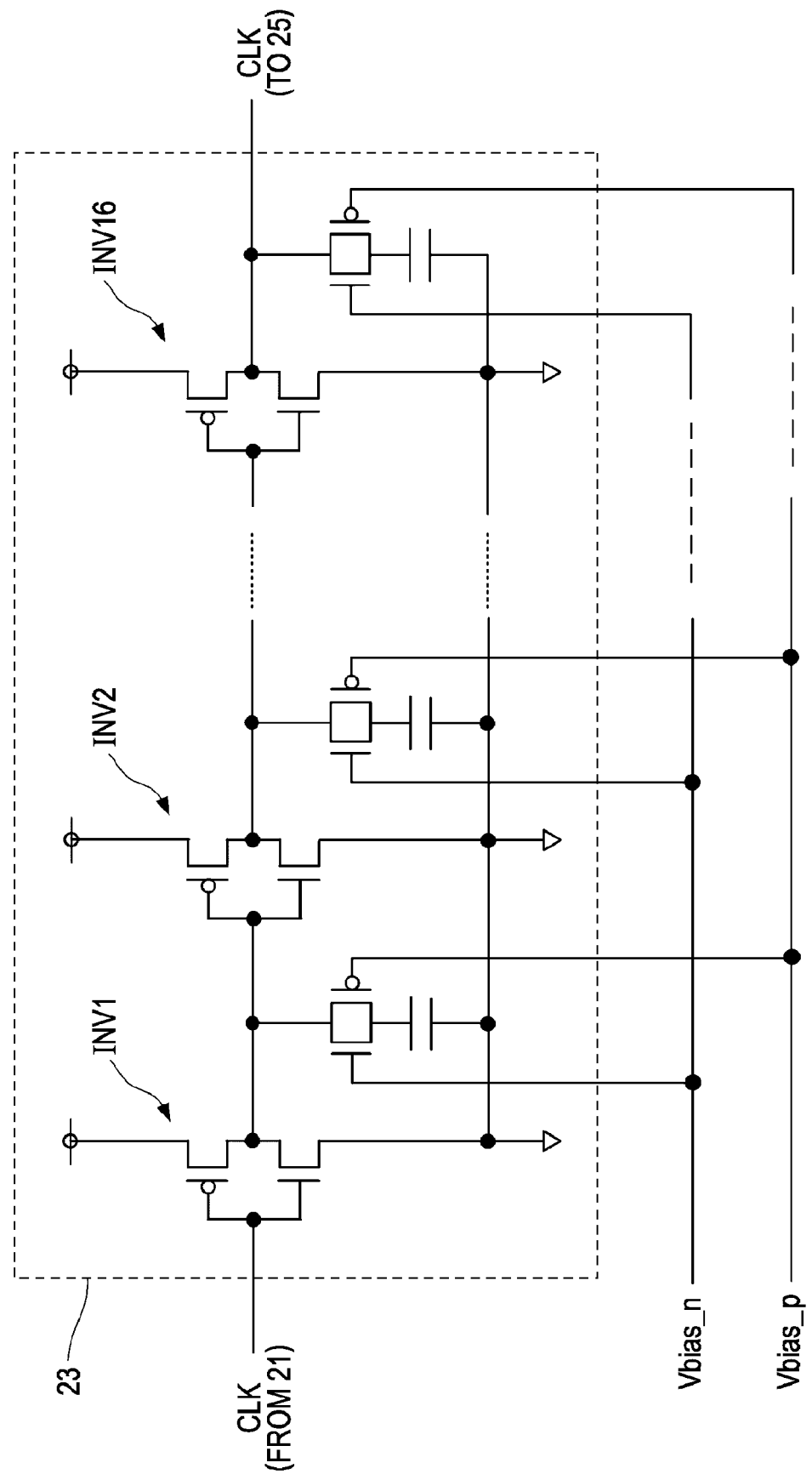
FIG. 3 is a diagram illustrating a configuration example of a voltage control type delay line.

FIG. 3 illustrates a circuit example of the voltage control type delay line 23. The voltage control type delay line 23 is configured of a serial connection circuit of CMOS inverter circuits having load capacitance. In the case of this embodiment, the number of connected CMOS inverters is 16 stages. Note however, that a transistor pair is provided between the output terminal and ground of each CMOS inverter circuit. Also note that the transistor pair is a parallel circuit of an n-channel transistor and a p-channel transistor.

In the case of this configuration, in the event that the bias voltage Vbias_n of the n-channel transistor is low (i.e., the transistor is open) for example, the delay amount per delay device stage is the smallest. On the other hand, in the event that the bias voltage Vbias_n of the n-channel transistor is high (i.e., the transistor is closed) for example, the delay amount per delay device stage is the longest.

Note that the bias voltage Vbias_n and bias voltage Vbias_p is provided in common to the transistor pairs of all of the inverter circuit stages. Accordingly, increase/decrease of delay amount is executed simultaneously for all 16 inverter circuit stages. Accordingly, the change in delay time length for the voltage control type delay line 23 is given in the form of change in delay amount per stage multiplied by 16.

The phase inversion/non-inversion unit 25 is a circuit for inverting the clock signal input from the voltage control type delay line 23 and outputting, or outputting the clock signal input from the voltage control type delay line 23 without inversion. In the case of this embodiment, the phase inversion/non-inversion unit 25 is situated between the voltage control type delay line 23 and the output buffer circuit 27. That is to say, the phase inversion/non-inversion unit 25 is situated on the delay line.

Switching of the clock phase conversion operations is controlled based on a phase conversion control signal Pcont provided from the phase relation determining unit 33. In the case of this embodiment, the 180° inversion operation of the clock phase is executed in the event that the phase of the output clock CLK2 is advanced as to the phase of the input clock CLK1. On the other hand, non-inversion operation of the clock phase is executed in the event that the phase of the output clock CLK2 is delayed as to the phase of the input clock CLK1. Switching of the phase conversion operations of the phase inversion/non-inversion unit 25 is executed by the phase relation determining unit 33.

Figure 4:
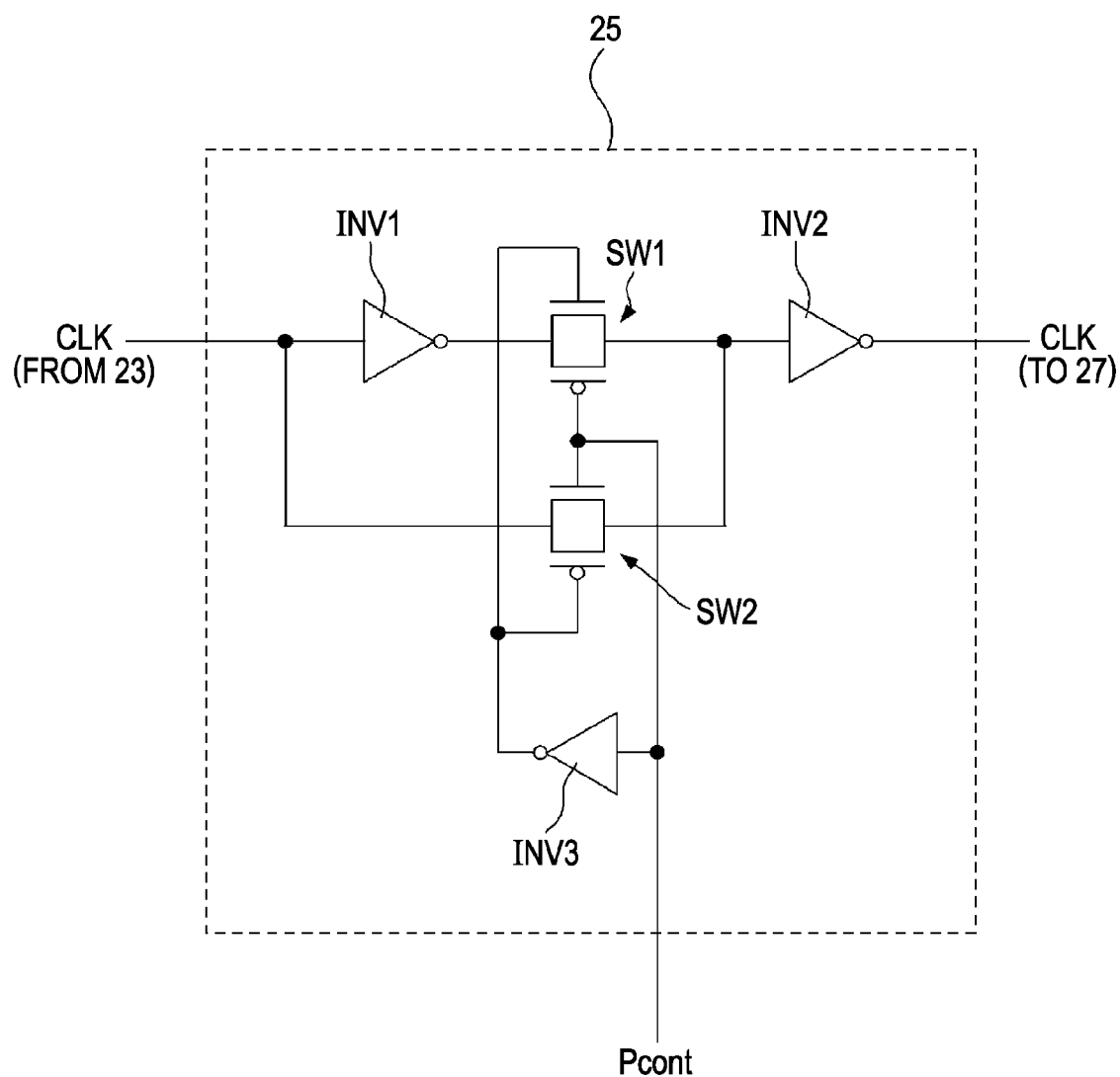
FIG. 4 is a diagram illustrating a configuration example of a phase inversion/non-inversion unit.

FIG. 4 shows a circuit example of the phase inversion/non-inversion unit 25. The phase inversion/non-inversion unit 25 shown in FIG. 4 has a transmission path passing through two inverter circuits INV (path of SW1) and a transmission path passing through only one (path of SW2), with the switches SW1 and SW2 being disposed so that clock signals pass through only one or the other.

Note that the operations of the switches SW1 and SW2 are directly opposite. Accordingly, the phase inversion/non-inversion unit 25 shown in FIG. 4 inverts the connection of the switching signal. Note that an inverter circuit INV3 is used for simultaneously opening/closing the n-channel transistor and p-channel transistor making up the switches SW1 and SW2.

In the case of the circuit configuration shown in FIG. 4, in the event that the phase conversion control signal Pcont is at "H" level, the switch SW2 is closed. That is to say, the transfer path passing through only one inverter circuit is selected, and a clock subjected to 180° phase inverse as to the clock phase at the time of input is output. On the other hand, in the event that the phase conversion control signal Pcont is at "L" level, the switch SW1 is closed. That is to say, the transfer path passing through two inverter circuits is selected, and the clock is output with the clock phase at the time of input, with no change.

The phase comparison circuit 29 is a circuit for comparing the edge phase of the input clock CLK1 and the edge phase of the output clock CLK2, and outputting determination outputs Q1 and Q2 in accordance with the comparison relation downstream.

Figure 5:
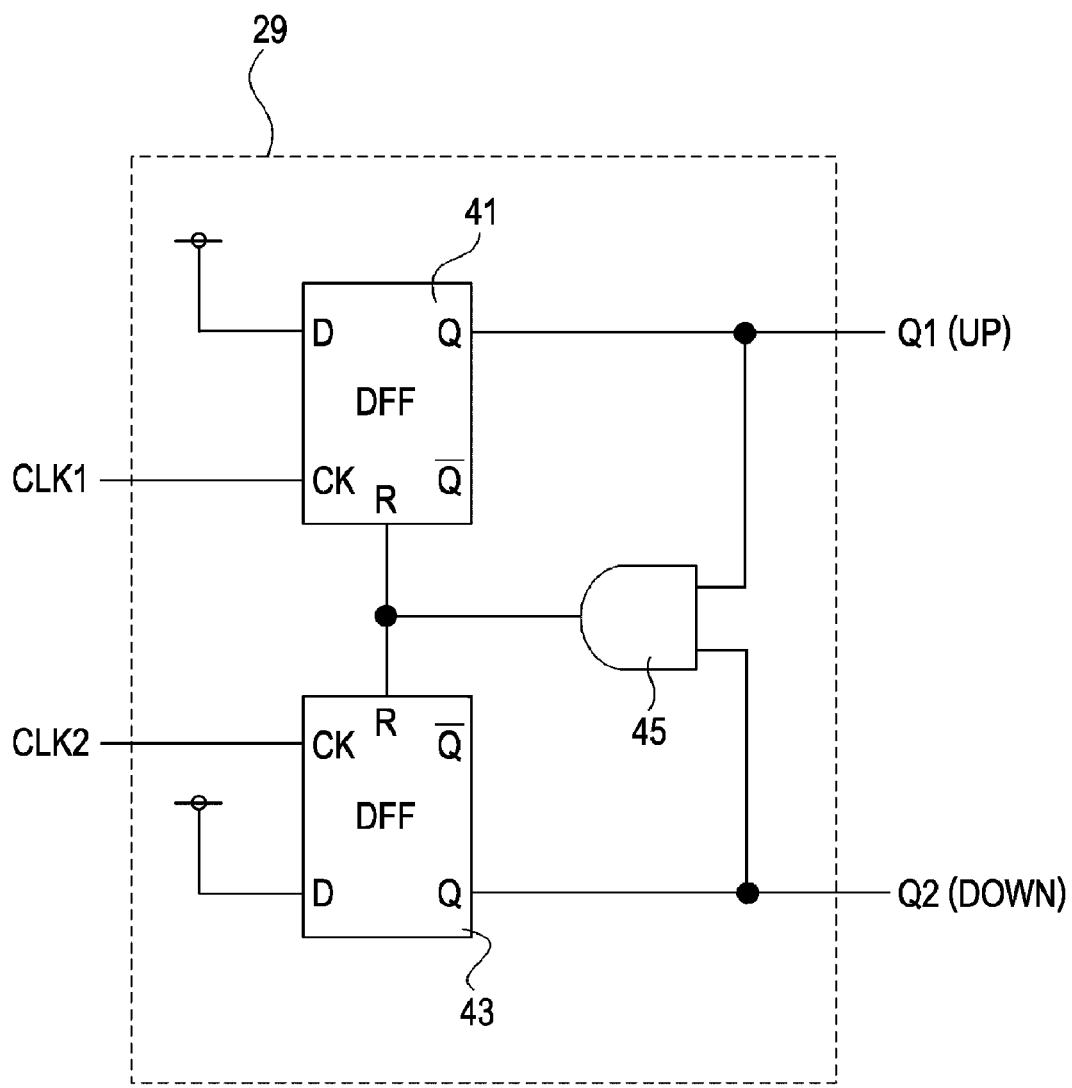
FIG. 5 is a diagram illustrating a configuration example of a phase comparison circuit.

FIG. 5 illustrates a circuit configuration example of the phase comparison circuit 29. The phase comparison circuit 29 is configured of a D flip-flop 41 operating with the input clock CLK1 as the clock signal, a D flip-flop 43 operating with the output clock CLK2 as the clock signal, and an AND gate 45 which obtains the logical conjunction of the output signals of the D flip-flops 41 and 43 and generates reset signals for the D flip-flops 41 and 43.

In the case of this circuit configuration, with the phase comparison circuit 29, the output signal of the D flip-flop corresponding to the clock CLK regarding which the rising edge has been detected first goes to "H" level, and the determination outputs Q1 and Q2 of the D flip-flops 41 and 43 are both reset at a timing at which the output signal of the D flip-flop corresponding to the clock CLK regarding which the "H" level appears later goes to "H" level.

Consequently, the determination outputs Q1 and Q2 are output for "H" level for an amount corresponding to the phase difference. For example, in the event that the phase of the input clock CLK1 is advanced as to the output clock CLK2, the determination output Q1 is "H" level of an amount corresponding to the period of the phase difference. On the other hand, in the event that the phase of the input clock CLK2 is advanced as to the output clock CLK1, the determination output Q2 is "H" level of an amount corresponding to the period of the phase difference. Note that in the event that the edge phases of the input clock CLK1 and the output clock CLK2 are about the same, at the phase comparison circuit 29 determination outputs Q1 and Q2 of "L" level continue to be output from the D flip-flops 41 and 43. FIG. 6 illustrates the relation between the above-described determination outputs Q1 and Q2 and phase state.

The charge pump 31 is a circuit for generating bias voltage Vbias_n and bias voltage Vbias_p (analog voltage) to supply to the voltage control type delay line 23 in accordance with the determination outputs Q1 and Q2 of the phase comparison circuit 29.

Figure 7:
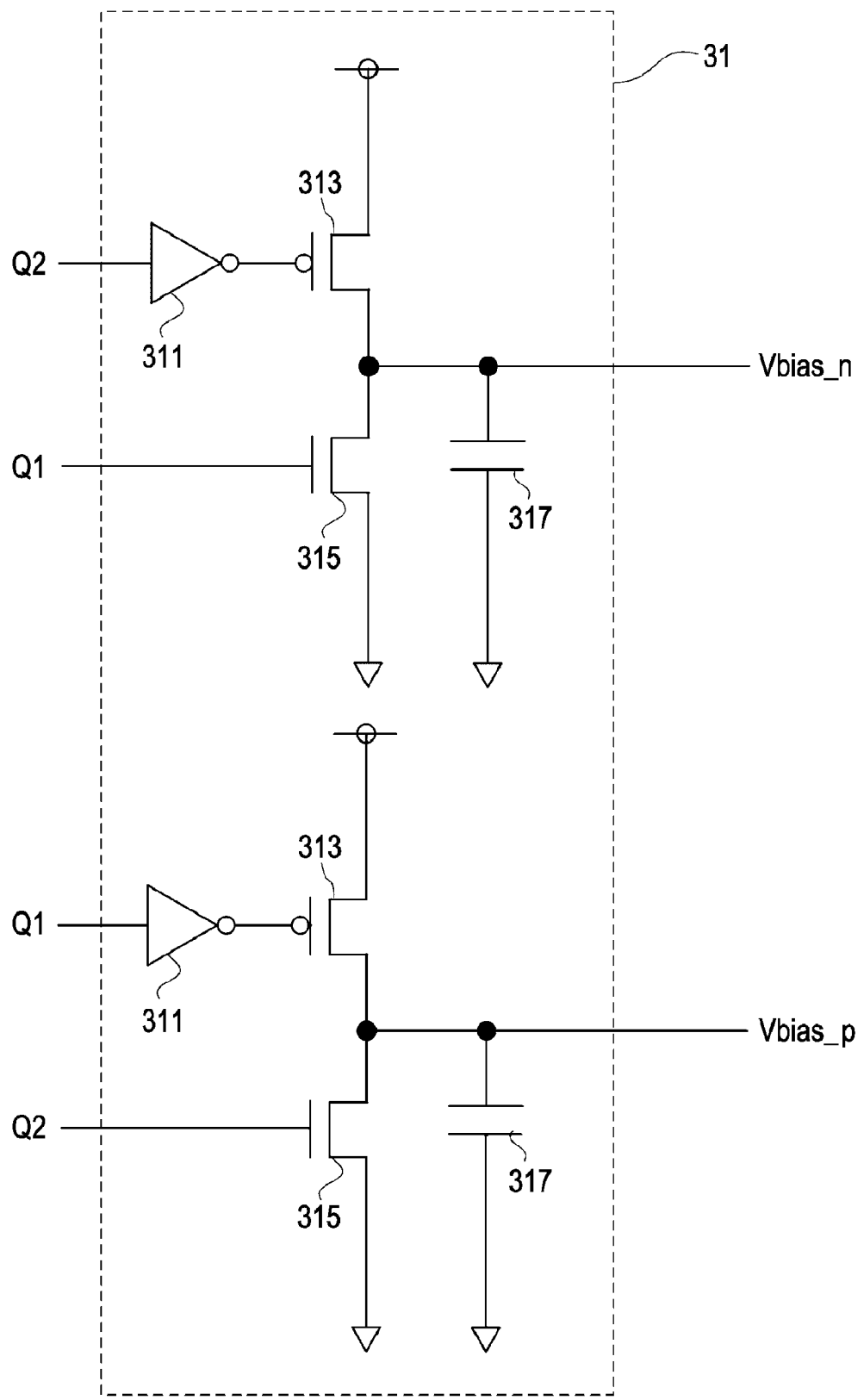
FIG. 7 is a diagram illustrating a configuration example of a charge pump.

FIG. 7 shows a circuit configuration of the charge pump 31. The charge pump 31 is configured of an n-channel bias voltage generating circuit unit, and a p-channel bias voltage generating circuit unit. The bias voltage generating circuit units are each configured of an inverter 311, CMOS switches 313 and 315, and a retaining capacitance 317.

For example, with the n-channel bias voltage generating circuit unit, in the event that the determination output Q1 is "L" level and the determination output Q2 is "H" level, retaining capacitance is charged. At this time, the n-channel bias voltage Vbias_n rises. On the other hand, in the event that the determination output Q1 is "H" level and the determination output Q2 is "L" level, retaining capacitance is discharged. At this time, the n-channel bias voltage Vbias_n drops.

Also, with the p-channel bias voltage generating circuit unit, in the event that the determination output Q1 is "L" level and the determination output Q2 is "H" level, retaining capacitance is discharged. At this time, the p-channel bias voltage Vbias_p drops. On the other hand, in the event that the determination output Q1 is "H" level and the determination output Q2 is "L" level, retaining capacitance is charged. At this time, the p-channel bias voltage Vbias_p rises.

Further, in the event that both determination outputs Q1 and Q2 are at "L" level, both circuit units hold the immediately-preceding value for retaining capacitance.

Figure 8:
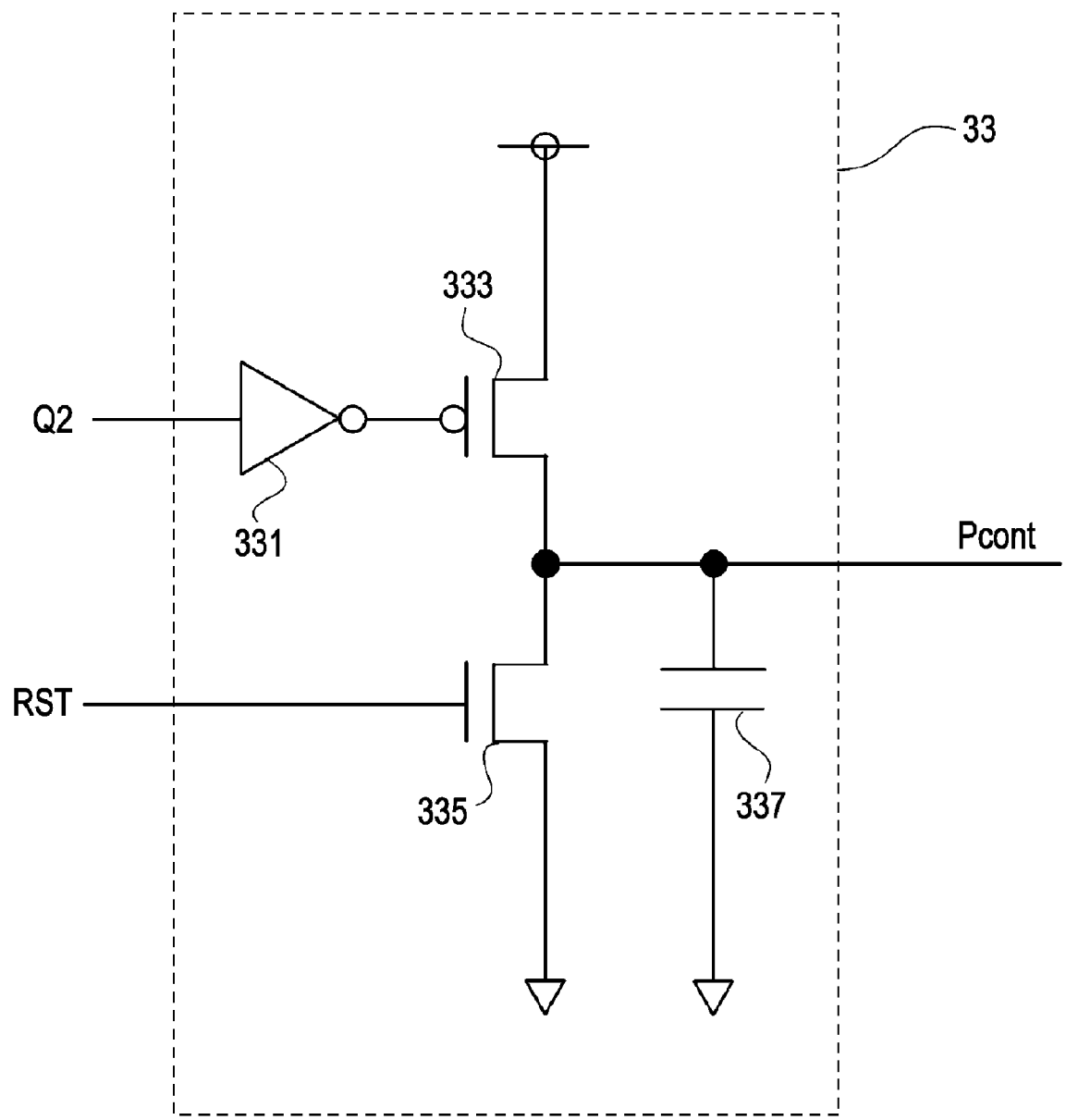
FIG. 8 is a diagram illustrating a configuration example of a phase relation determining unit according to the first embodiment.

The phase relation determining unit 33 is a circuit for determining the phase relation between the input clock CLK1 and the output clock CLK2 based on the determination output Q2 from the phase comparison circuit 29. FIG. 8 shows a circuit example of the phase relation determining unit 33. The phase relation determining unit 33 shown in FIG. 8 is configured of an inverter 331, CMOS switch (p-channel MOS transistor 333 and n-channel MOS transistor 335), and retentive capacitance 337.

Note that the determination output Q2 is input to the inverter 331 and the inverted output thereof is used for controlling the p-channel MOS transistor 333. On the other hand, a reset signal RST is used for controlling the n-channel MOS transistor 335.

With this circuit configuration, in the event that the determination output Q2 is "H" level (i.e., the phase of the output clock CLK2 relatively advanced) for example, the phase conversion control signal Pcont provided with the potential of the retentive capacitance 337 is high power source potential (i.e., "H" level). On the other hand, in the event that the reset signal RST is "H" level, the phase conversion control signal Pcont provided with the potential of the retentive capacitance 337 is low power source potential (i.e., "L" level).

Note that the reason why the phase conversion control signal Pcont is generated using only the determination output Q2 is that in the event that the phase of the output clock CLK2 advances as to the input clock CLK1, this is to be subjected to 180° phase inversion. That is to say, this is to adjust phase adjustment by the voltage control type delay line 23 within the range of delay as to the input clock CLK1.

Figure 9:
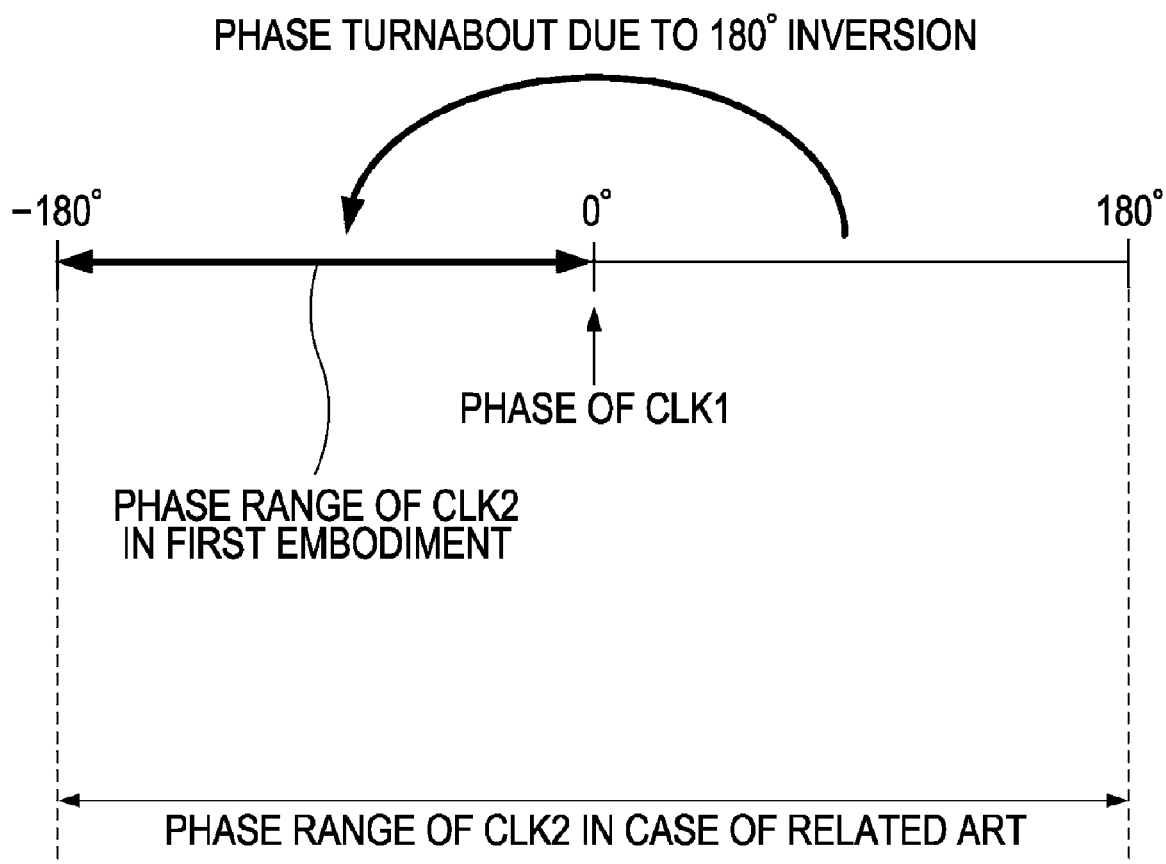
FIG. 9 is a diagram for describing phase inversion operations according to the first embodiment.

FIG. 9 is a conceptual drawing illustrating the phase adjustment range in the case of using the phase relation determining unit 33. As shown in FIG. 9, the adjustment range with the clock signal generating circuit 11 is reduced from the 360° in the related art to 180°. This halving of the adjustment range is a feature of the clock signal generating circuit 11.

A-3 Operations and Advantages of the Clock Signal Generating Circuit

Figure 10:
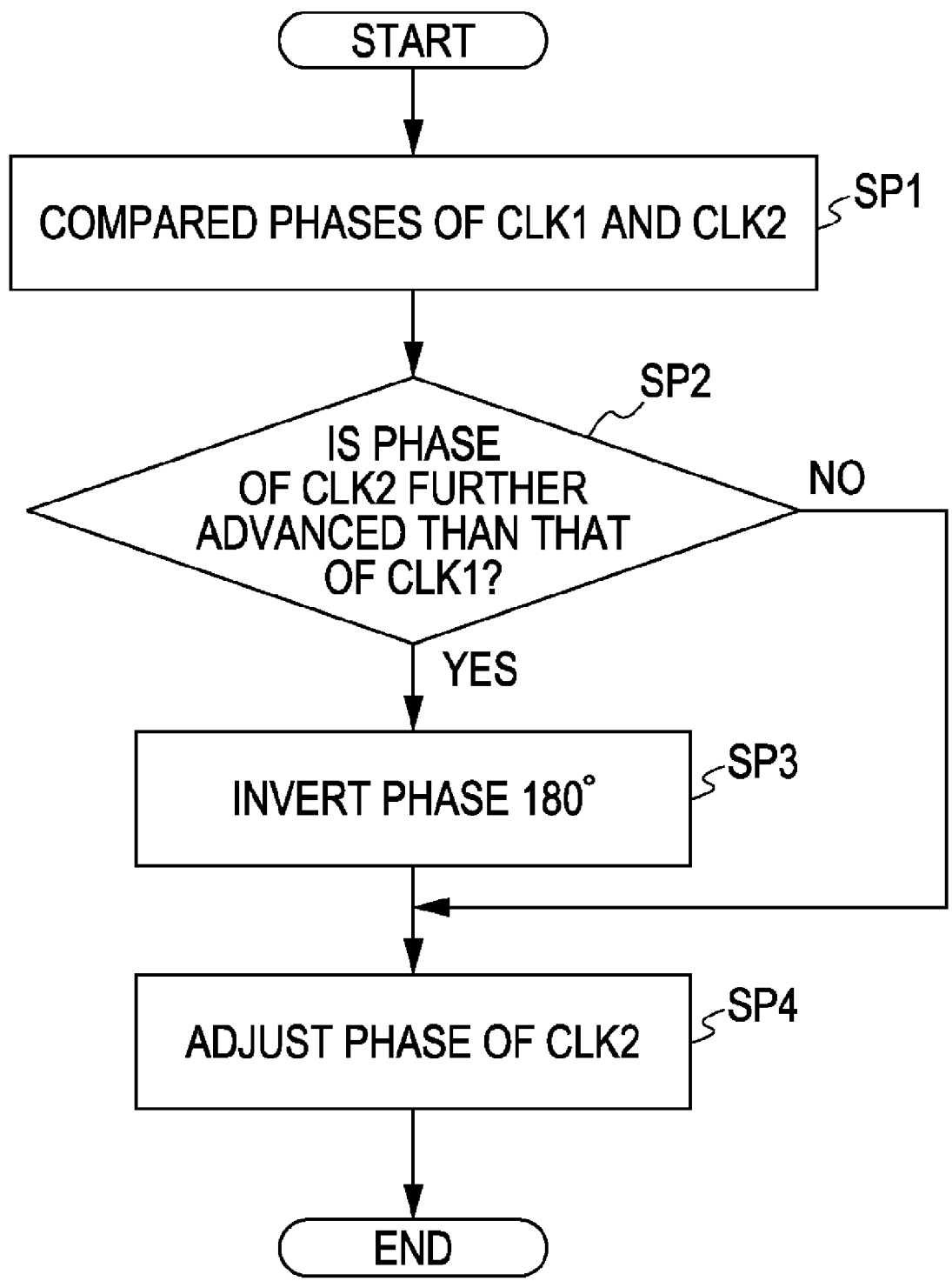
FIG. 10 is a diagram illustrating operation procedures of the clock signal generating circuit according to the first embodiment.

Phase control operations using the clock signal generating circuit 11 will be described with reference to FIG. 10.

In step S1, at the clock signal generating circuit 11, the phase comparison circuit 29 repeatedly compares the phases of the input clock CLK1 and the output clock CLK2.

Next, at the clock signal generating circuit 11, determination is made in step S2 regarding whether or not the phase of the output clock CLK2 is advanced as to the phase of the input clock CLK1. More specifically, operations equivalent to this determination processing are executed as operations of supplying the determination output Q2 to the phase relation determining unit 33.

In the event that a positive result is obtained from the determination processing (i.e., in the event that the phase of the output clock CLK2 is advanced), in step S3 the clock signal generating circuit 11 inverts the phase of the output clock CLK2 by 180° and outputs. Specifically, the phase conversion control signal Pcont with the "H" level is output from the phase relation determining unit 33, and the clock phase is inverted 180° at the phase inversion/non-inversion unit 25.

On the other hand, in the event that a negative result is obtained from the determination processing in step S2, (i.e., in the event that the phase of the output clock CLK2 is either delayed or synchronized with the input clock CLK1), the current phase relation of the output clock CLK2 is held at the clock signal generating circuit 11. Specifically, the phase conversion control signal Pcont with the "L" level is output from the phase relation determining unit 33, and the clock phase is output at the phase inversion/non-inversion unit 25 as input, with no change.

Subsequently, in step S4 the clock signal generating circuit 11 adjusts the delay amount of the voltage control type delay line 23 in accordance with the phase difference of the input clock CLK1 and the output clock CLK2. As a result, the phase adjustment capability demanded of the voltage control type delay line 23 is restricted to a range of 180° as to the input clock CLK1.

This means that the number of states of delay devices (inverter circuits, load capacitance, transistor pairs) making up the voltage control type delay line 23 can be reduced to half that of the related art (which adjusts for 360°). Halving the number of delay devices means that the circuit area of the clock signal generating circuit 11 can be markedly reduced. Reduction of delay devices is also advantageous in reduction of electric power consumption at the clock signal generating circuit 11. Moreover, a narrower adjustment range for the mount of delay means that the time up to output of an output clock CLK2 phase-synchronized with the input clock CLK1 can be markedly reduced. That is to say, a clock signal generating circuit with a short acquisition time up to phase lock can be realized.

B Second Embodiment

B-1 Configuration of Display Panel

Figure 11:
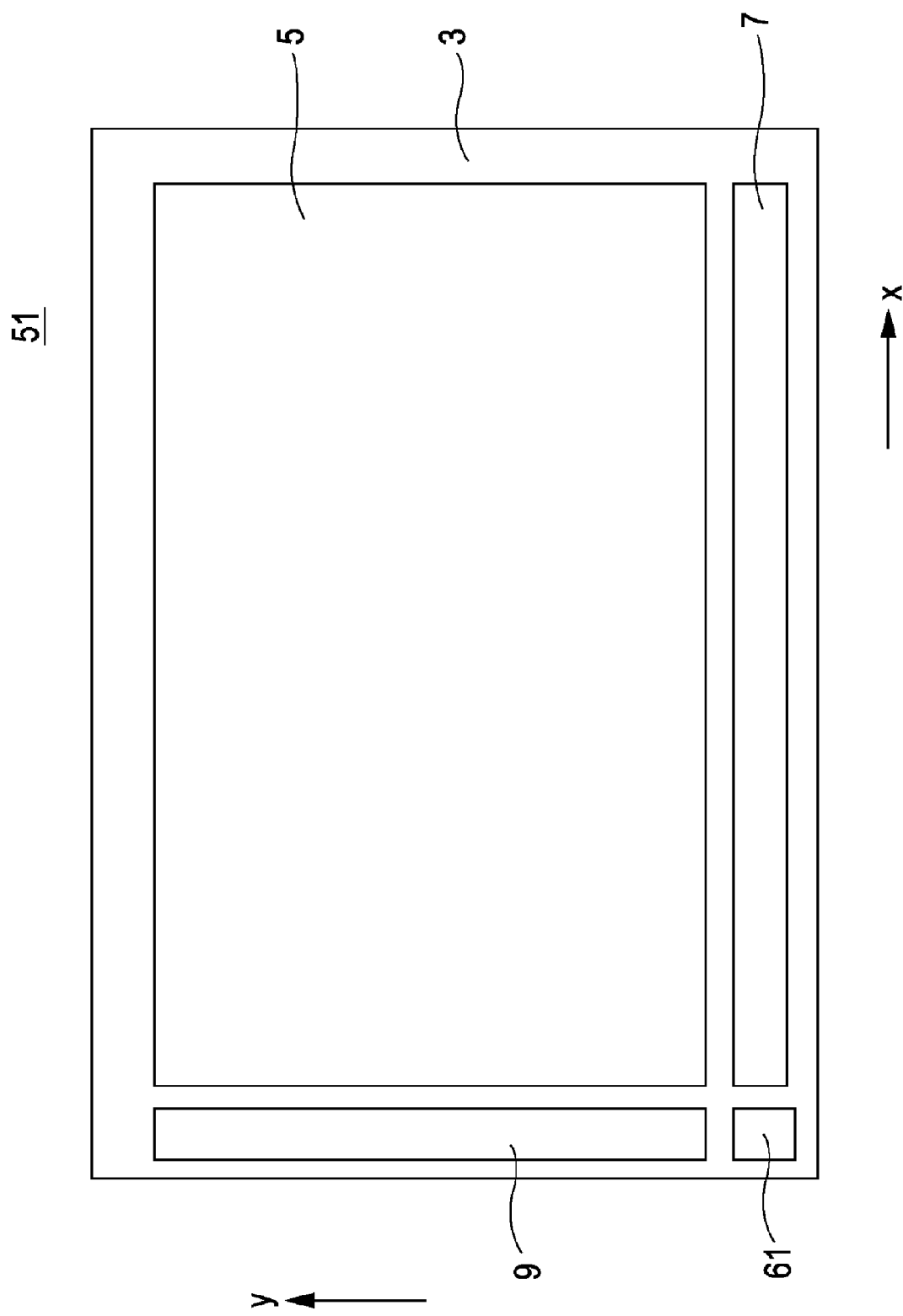
FIG. 11 is a diagram illustrating a plan configuration example of a display panel according to a second embodiment.

FIG. 11 illustrates a plan view configuration of a display panel 51 to be described in the present embodiment. In FIG. 11, components corresponding to FIG. 1 are denoted with the same reference numerals. As shown in FIG. 11, the basic configuration of the display panel 51 is the same as that of the display panel 1 according to the first embodiment, except for the clock signal generating circuit 61.

B-2 Configuration of Clock Signal Generating Circuit (Delay Amount Analog Control Type)

Figure 12:
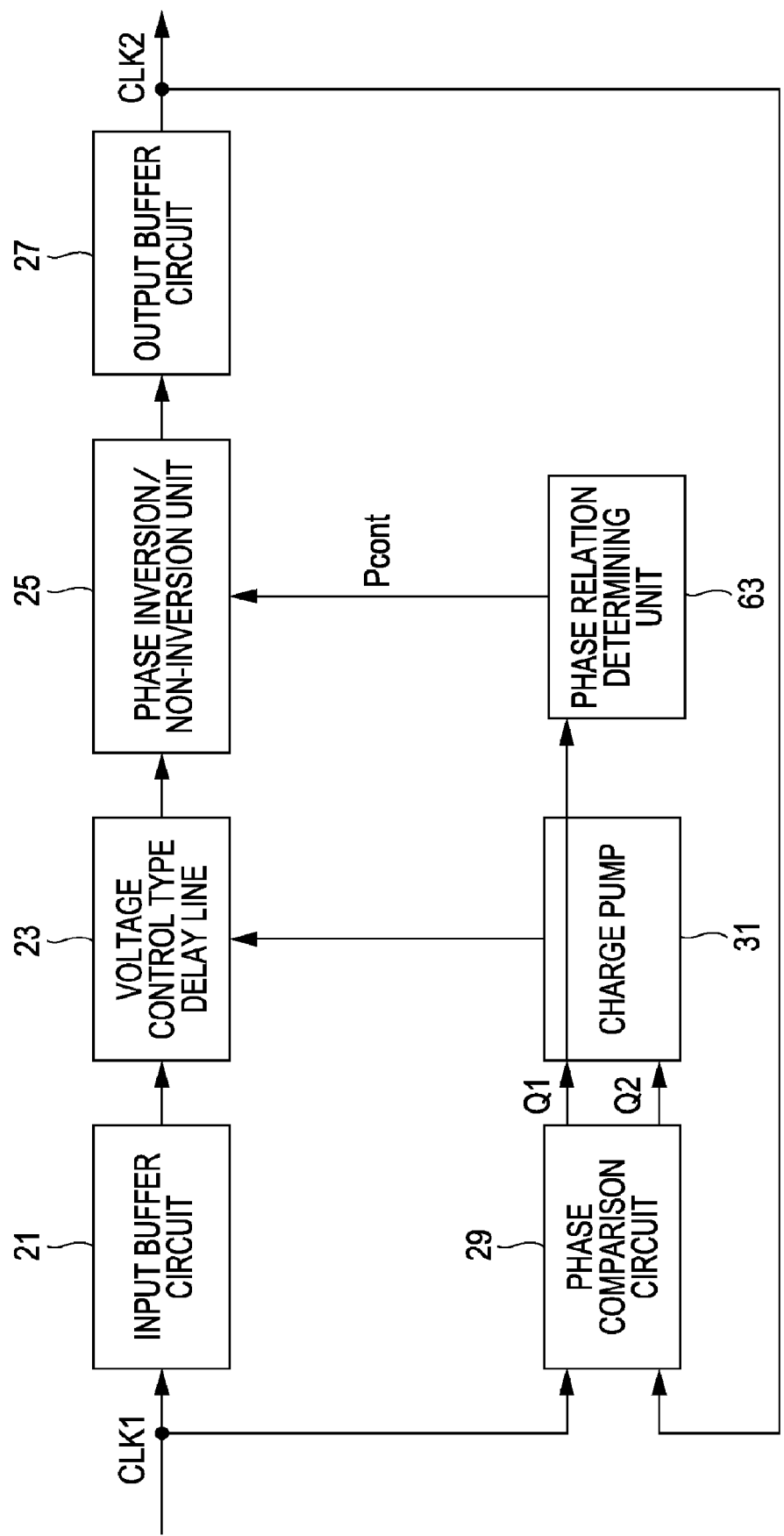
FIG. 12 is a diagram illustrating a configuration example of a clock signal generating circuit according to the second embodiment.

FIG. 12 illustrates the circuit configuration of the clock signal generating circuit 61 according to the present embodiment. Note that components shown in FIG. 12 which are the same as in FIG. 2 are denoted with the same reference numerals.

Figure 13:
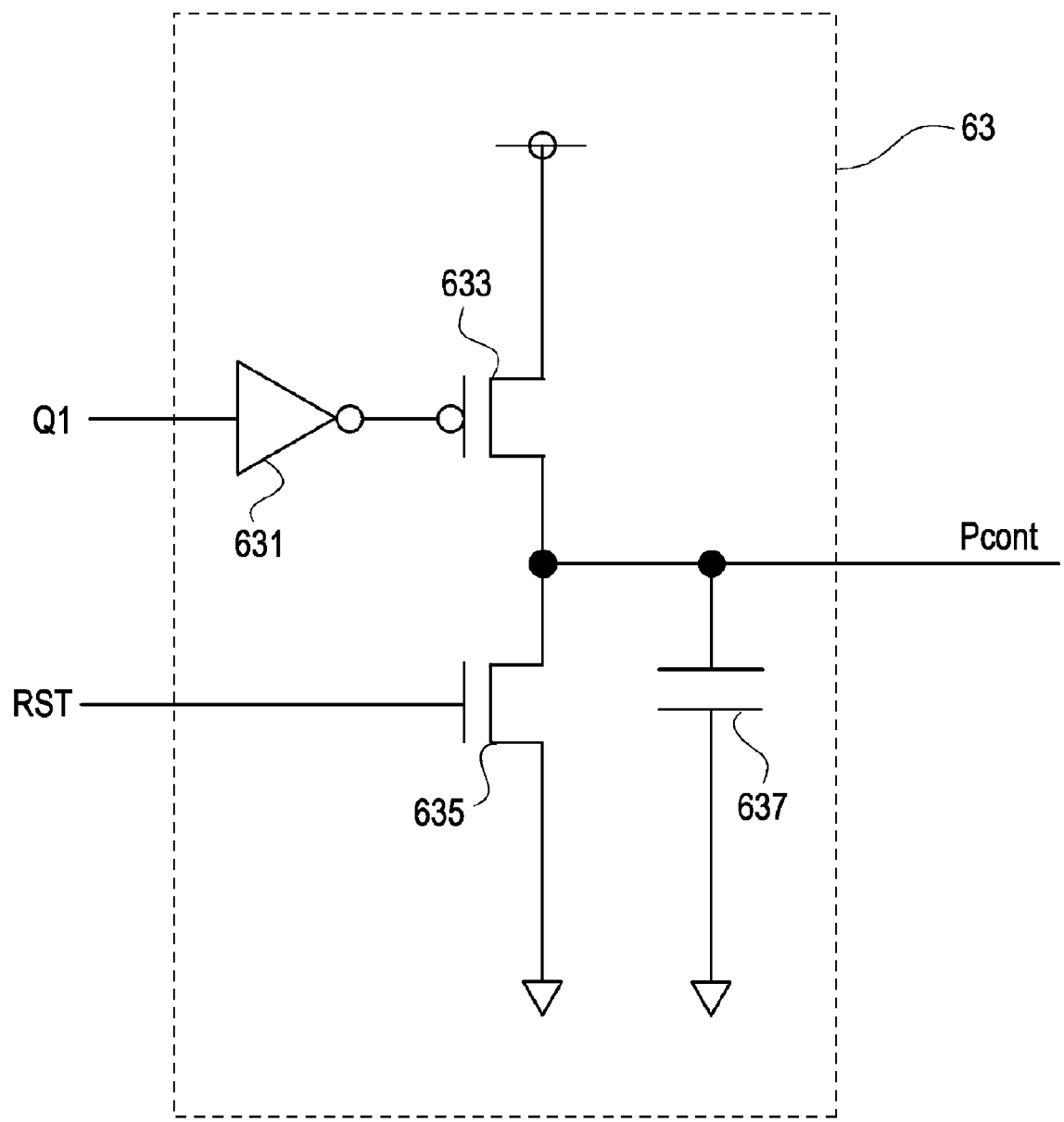
FIG. 13 is a diagram illustrating a configuration example of a phase relation determining unit according to the second embodiment.

The phase relation determining unit 63 used with this embodiment is a circuit which determines the phase relation between the input clock CLK1 and the output clock CLK2 based on the determination output Q1 from the phase comparison circuit 29. FIG. 13 illustrates a circuit example of the phase relation determining unit 63. The phase relation determining unit 63 shown in FIG. 13 is configured of an inverter 631, CMOS switch (p-channel MOS transistor 633 and n-channel MOS transistor 635), and retentive capacitance 637.

Note that the determination output Q1 is input to the inverter 631 and the inverted output thereof is used for controlling the p-channel MOS transistor 633. On the other hand, a reset signal RST is used for controlling the n-channel MOS transistor 635.

With this circuit configuration, in the event that the determination output Q1 is "H" level (i.e., the phase of the output clock CLK2 is relatively delayed) for example, the phase conversion control signal Pcont provided with the potential of the retentive capacitance 637 is high power source potential (i.e., "H" level). On the other hand, in the event that the reset signal RST is "H" level, the phase conversion control signal Pcont provided with the potential of the retentive capacitance 637 is low power source potential (i.e., "L" level).

Note that the reason why the phase conversion control signal Pcont is generated using only the determination output Q1 is that in the event that the phase of the output clock CLK2 is delayed as to the input clock CLK1, this is to be subjected to 180° phase inversion. That is to say, this is to adjust phase adjustment by the voltage control type delay line 23 within the range of delay as to the input clock CLK1.

Figure 14:
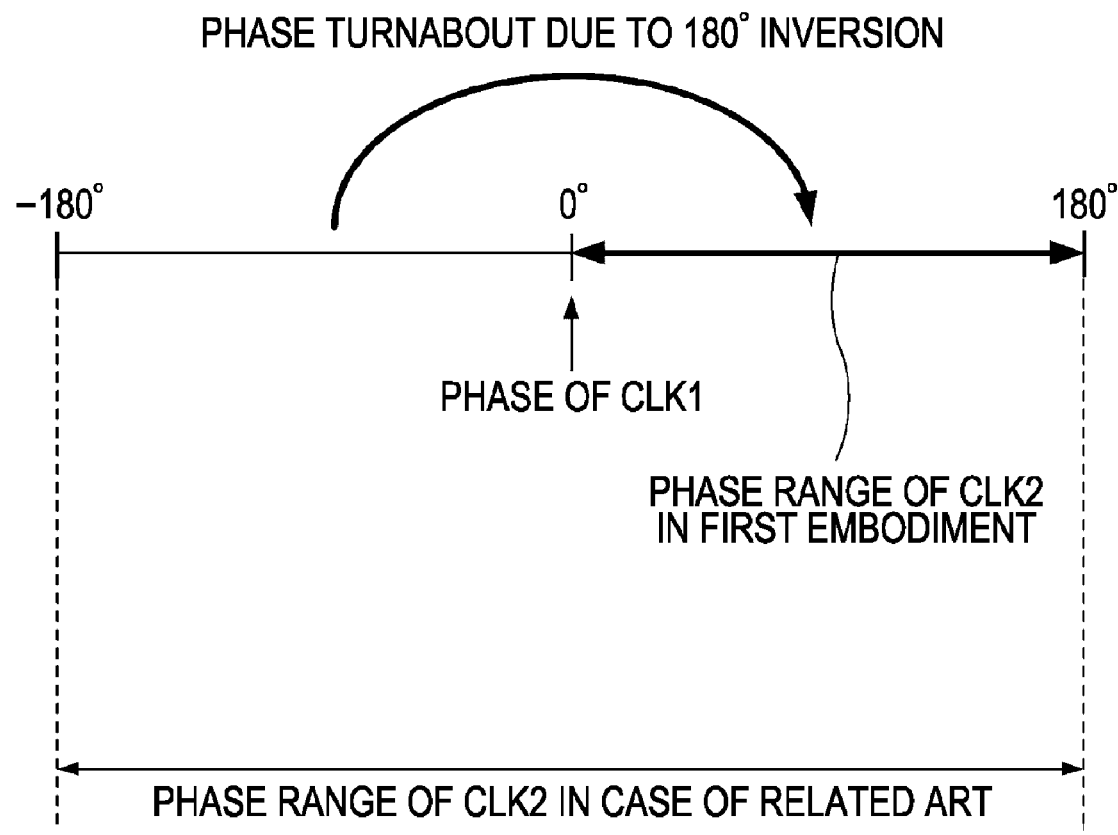
FIG. 14 is a diagram for describing phase inversion operations according to the second embodiment.

FIG. 14 is a conceptual drawing illustrating the phase adjustment range in the cause of using the phase relation determining unit 63. As shown in FIG. 14, the adjustment range with the clock signal generating circuit 61 is reduced from the 360° in the related art to 180°. This halving of the adjustment range is a feature of the clock signal generating circuit 61.

B-3 Operations and Advantages of the Clock Signal Generating Circuit

Figure 15:
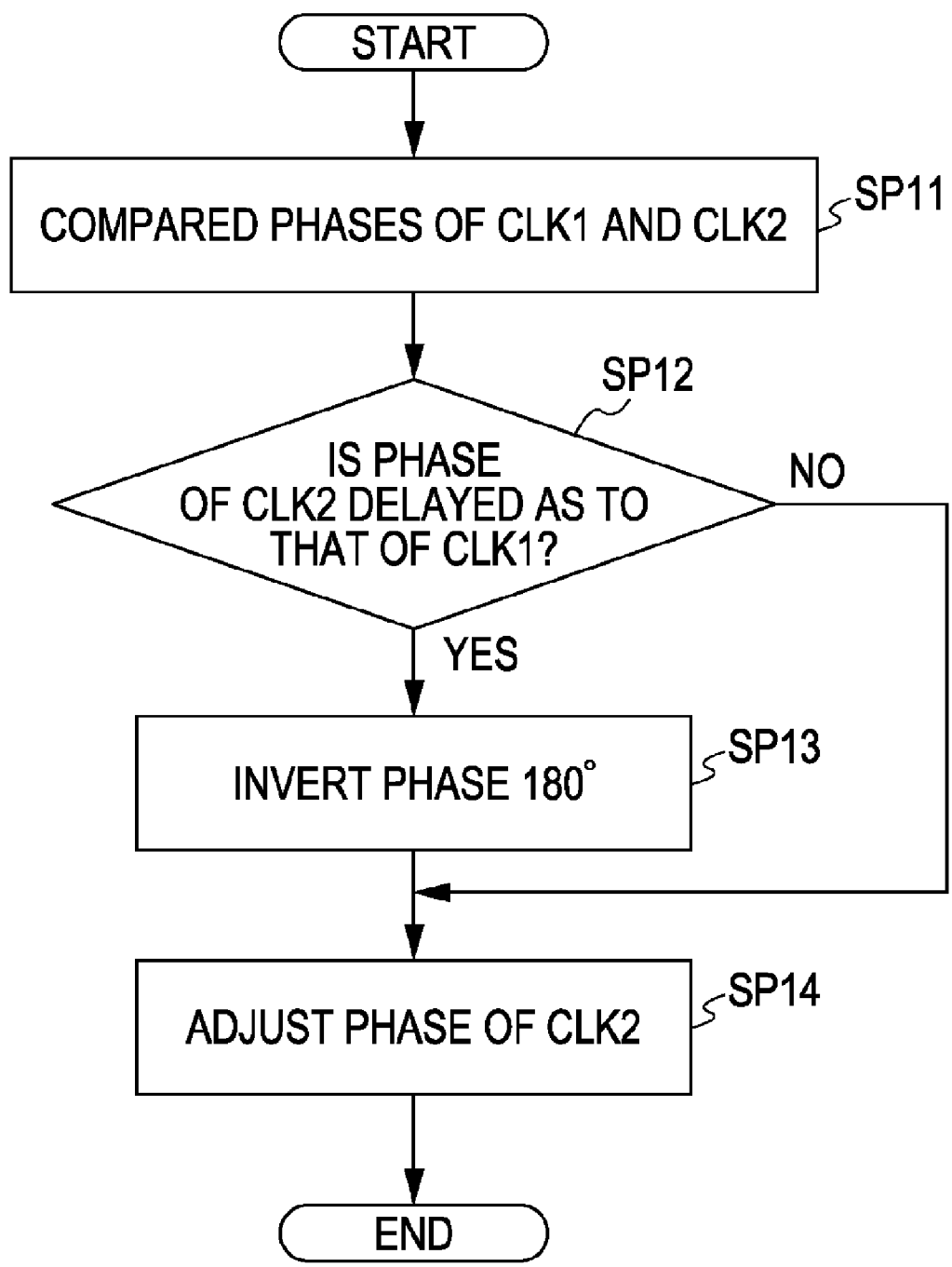
FIG. 15 is a diagram for illustrating operating procedures of the clock signal generating circuit according to the second embodiment.

Phase control operations using the clock signal generating circuit 61 will be described with reference to FIG. 15.

In step S11, at the clock signal generating circuit 61, the phase comparison circuit 29 repeatedly compares the phases of the input clock CLK1 and the output clock CLK2.

Next, at the clock signal generating circuit 61, determination is made in step S12 regarding whether or not the phase of the output clock CLK2 is delayed as to the phase of the input clock CLK1. More specifically, operations equivalent to this determination processing are executed as operations of supplying the determination output Q1 to the phase relation determining unit 63.

In the event that a positive result is obtained from the determination processing (i.e., in the event that the phase of the output clock CLK2 is delayed), in step S13 the clock signal generating circuit 61 inverts the phase of the output clock CLK2 by 180° and outputs. Specifically, the phase conversion control signal Pcont with the "H" level is output from the phase relation determining unit 63, and the clock phase is inverted 180° at the phase inversion/non-inversion unit 25.

On the other hand, in the event that a negative result is obtained from the determination processing in step S12, (i.e., in the event that the phase of the output clock CLK2 is either advanced or synchronized with the input clock CLK1), the current phase relation of the output clock CLK2 is held at the clock signal generating circuit 61. Specifically, the phase conversion control signal Pcont with the "L" level is output from the phase relation determining unit 63, and the clock phase is output at the phase inversion/non-inversion unit 25 as input, with no change.

Subsequently, in step S14 the clock signal generating circuit 61 adjusts the delay amount of the voltage control type delay line 23 in accordance with the phase difference of the input clock CLK1 and the output clock CLK2. As a result, the phase adjustment capability demanded of the voltage control type delay line 23 is restricted to a range of 180° as to the input clock CLK1.

This means that the number of states of delay devices (inverter circuits, load capacitance, transistor pairs) making up the voltage control type delay line 23 can be reduced to half that of the related art (which adjusts for 360°). Halving the number of delay devices means that the circuit area of the clock signal generating circuit 61 can be markedly reduced. Reduction of delay devices is also advantageous in reduction of electric power consumption at the clock signal generating circuit 61. Moreover, a narrower adjustment range for the mount of delay means that the time up to output of an output clock CLK2 phase-synchronized with the input clock CLK1 can be markedly reduced. That is to say, a clock signal generating circuit with a short acquisition time up to phase lock can be realized.

C Third Embodiment

C-1 Configuration of Display Panel

Figure 16:
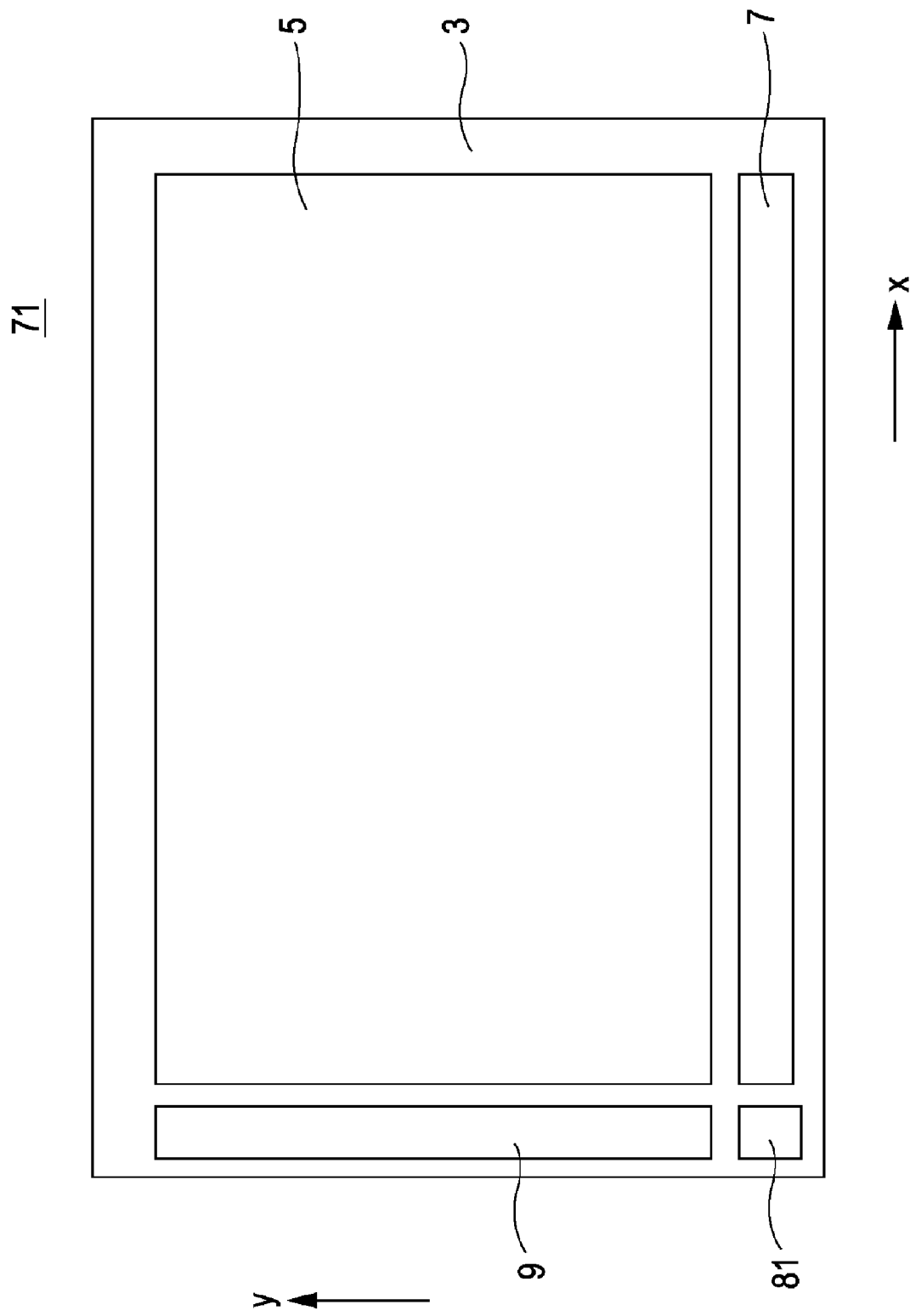
FIG. 16 is a diagram illustrating a plan configuration example of a display panel according to a third embodiment.

FIG. 16 illustrates a plan view configuration of a display panel 71 to be described in the present embodiment. In FIG. 16, components corresponding to FIG. 1 are denoted with the same reference numerals. As shown in FIG. 16, the basic configuration of the display panel 71 is the same as that of the display panel 1 according to the first embodiment, except that the delay line of the clock signal generating circuit 81 is a digital delay line.

C-2 Configuration of Clock Signal Generating Circuit (Delay Amount Digital Control Type)

Figure 17:
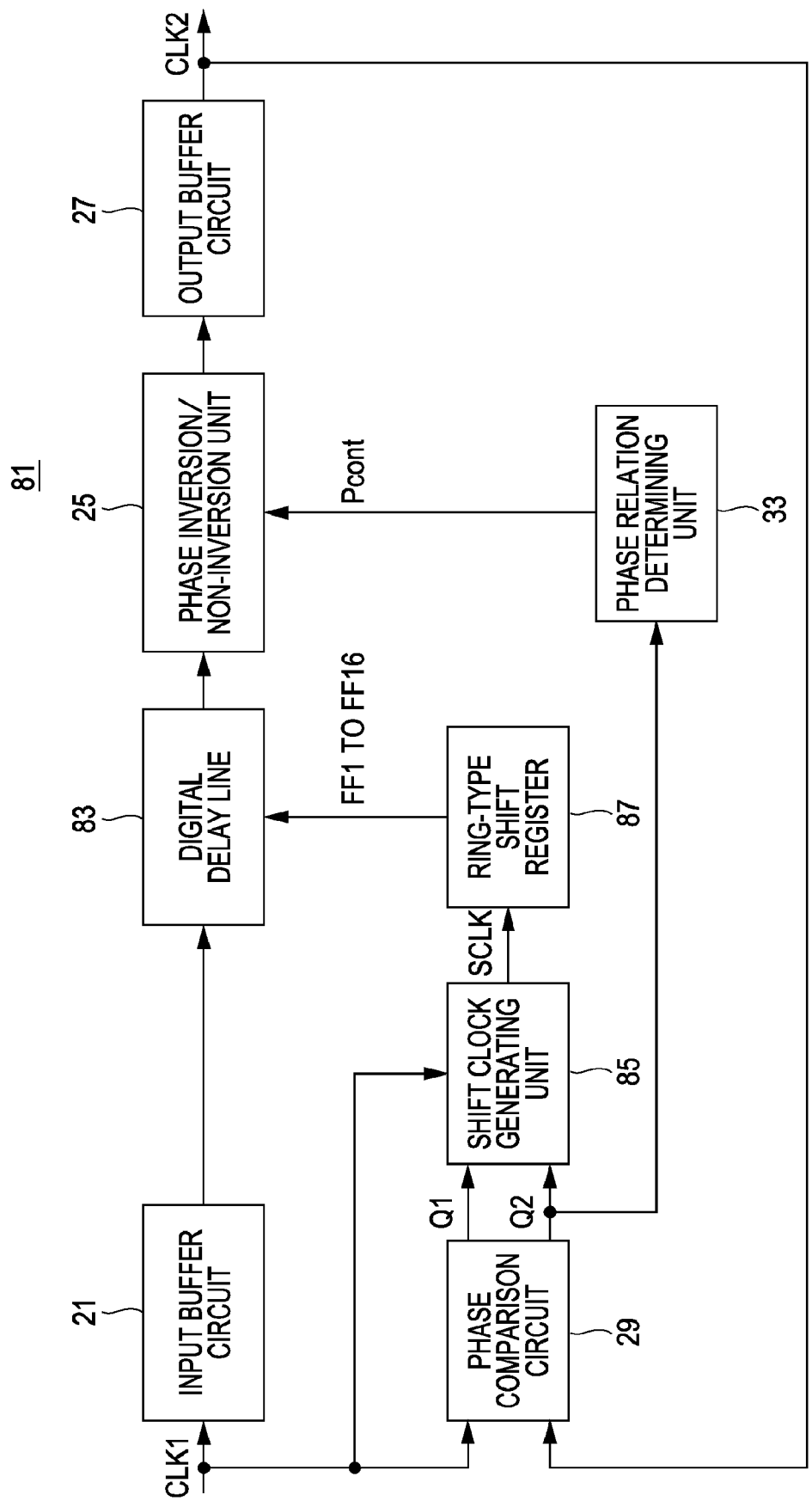
FIG. 17 is a diagram illustrating a configuration example of a clock signal generating circuit according to the third embodiment.

FIG. 17 illustrates the circuit configuration of the clock signal generating circuit 81 according to the present embodiment. Note that components which are the same as in FIG. 2 are denoted with the same reference numerals. This clock signal generating circuit 81 is configured of an input buffer circuit 21, a digital delay line 83, a phase inversion/non-inversion unit 25, an output buffer circuit 27, a phase comparison circuit 29, a shift clock generating unit 85, a ring type shift register 87, and a phase relation determining unit 33.

With the case of the clock signal generating circuit 81 shown in FIG. 17 as well, the phase adjustment range is halved using the phase inversion/non-inversion unit 25 and phase relation determining unit 33, which is the same as with the first embodiment. What is different in comparison with the first embodiment is that a digital delay line 83 is used as the delay line 83, and a shift clock generating unit 85 and ring type shift register 87 are used as the adjustment system circuit.

Figure 18:
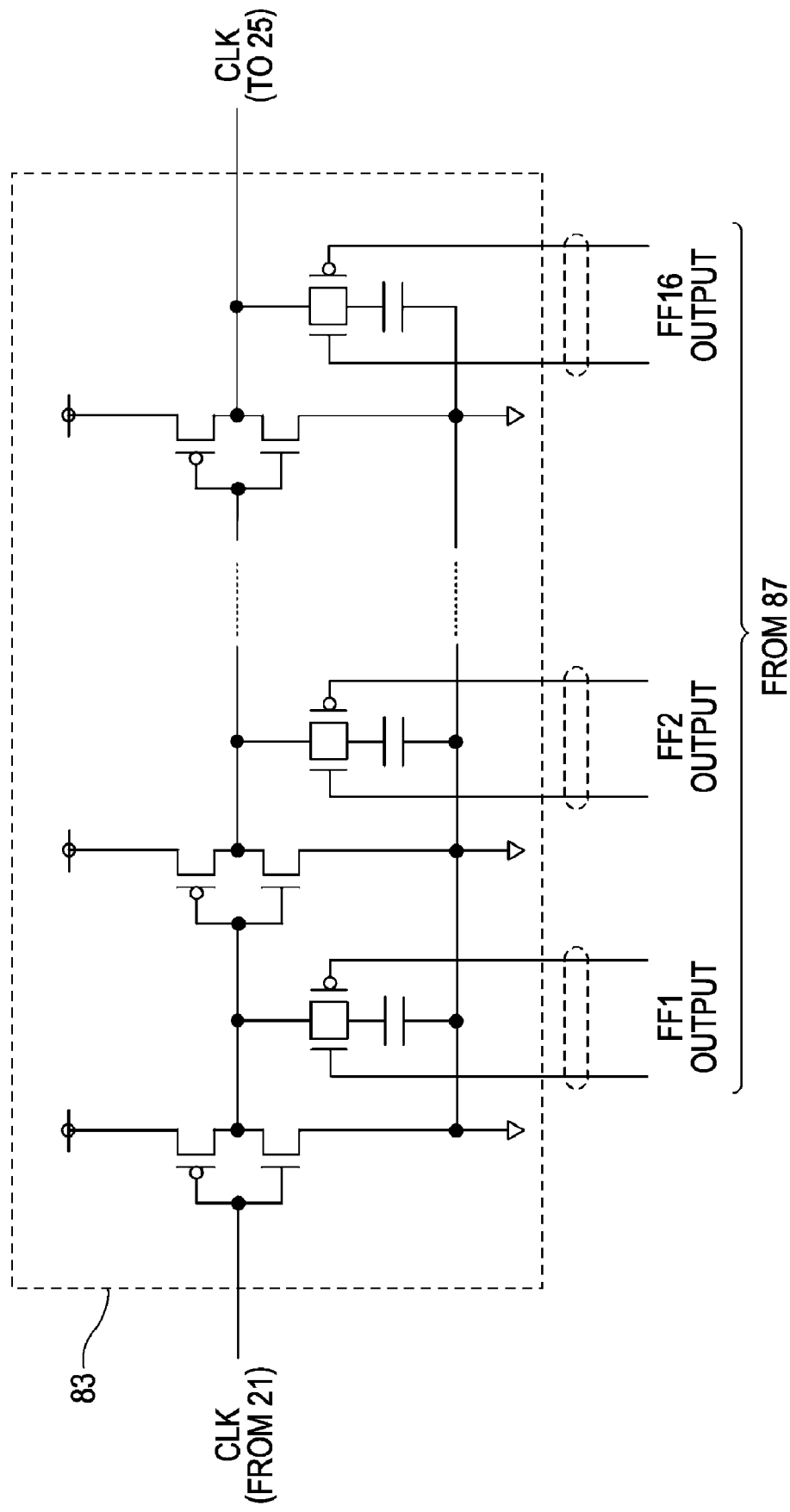
FIG. 18 is a diagram illustrating a configuration example of a digital delay line.

Only the components which are new to the present embodiment in comparison with the above embodiments will be described now. The digital delay line 83 is configured of a serial connection circuit of CMOS inverter circuits having load capacitance. FIG. 18 illustrates a configuration example of the digital delay line 83. The circuit configuration shown in FIG. 18 is basically the same as the circuit configuration shown in FIG. 3.

What is different is that while the bias voltage Vbias for the transistor pair connected to the output stage of the CMOS inverter in the first embodiment was driven in an analog manner, this is driven as a switch with the present embodiment. A configuration is employed wherein open/close control of a switch connected to the output stage of each inverter circuit is controlled, thereby controlling switching between contact/non-contact of the propagation path and load capacitance, so the amount of delay can be controlled in increments of single stages.

Note that opening/closing of the switches is executed by the later-described ring type shift register 87. In the case of the present embodiment, the number of load capacitances connected to the transmission path is controlled so as to increase or decrease within a range of zero through 16. Note that the delay time is the shortest when all switches are controlled open (all switches are controlled off). The delay amount on the digital delay line 83 incrementally increases with each load capacitance connected to the transmission path. Accordingly, the delay time is the longest when all switches are controlled closed (all switches are controlled on).

The shift clock generating unit 85 is a circuit which controls supplying and stopping of a shift clock SCLK to the ring type shift register 87, based on the determination outputs Q1 and Q2 of the phase comparison circuit 29. The functions of this shift clock generating unit 85 corresponding to the delay amount control unit. The shift clock generating unit 85 supplies the ring type shift register 87 with the shift clock SCLK while one of the determination outputs Q1 and Q2 is "H" level and the other is "L" level, and stops supply of the shift clock SCLK to the ring type shift register 87 while both of the determination outputs Q1 and Q2 are "L" level.

Figure 19:
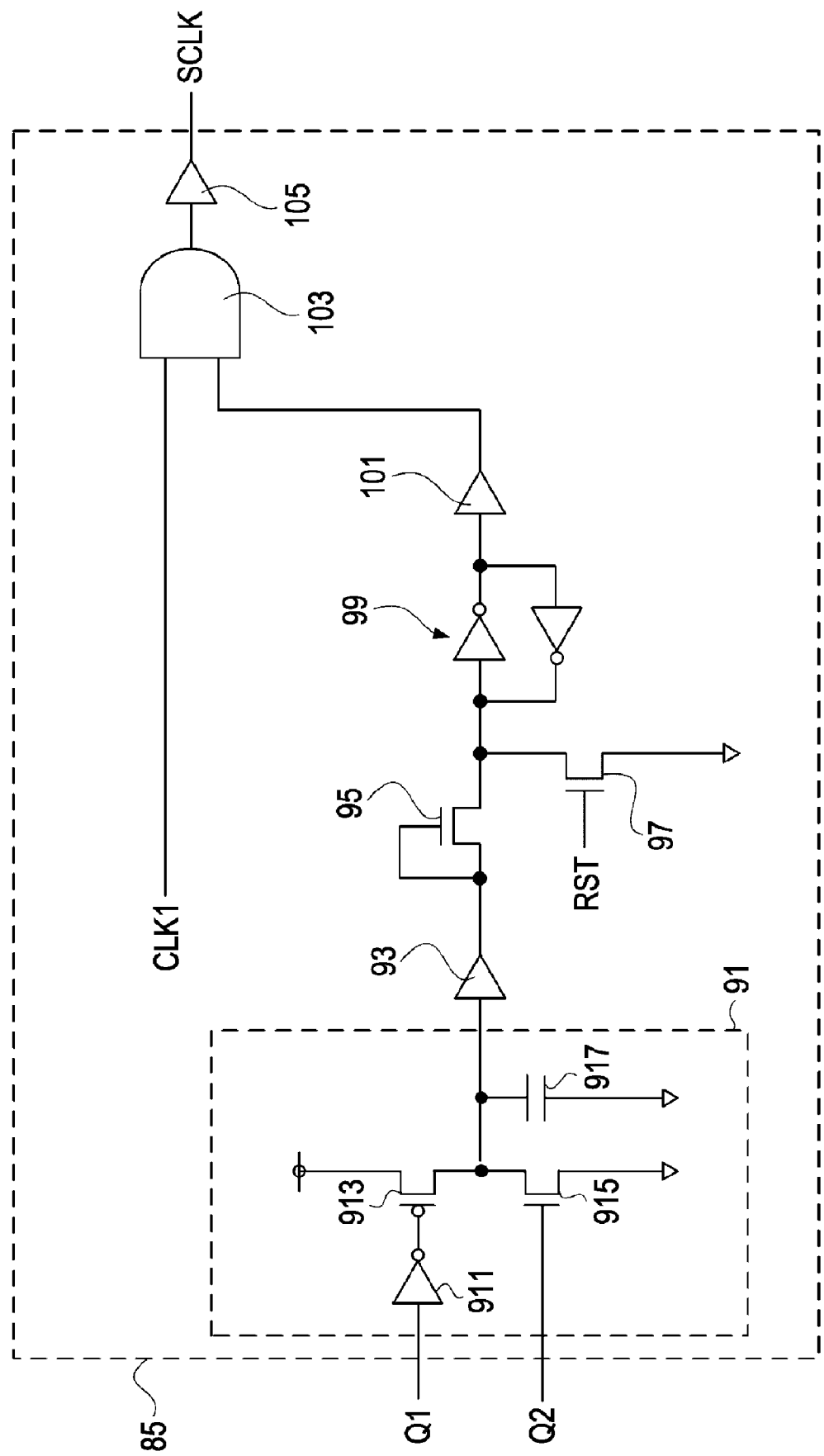
FIG. 19 is a diagram illustrating a configuration example of a shift clock generating unit.

FIG. 19 illustrates a circuit example of the shift clock generating unit 85. In the case shown in FIG. 19, the shift clock generating unit 85 is configured of a charge pump 91, a buffer 93, a diode-connected transistor 95, a reset transistor 97, a latch 99, a buffer 101, an AND gate 103, and a buffer 105.

The charge pump 91 is configured of an inverter 911, CMOS switches 913 and 915, and a retaining capacitance 917. The charge pump 91 outputs "H" level in the event that the phase of the input clock CLK1 is ahead of the phase of the output clock CLK2, and outputs "L" level in the event that the phase of the input clock CLK1 is behind the phase of the output clock CLK2. Further, in the event that the phase of the input clock CLK1 and the phase of the output clock CLK2 are the same, the charge pump 91 outputs the immediately-preceding value for retaining capacitance.

The buffer 93 is a circuit with multiple inverter circuits connected serially. The reset transistor 97 is a thin-film transistor for forcibly resetting the input level of the latch 99 to the "L" level. The latch 99 is a circuit stage wherein two inverter circuits are connected in ring fashion. The buffer 101 is a circuit with an even number of inverter circuits connected serially. The AND gate 103 is a gate circuit for outputting the logical conjunction of the above-described logic gates 91, 93, 95, 97, 99, and 101, and the input clock CLK1.

Accordingly, the AND gate 103 outputs the input clock CLK1 to the buffer 95 as a shift clock SCLK only while the output of the logic gates 91, 93, 95, 97, 99, and 101 is "H" level, and stores output of the shift clock SCLK when the output of the logic gates 91, 93, 95, 97, 99, and 101 is "L" level. Note that the buffer 105 is a circuit with multiple inverter circuits connected serially.

The ring type shift register 87 is a shift register circuit with D flip-flops of a number equal to the number of digital delay lines 83 connected in ring fashion. This ring type shift register 87 functions as a delay amount setting unit.

Figure 20:
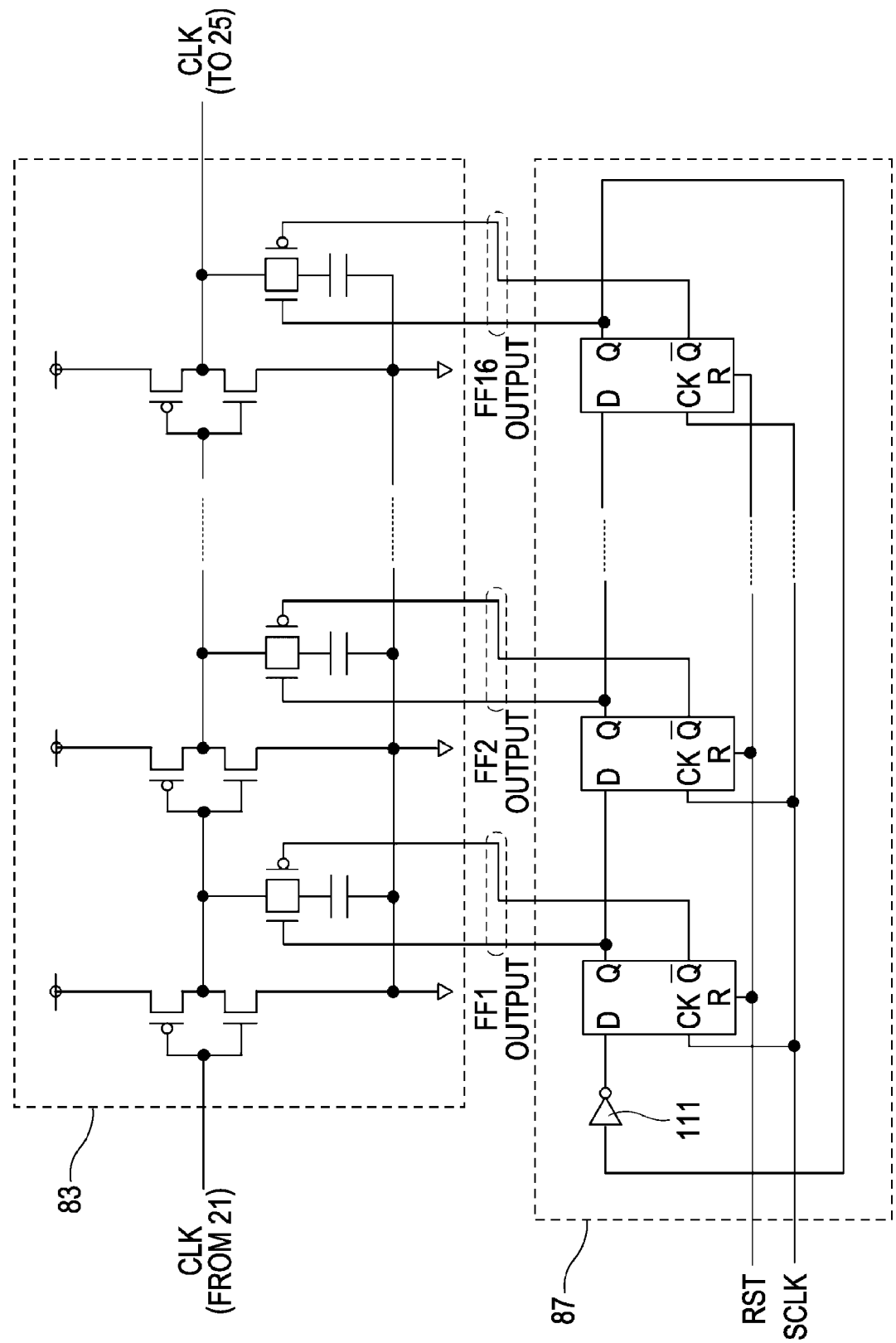
FIG. 20 is a diagram illustrating the connection relation between a ring type shift register and digital delay line.

FIG. 20 illustrates a circuit example of the ring type shift register 87. In the case illustrated in FIG. 20, the ring type shift register 87 is configured of 16 D flip-flop circuits wherein the Q output of the previous stage is the D input of the next stage, and an inverter circuit 111 wherein the Q output of the final stage is subjected to logical inversion and fed back to the D input of the first stage.

Note that the D flip-flop circuits have reset terminals, with the Q output of all being changed to an "L" level state by input of a reset signal. Also, the D flip-flop circuits have shift clock terminals to execute operations for latching D input under supply of a shift clock SCLK and output to the next stage as Q output.

In the case of this embodiment, operation is performed such that the number of Q outputs which rise to "H" level is equal to the number of rising edges of the shift clocks SCLK input from the reset state. Of course, the relation of the logical level of the Q output and the inverse output thereof (inverse Q output) is mutually inverse.

Also, the Q output and inverse Q output at each flip-flop circuit stage executes the open/close operation of CMOS switches corresponding to each stage making up the digital delay line 83. Note that the Q output is connected to the gate electrode of the n-channel thin-film transistor, and that the inverse Q output is connected to the gate electrode of the p-channel thin-film transistor. Accordingly, opening operations and closing operations of the two thin-film transistors making up the CMOS switch are each performed at the same time.

C-3 Operations and Advantages of the Clock Signal Generating Circuit

Now, the operations of the clock signal generating circuit will be described, dwelling primarily on the operations of the shift clock generating unit 85.

(a) Reset

Figure 21:
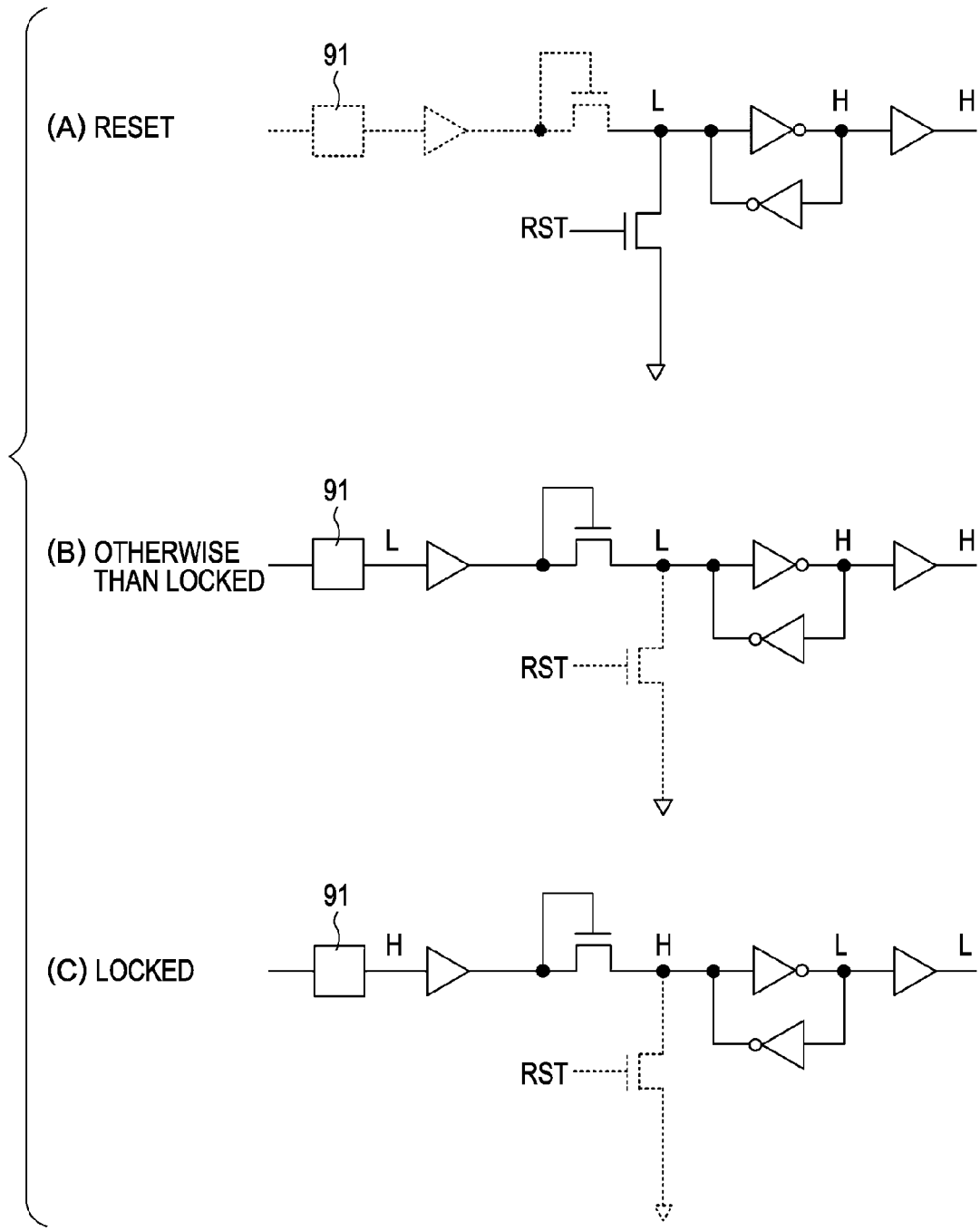
FIG. 21 is a diagram for explaining the operating state of the shift clock generating unit.

First, the reset operation executed at the time of turning on the power will be described. (A) in FIG. 21 is a diagram for describing the operational state of the shift clock generating unit 85 at the time of reset operations. At this time, the upstream potential of the latch 99 configuring the shift clock generating unit 85 us forcibly set to the "L" level. Accordingly, logic gate output of "H" level is input to the AND gate 103 configuring the shift clock generating unit 85.

Figure 22:
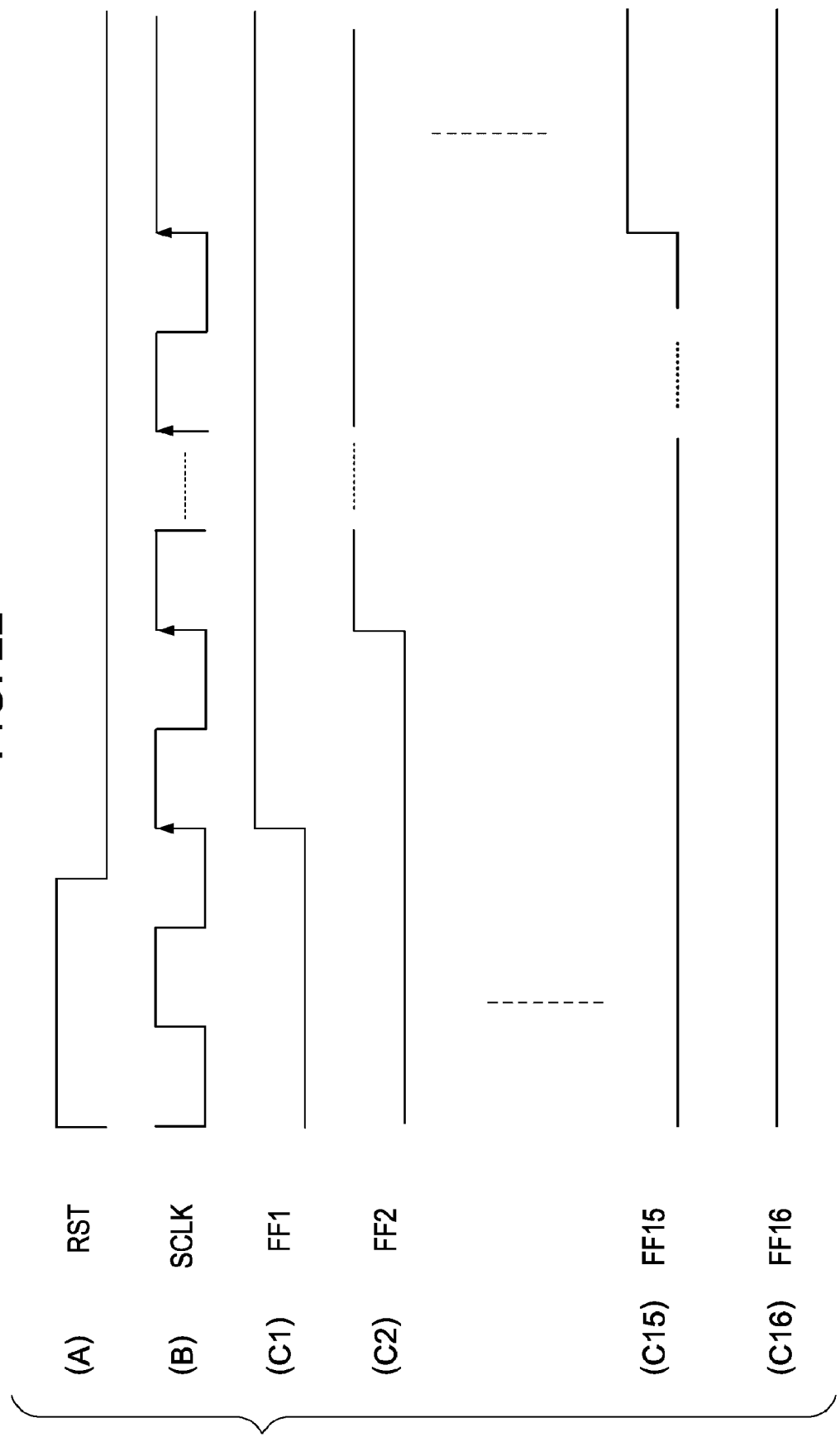
FIG. 22 is a diagram for explaining the operating state of the ring type shift register.

Accordingly, a shift clock SCLK is supplied from the shift clock generating unit 85 to the ring type shift register 87 ((B) in FIG. 22). Note, however, that the reset signal ((A) in FIG. 22) is "H" level, so each D flip-flop making up the shift clock generating unit 85 is reset. That is to say, even if the shift clock SCLK is input, the Q output of each D flip-flop (Stage (C1) through (C16) in FIG. 22) is "L" level. Accordingly, the delay amount of the digital delay line 83 during the reset period remains the minimum value. The reason is that all CMOS switches of the digital delay line 83 are controlled open.

(b) Up to Phase Lock

Next, the operations from ending of the reset operation up to phase lock of the input clock CLK1 and the output clock CLK2 will be described. (B) in FIG. 21 illustrates the operating state at the point of ending the reset operation. At this time, the input clock CLK1 and the output clock CLK2 are not yet synchronized. Accordingly, the output of the charge pump 91 is "L" level. Of course, the input potential of the latch 99 configuring the shift clock generating unit 85 is "L" level, and the state is maintained. Accordingly, logic gate output of "H" level is input to the AND gate 103 configuring the shift clock generating unit 85.

Thus, the shift clock SCLK continues to be supplied form the shift clock generating unit 85 to the ring type shift register 87 during this period as well ((B) in FIG. 22). However, in this case, the reset signal ((A) in FIG. 22) is "L" level. Accordingly, each time an edge of a shift clock SCLK is input to the D flip-flop, the Q output rises to the "H" level in order from the head stage.

(C1) through (C15) in FIG. 22 illustrate waveforms in the event that 15 shift clock SCLK edges are input. That is to say, Q output of "H" level is output from the head to the 15th D flip-flop, and only the 16th D flip-flop outputs Q output of "L" level.

(c) After Phase Lock

Finally, operations following phase lock will be described. (C) in FIG. 21 illustrates the operation state of the shift clock generating unit 85 at the time of phase lock. At this time, the input clock CLK1 and the output clock CLK2 are synchronized, so the output of the charge pump 91 changes to "H" level for the first time.

Consequently, the input potential of the latch 99 is set to "H" level, and that state is maintained. This potential change switches the logic gate output input to the AND gate 103 configuring the shift clock generating unit 85 from "H" level to "L" level, and subsequently that state is maintained. As shown in (B) in FIG. 22, from this potential on, supply of the shift clock SCLK to the ring type shift register 87 is stopped. As a matter of course, upon supply of the shift clock SCLK stopping, the shift operation of the "H" level at the ring type shift register 87 stops. In the example in FIG. 22, the state wherein the Q output from the head to the 15th stage are switched to "H" level is maintained.

On the other hand, the number of connected load capacitances connected to the CMOS inverter circuit making up the digital delay line 83 is 15, so a clock wherein the delay time thereof has been adjusted so as to be longer than the minimum value of the delay time by 15 increment delay times is output to the output buffer circuit 27. Of course, in the event that advance of the phase of the output clock CLK2 is detected in the phase of the output clock CLK2, the phase of the output clock CLK2 is inverted 180°, which is the same as with the first embodiment.

Thus, the above-described inversion function can be applied to a clock signal generating circuit having a digital delay line as well, as with the present embodiment. Of course, a combination with the circuit configuration of the second embodiment can be conceived as well.

C-4 Other Circuit Configurations

Note that other configurations can be conceived for the digital type clock signal generating circuit described in the third embodiment. The following are several examples of digital delay lines and driving paths thereof.

(a) Example 1

Figure 23:
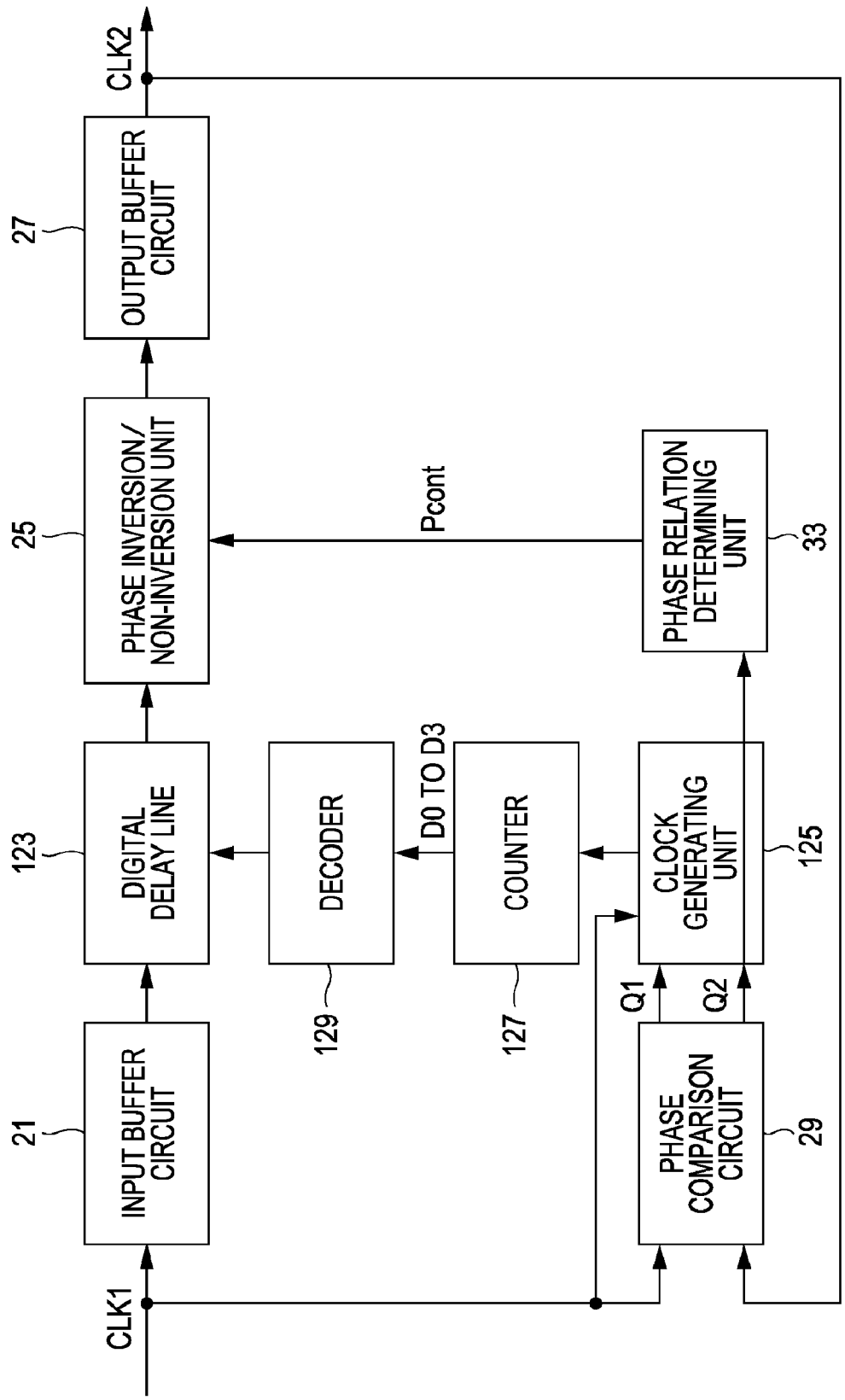
FIG. 23 is a diagram illustrating another configuration example of the clock signal generating circuit according to the third embodiment.

FIG. 23 shows a circuit configuration of a clock signal generating circuit 121 according to another embodiment. The components in FIG. 23 which correspond to those in FIG. 2 are denoted with the same reference numerals. The clock signal generating circuit 121 is configured of an input buffer circuit 21, a digital delay line 123, a phase inversion/non-inversion unit 25, an output buffer circuit 27, phase comparison circuit 29, a clock generating unit 125, counter 127, a decoder 129, and a phase relation determining unit 33.

Of the components of the clock signal generating circuit 121 shown in FIG. 23, the new components are the digital delay line 123, clock generating unit 125, counter 127, and decoder 129, i.e., these four. Description will be made regarding only these new components of this embodiment.

Figure 24:
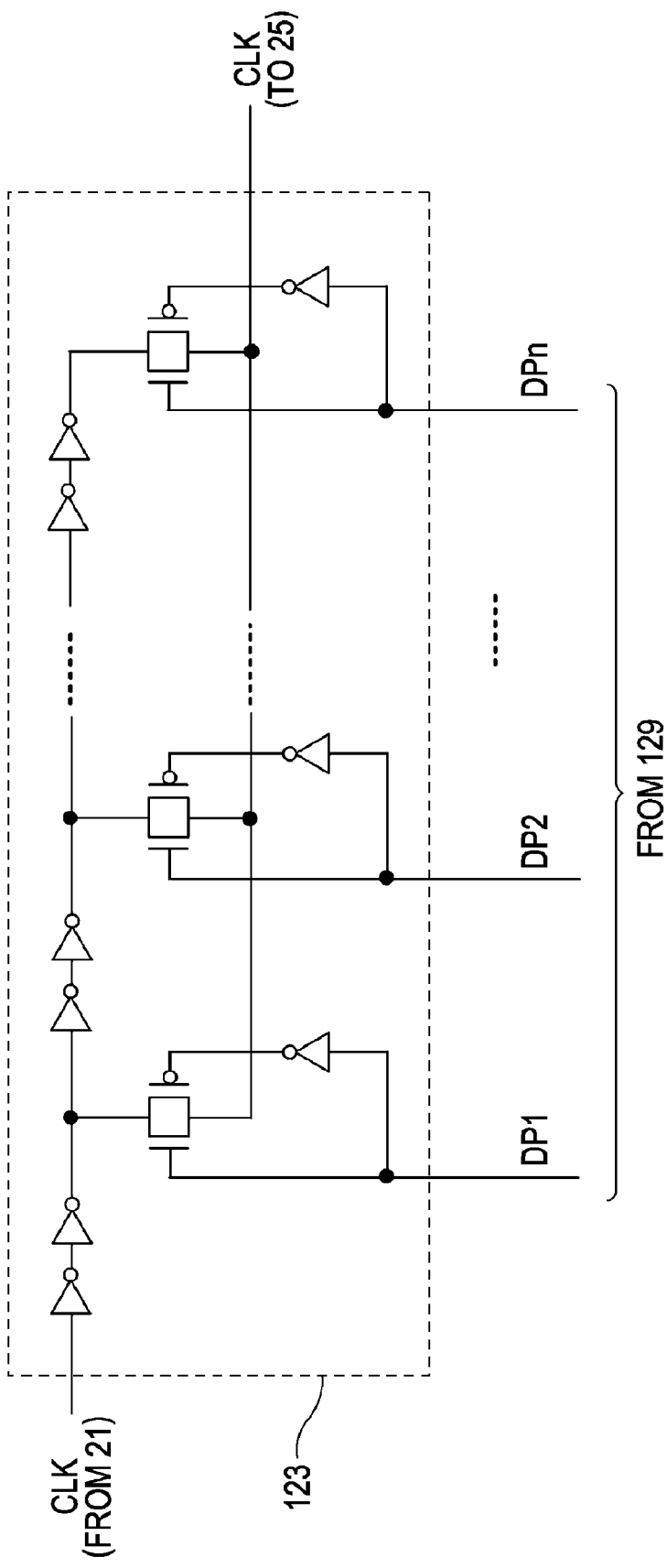
FIG. 24 is a diagram illustrating another configuration example of the digital delay line.

The digital delay line 123 is a circuit with multiple inverter circuits having load capacitance, connected serially. FIG. 24 shows a configuration example of the digital delay line 123. Unlike the structure shown in FIG. 18, the digital delay line 123 is configured of a serially connected circuit of 16 buffer circuit stages, each of which have serial connection of two CMOS inverter circuits as a single increment.

Note that each buffer circuit stage (excluding the final stage) has the output line thereof split into two, with one being connected to the next buffer circuit stage, and with the other connected to an output terminal via a CMOS switch. In the case of this circuit configuration, control of the delay amount is realized by control of the position of only one CMOS switch which is controlled closed, out of the 16 CMOS switches.

The clock generating unit 125 is a circuit for generating operating clocks of the counter 127. Note that the circuit configuration may be exactly the same as the shift clock generating unit 85 described with FIG. 19.

Figure 25:
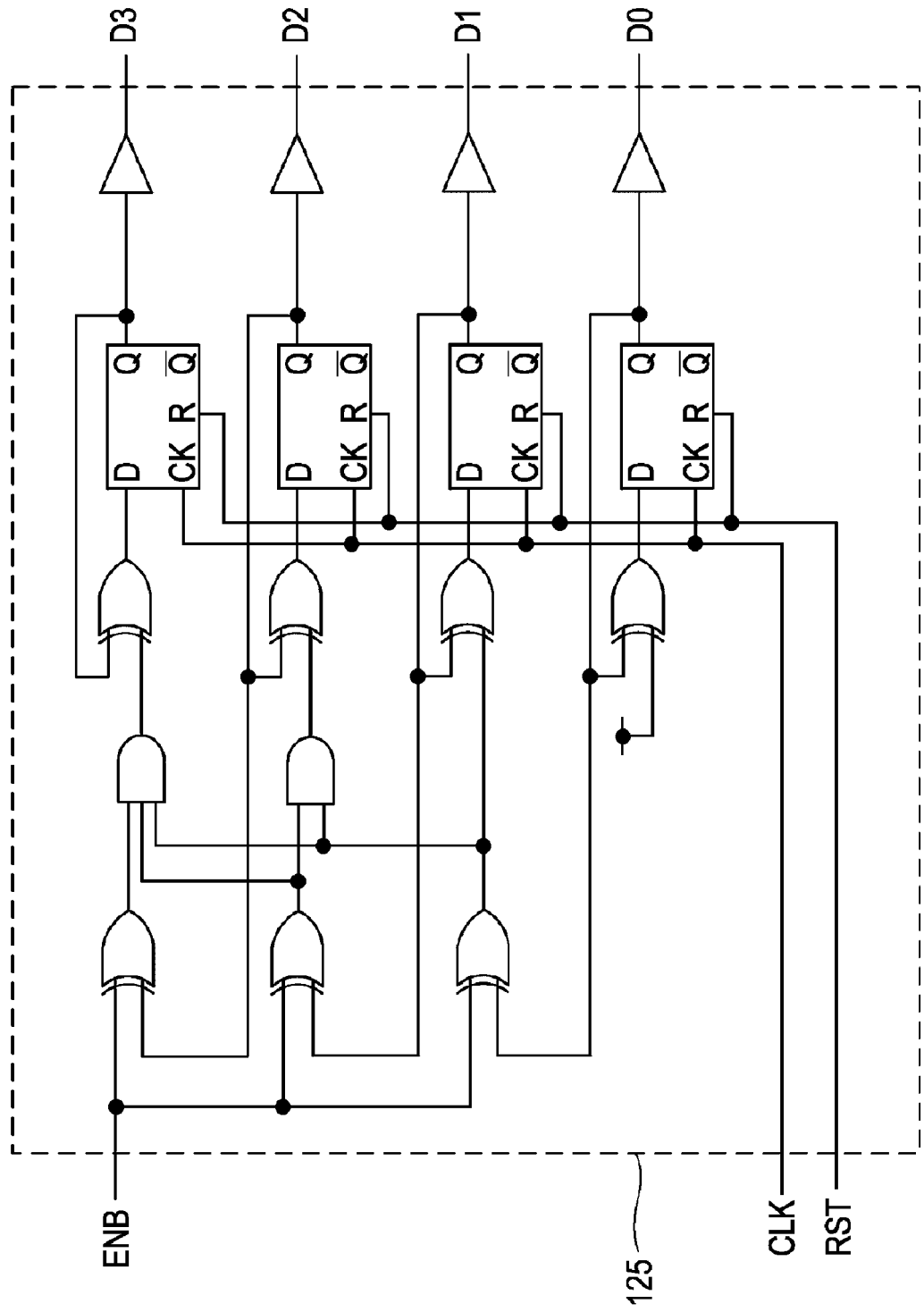
FIG. 25 is a diagram illustrating a configuration example of a counter.

The counter 127 is a circuit for counting clocks generated within the period equivalent to the phase difference between the input clock CLK1 and the output clock CLK2. FIG. 25 shows a circuit example of the counter 127. Note that FIG. 25 is a circuit example in the case that the number of delay device making up the digital delay line 123 is 16. Accordingly, digital output is 4-bit output of D0 through D3.

Figure 26:
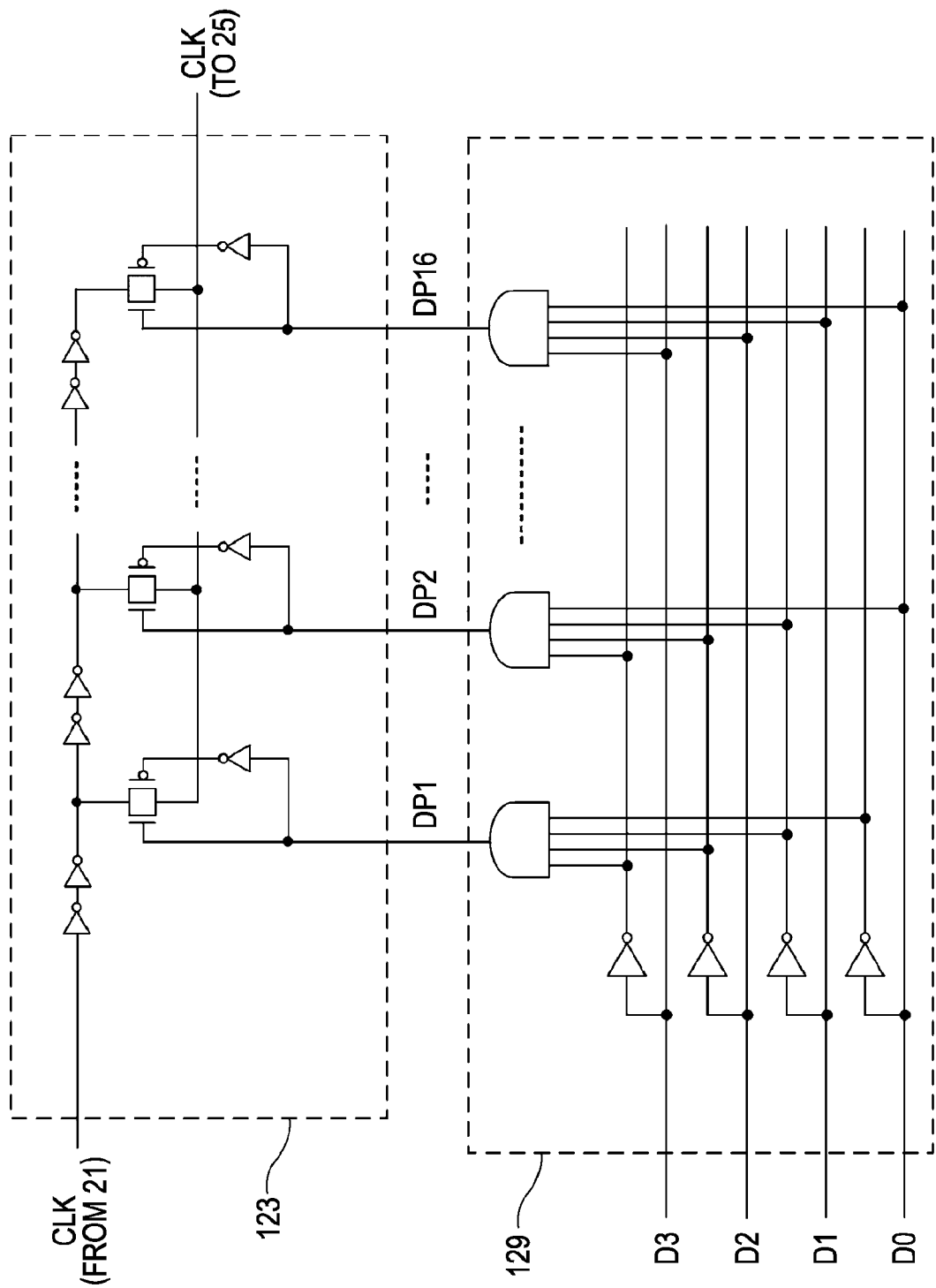
FIG. 26 is a diagram illustrating a configuration example of a decoder.

Also, the decoder 129 is a circuit for outputting a close control signal only to CMOS switches corresponding to the count value. FIG. 26 shows a circuit example of the decoder 129. Due to this circuit configuration, the counter 127 and the decoder 129 operate as follows.

For example, at the time of input of a reset signal RST, the digital outputs D0 through D3 of the counter 127 are all "L" level. At this time, the control signals DP2 through DP16 of the decoder 129 are "L" level, with only the control signal DP1 being "H" level.

Thus, only the CMOS switch situated at the first stage of the digital delay line 123 is controlled closed, and the delay amount is reset to the smallest value. Thus, a clock signal delayed by the delay amount of this one stage alone is output to the phase inversion/non-inversion unit 25. Of course, as the number of clocks generated at the clock generating unit 125 increases to two, three, and so on, the position of the only "H" level of the control signals DP1 through DP16 shift one stage at a time toward the back stage. This operation realizes digital control of the delay line.

(b) Example 2

Figure 27:
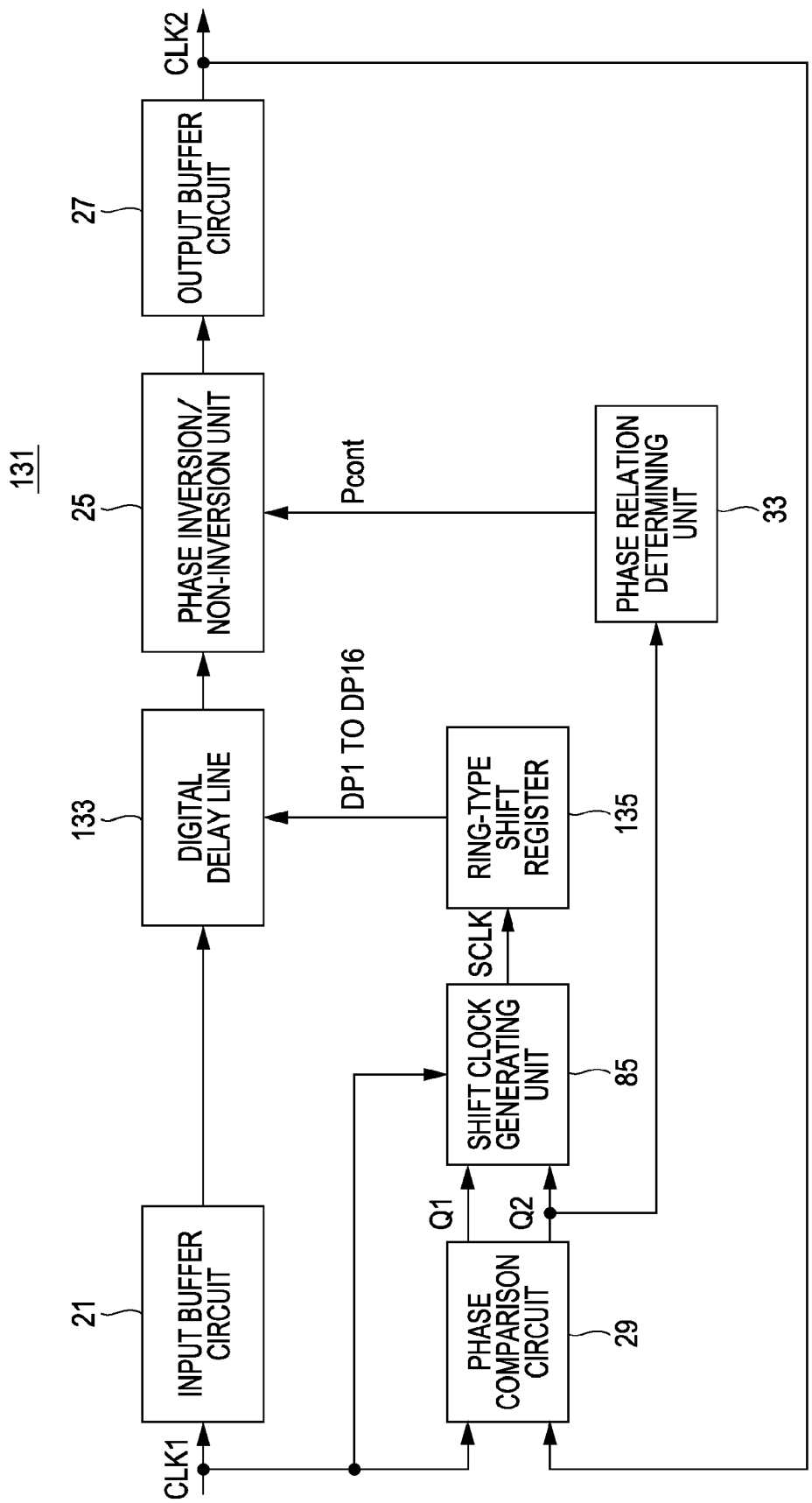
FIG. 27 is a diagram illustrating another configuration example of the clock signal generating circuit according to the third embodiment.

FIG. 27 illustrates the circuit configuration of a clock signal generating circuit 131 according to another embodiment. The components in FIG. 27 which correspond to those in FIG. 17 are denoted with the same reference numerals. Description is made here regarding a case of controlling the delay amount of a digital delay line using a ring type shift register. Note however, that a digital delay line 133 and ring type shift register 135, which are of a different configuration from those shown in FIG. 17, are used.

Figure 28:
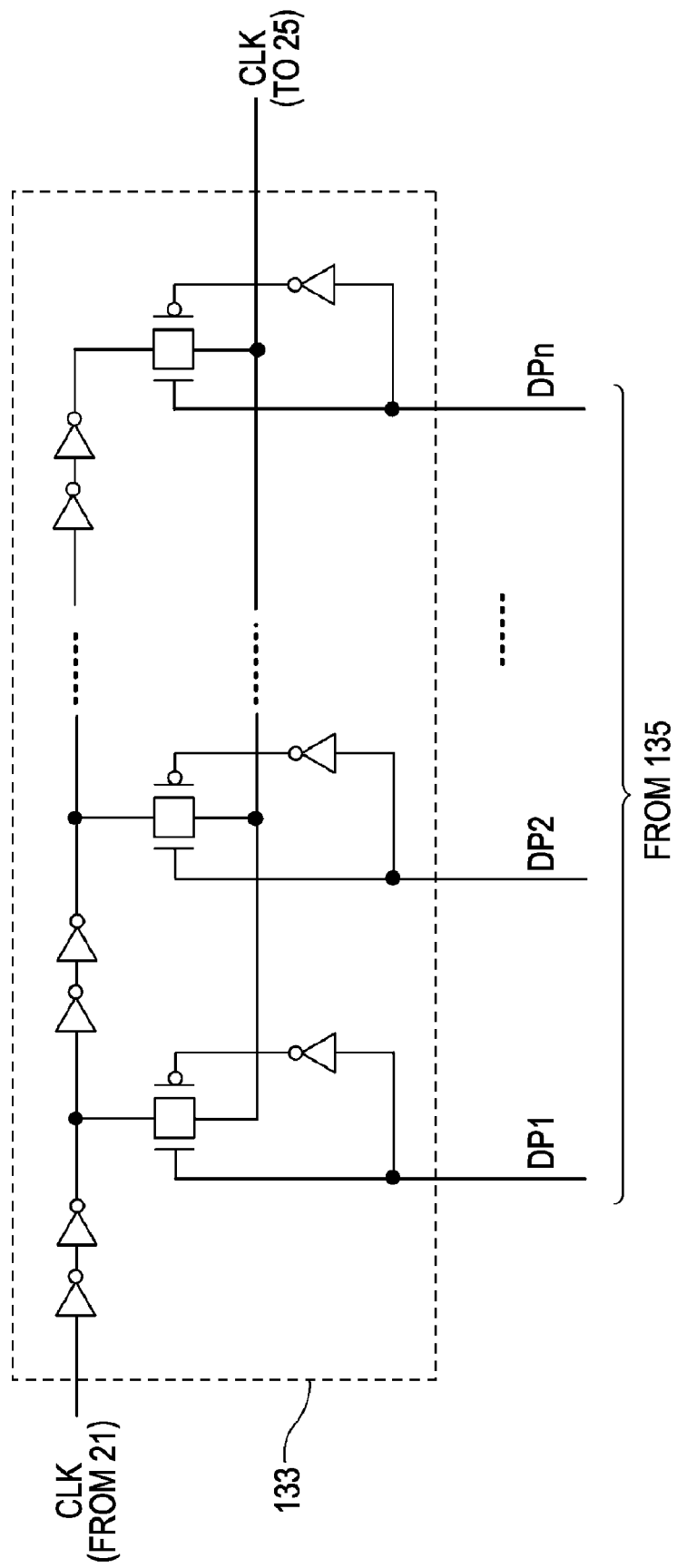
FIG. 28 is a diagram illustrating another configuration example of the digital delay line.

FIG. 28 illustrates a circuit example of a digital delay line 133. The digital delay line 133 shown in FIG. 28 is configured of a serially connected circuit of 16 buffer circuit stages, each of which have serial connection of two CMOS inverter circuits as a single increment.

Note that each buffer circuit stage (excluding the final stage) has the output line thereof split into two, with one being connected to the next buffer circuit stage, and with the other connected to an output terminal via a CMOS switch. Control of the delay amount is realized by open/close control of the position of the total of 16 CMOS switches disposed on the branch connected to the output terminals.

Note that one of the 16 CMOS switches must constantly be controlled closed in order for the digital delay line 133 to operate correctly. Accordingly, with the ring type shift register 135 in this embodiment, a decoder is built in to operate such that a control signal DP is output for "H" level for only one stage of the Q outputs output from the 16 D flip-flops. In the case of this embodiment, the delay amount of the input clock CLK1 (i.e., the number of buffer circuits which the input clock CLK1 passes through) is set within the range of 1 through 16. Accordingly, a case wherein the CMOS switch situated at the head is controlled closed is the state with the shortest delay time. The arrangement is such that each stage the CMOS switch controlled closed goes toward the back, the greater the delay amount on the digital delay line 133 becomes, in the delay amount increments. Accordingly, in the event that the trailing (16th) CMOS switch is controlled closed, the delay time is maximum.

Figure 29:
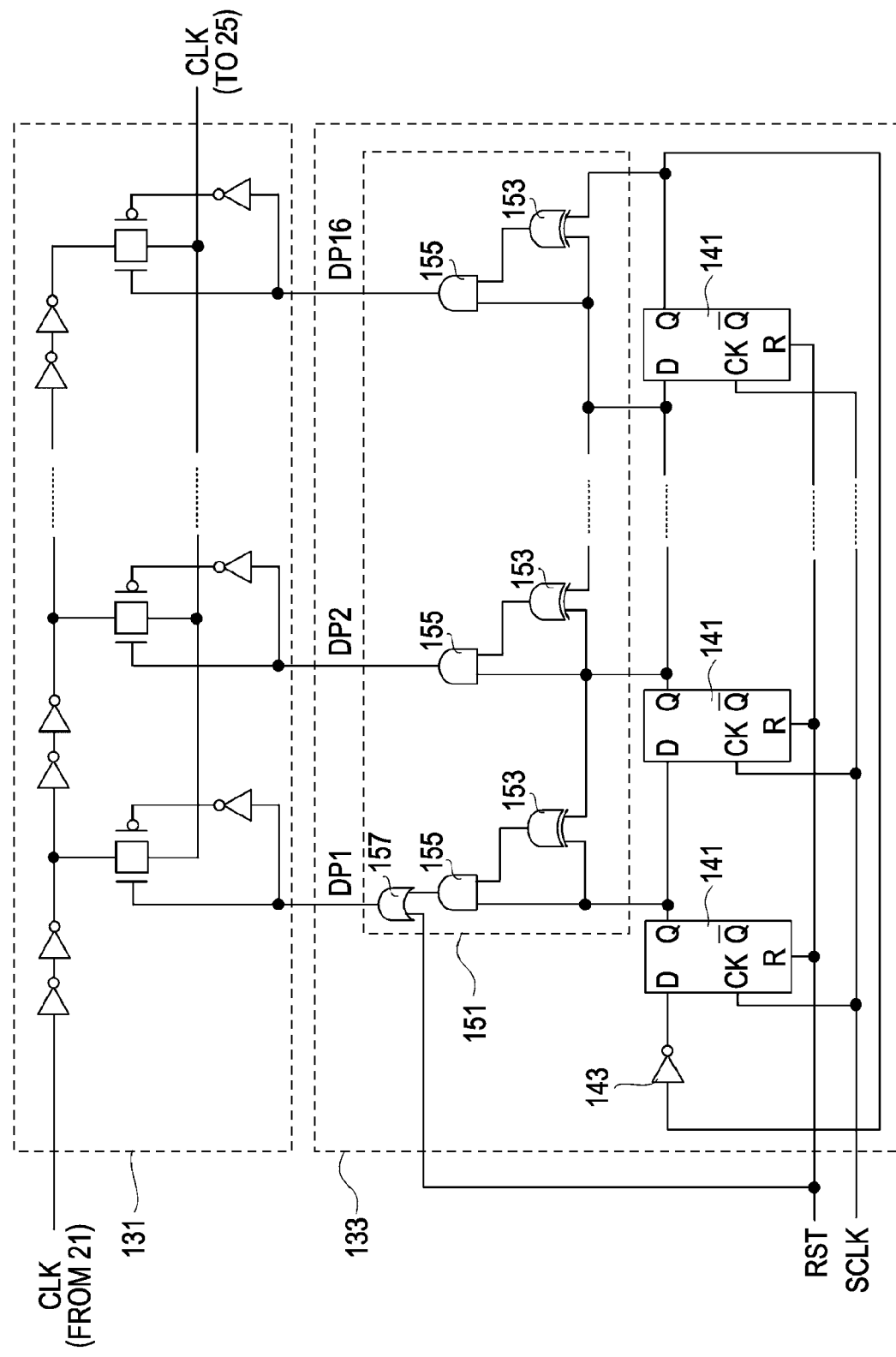
FIG. 29 is a diagram illustrating another connection relation between the ring type shift register and digital delay line.

Next, the configuration of the ring type shift register 135 will be described. The ring type shift register 135 is a shift register circuit wherein D flip-flops of a number the same as the stages of the digital delay line 133 have been connected in ring fashion. FIG. 29 illustrates a circuit example of the ring type shift register 135. In the case shown in FIG. 29, the ring type shift register 135 is configured of 16 stages of D flip-flop circuits 141 wherein the Q output of the previous stage is the D input of the next stage, and an inverter circuit 143 wherein the Q output of the final stage is subjected to logical inversion and fed back to the D input of the first stage, and a decoder 151.

Note that the D flip-flop circuits 141 have reset terminals, with the Q output of all being changed to an "L" level state by input of a reset signal. Also, the D flip-flop circuits 141 have shift clock terminals to execute operations for latching D input under supply of a shift clock SCLK and output to the next stage as Q output.

The configuration of the shift register is the same as that in FIG. 20. Accordingly, operation is performed such that the number of Q outputs which rise to "H" level is equal to the number of rising edges of the shift clocks SCLK input from the reset state.

However, the digital delay line 133 will not operate correctly if these Q outputs are simply provided to the digital delay line 133 as they are. Accordingly, the decoder 151 comes into play. The decoder 151 basically performs operations for detecting the boundary position of the D flip-flop where the Q output of the "H" level is manifested. That is because this position reflects the delay time used for phase synchronization.

Accordingly, the decoder 151 is configured of 15 XOR circuits 153 for detecting matching/non-matching of the input levels and output levels of the D flip-flops in the range of the second stage D flip-flop through the 16th stage D flip-flop. Using these XOR circuits 153 enables the position of the D flip-flop where its own Q output is "H" level but the Q output of the next stage is "L" level, i.e., the boundary position of level change.

Note that two "H" level pulse signals (delay amount setting signals DP) are manifested in the output of the XOR circuit 153 at the level change boundary position. Accordingly, the AND gate 155 obtains the logical conjunction of the Q output its own stage and the XOR circuit 153, and only one "H" level pulse signal is extracted. The output pulses of the 15 AND gates 155 are supplied to the CMOS switches (more specifically, the gate electrodes thereof) at the corresponding positions in the digital delay line 133, as control signals DP.

Note that a control signal DP is of positive logic. Accordingly, a control signal DP is directly provided to the gate electrode of the n-channel thin-film transistor, and a signal where the control signal DP has been subjected to logic inversion at the inverter circuit is provided to the gate electrode of the p-channel thin-film transistor.

However, with regard to the output pulse of just the AND gate 155 at the first stage, the output pulse is input to an OR gate 157 along with the reset signal, and the logical sum is supplied to the CMOS switch of the first stage as a control signal DP1. Accordingly, the CMOS switch of the first stage can be forcibly close controlled at the time of input of a reset signal.

Figure 30:
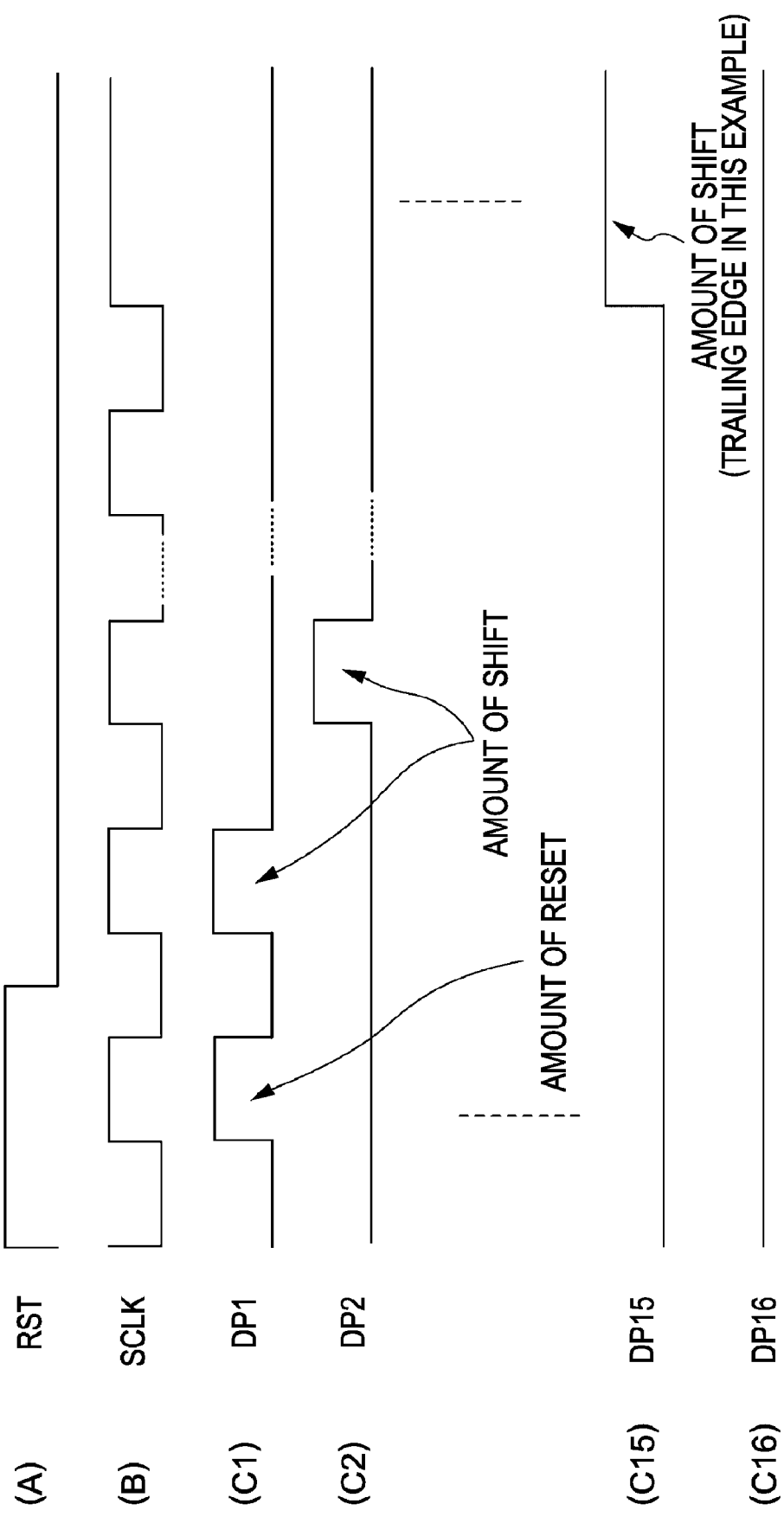
FIG. 30 is a diagram for explaining the operating state of the ring type shift register.

The following is a description of operations executed at the clock signal generating circuit 131, with reference to FIG. 30. Note that the operations of the shift clock generating unit 85 are the same as with the case of the clock signal generating circuit 81 illustrated in FIG. 17, so description thereof will be omitted.

(i) Reset

First, the reset operation executed at the time of turning the power on will be described. At this time, the ring type shift register 135 is supplied with an "H" level reset signal ((A) in FIG. 30) and a shift clock SCLK ((B) in FIG. 30). Due to the reset signal which has passed through the OR gate 157, only the first CMOS switch is controlled to a closed state. Accordingly, the delay amount of the digital delay line 133 is controlled to the minimum value.

(ii) Up to Phase Lock

Next, the operations from the end of the reset operation to phase lock of the input clock CLK1 and the output clock CLK2 will be described. First, only the Q output of the first stage D flip-flop changes to the "H" level due to input of the first shift clock SCLK following ending of the reset operation. At this time, the Q output of the second stage D flip-flop is "L" level, so the "H" level control signal DP is manifested only at the output stage of the first AND gate 155. Accordingly, only the first stage CMOS switch is controlled closed.

Next, upon the second shift clock SCLK following ending of the reset operation being input, the output of the first stage D flip-flop 141 and second stage D flip-flop 141 are at the "H" level. Accordingly, the boundary position of the "H" level Q outputs and "L" level Q outputs is found to be between the second stage D flip-flop 141 and third stage D flip-flop 141.

Accordingly, the "H" level control signal DP is manifested only at the output stage of the second AND gate 155, and only the second stage CMOS switch is controlled closed. Subsequently, each time the shift clock SCLK is input, the position of the CMOS switch controlled closed is shifted in order to the third, fourth, and so on ((C1) through (C15) in FIG. 30).

(iii) After Phase Lock

Finally, operations following phase lock will be described. FIG. 30 shows a case wherein the phase lock has been detected at the point that the 15th shift clock SCLK after ending resetting has been input to the ring type shift register 135. In this case, the boundary position of the "H" level Q outputs and "L" level Q outputs is fixed between the 15th stage D flip-flop 141 and 16th stage D flip-flop 141. Consequently, the clock delayed at the 15th stage buffer circuit is output to the phase inversion/non-inversion unit 25 through the 15th CMOS switch. These operations realize digital control of delay amount.

D Fourth Embodiment

D-1 Configuration of Display Panel

Figure 31:
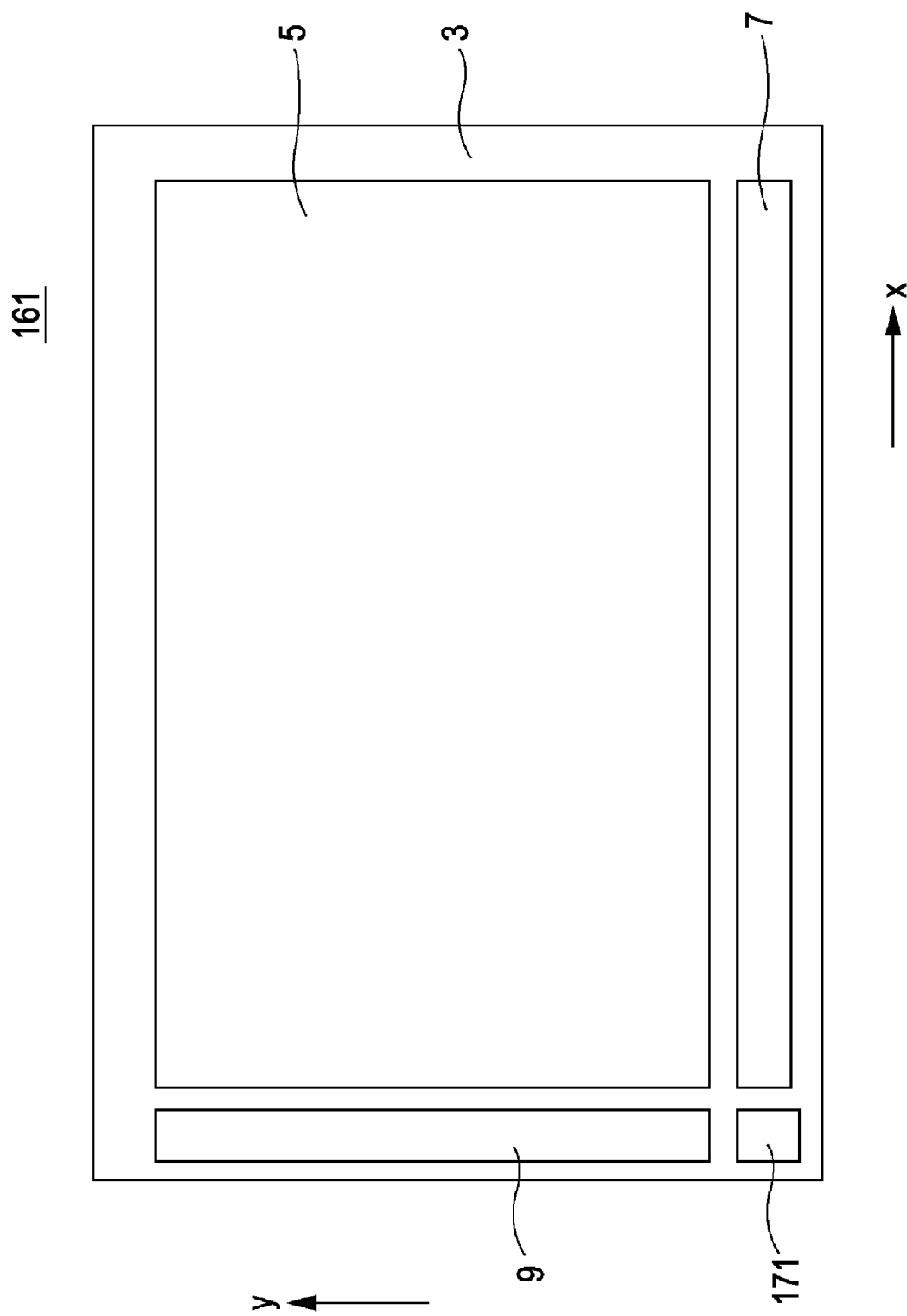
FIG. 31 is a diagram illustrating a plan configuration example of a display panel according to a fourth embodiment.

FIG. 31 illustrates a plan view configuration of a display panel 161 to be described in the present embodiment. In FIG. 31, components corresponding to FIG. 1 are denoted with the same reference numerals. As shown in FIG. 31, the basic configuration of the display panel 161 is the same as that of the display panel 1 according to the first embodiment, except that the clock signal generating circuit 171 is provided with a hierarchical delay control function, i.e., having a delay amount adjusting function combining a coarse adjustment function and a fine adjustment function.

D-2 Configuration of Clock Signal Generating Circuit (Delay Amount Hierarchical Control Type)

Figure 32:
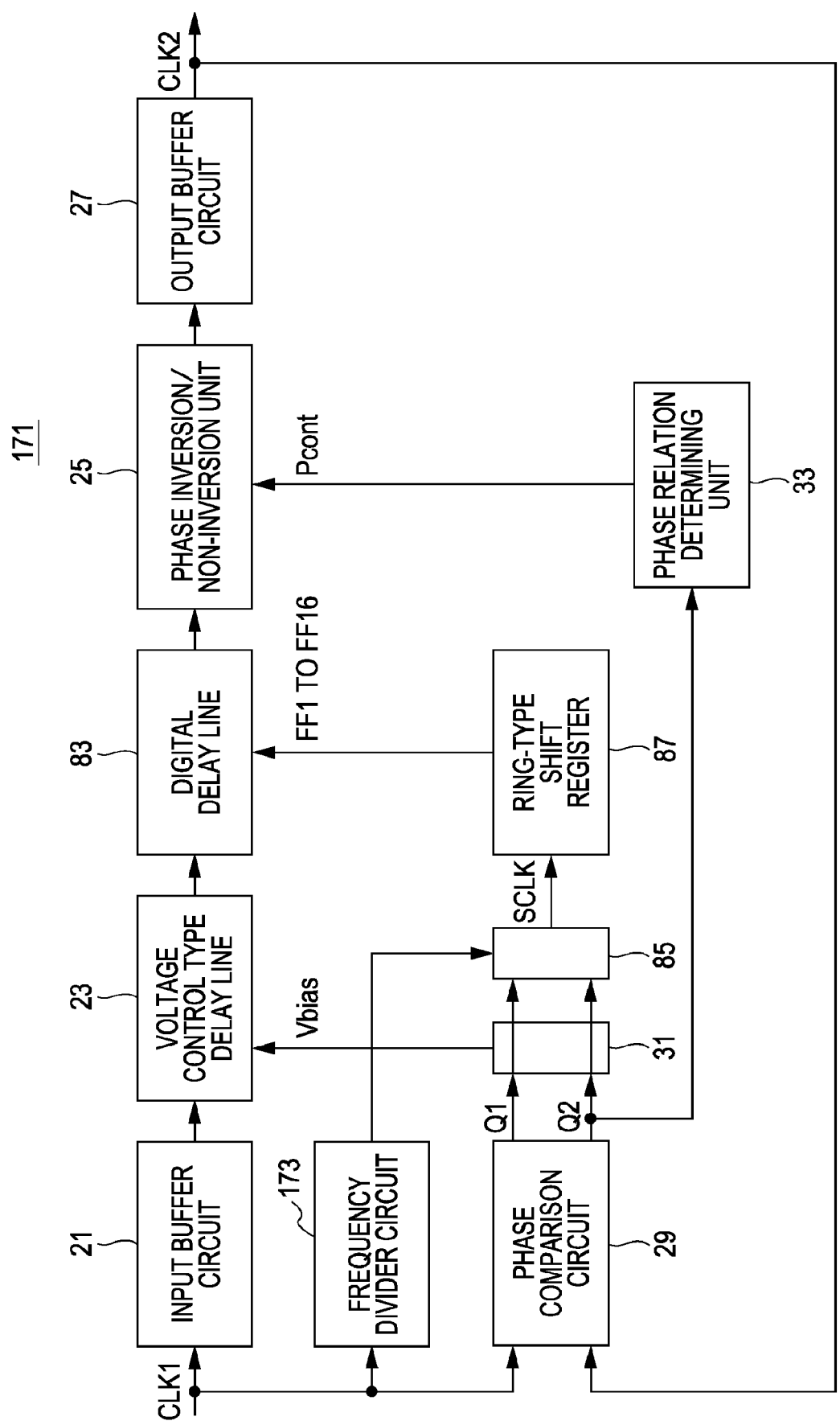
FIG. 32 is a diagram illustrating a configuration example of the clock signal generating circuit according to the fourth embodiment.

FIG. 32 illustrates the circuit configuration of the clock signal generating circuit 171 according to the present embodiment. Note that components which are the same as with the first embodiment (FIG. 2) and third embodiment (FIG. 17) are denoted with the same reference numerals.

As shown in FIG. 32, the clock signal generating circuit 171 according to this embodiment has a two-stage configuration for the delay of the voltage control type delay line 23 and digital delay line 83, using the charge pump 31 and ring type shift register 87 as respective delay amount setting units.

In the case of this embodiment, the voltage control type delay line 23 and the charge pump 31 correspond to fine adjustment functions of the delay amount, and the digital delay line 83 and ring type shift register 87 correspond to coarse adjustment functions of the delay amount.

Note that a clock obtained by frequency dividing of the input clock CLK1 is used as the clock for generating the shift clock SCLK stipulating the shift operations of the ring type shift register 87. A frequency divider circuit 173 is provided for this purpose. While the cycle of the frequency divider circuit 173 can be optionally set, the greater the cycle is, the lower the operating frequency of the ring type shift register 87 can be made. Accordingly, operating margin of the ring type shift register 87 and the digital delay line 83 can be ensured. Consequently, influence on yield can be reduced, as well.

D-3 Operations and Advantages of the Clock Signal Generating Circuit

With the clock signal generating circuit 171 according to this embodiment, the relation of phases at the time of the reset operation ending is detected, and the delay amount of both the voltage control type delay line 23 for fine adjustment and the digital delay line 83 for coarse adjustment are set in accordance with the phase amount detected at the phase comparison circuit 29, in the following operation period.

In the event that the phase of the output clock CLK2 is advanced as to the phase of the input clock CLK1, 180° phase inversion of the output clock CLK2 is performed at the phase inversion/non-inversion unit 25 under control of the phase relation determining unit 33. When phase lock is eventually detected, delay amount setting operations are stopped at both the charge pump 31 and the ring type shift register 87, and the delay amounts at that point are saved.

In the event that phase difference occurs following phase lock, phase fine adjustment operations are performed by the charge pump 31 alone, but the ring type shift register 87 for coarse adjustment does not operate. This is because phase shift following phase lock is minute, and the phase difference is resolved before the shift clock SCLK which is a frequency division clock of the input clock CLK1 is generated.

Hierarchically performing control of delay control in this way enables a clock signal generating circuit to be realized wherein phase lock speed and fine adjustment are balanced. Of course, the adjustment range of the phase can be restricted to 180° with this embodiment as well, so reduction in size of the circuit area and reduction in electric power consumption can be realized.

D-4 Other Circuit Configurations

Figure 33:
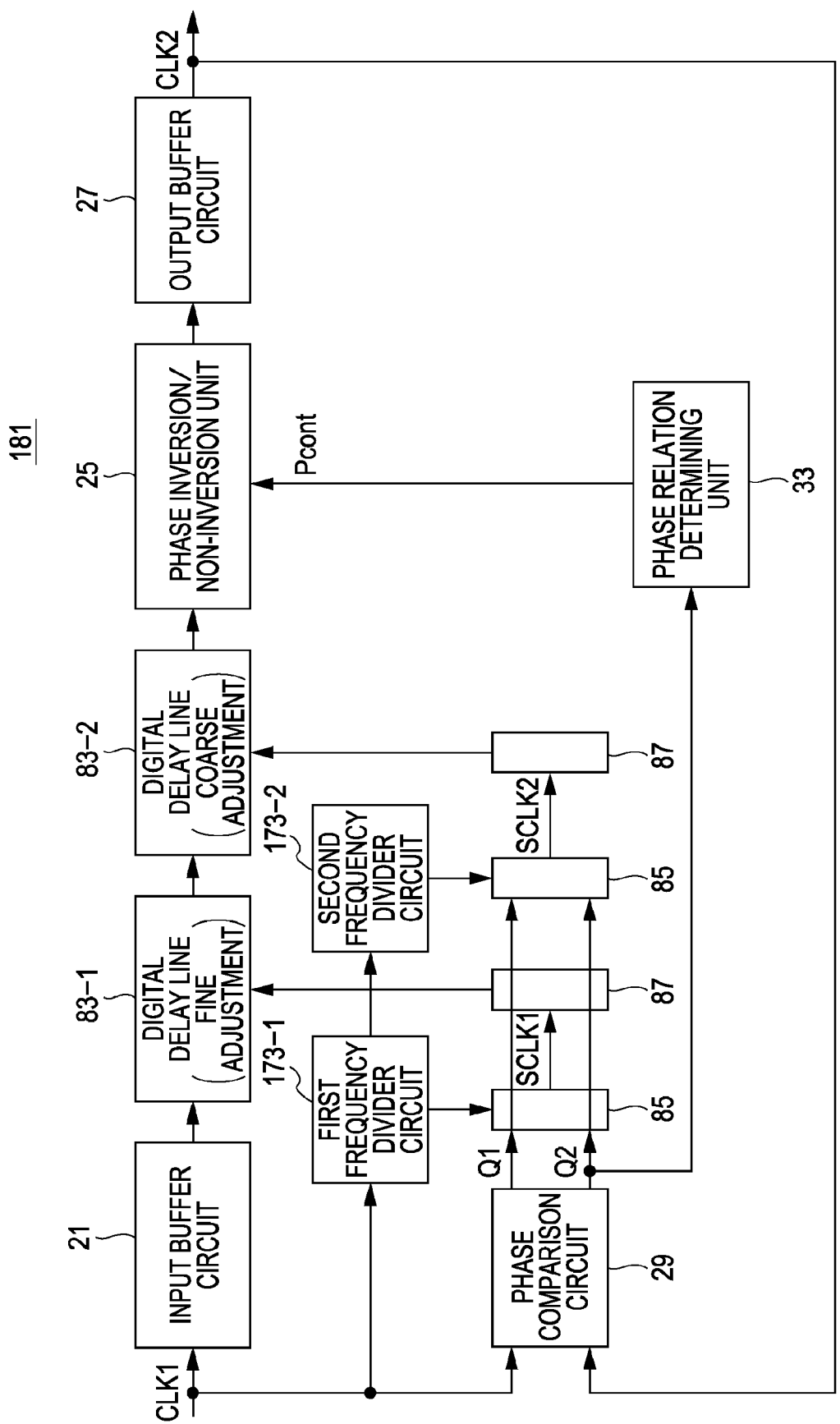
FIG. 33 is a diagram illustrating another configuration example of the clock signal generating circuit according to the fourth embodiment.

A configuration has been described above where the delay line for coarse adjustment is configured of the voltage control type delay line 23 and the delay line for fine adjustment is configured of the digital delay line 83. However, an arrangement may be made as with the clock signal generating circuit 181 shown in FIG. 33 wherein both delay lines, for coarse adjustment and fine adjustment, are configured of digital delay lines 83. In this case, a fine adjustment shift clock SCLK1 can be generated as a frequency division clock of the input clock CLK1, and a coarse adjustment shift clock SCLK2 can be further generated as a frequency division clock of the frequency division clock.

E Fifth Embodiment

E-1 Configuration of Display Panel

FIG. 34 illustrates a plan view configuration of a display panel 191 to be described in the present embodiment. In FIG. 34, components corresponding to FIG. 1 are denoted with the same reference numerals. As shown in FIG. 34, the basic configuration of the display panel 191 is the same as that of the display panel 1 according to the first embodiment, except for the clock signal generating circuit 201.

A pseudo-lock state disengaging function is added to the clock signal generating circuit 201 with the present embodiment. The reason is that thin-film transistor formed on the face of a glass substrate have greater property irregularities as compared with transistors formed on a silicon wafer. Accordingly, a state wherein the phase difference between the input clock CLK1 and the output clock CLK2 is 180° may be erroneously determined to be in phase lock. To deal with this, the clock signal generating circuit 201 according to this embodiment has a function for detecting a pseudo lock state and escaping this state.

E-2 Configuration of Clock Signal Generating Circuit (Pseudo Lock Disengaging Function Type)

FIG. 36 illustrates the circuit configuration of the clock signal generating circuit 201 according to the present embodiment. Note that components in FIG. 36 which are the same as with FIG. 2 are denoted with the same reference numerals.

The component new to the clock signal generating circuit 201 shown in FIG. 36 is a pseudo lock detecting unit 203. This pseudo lock detecting unit 203 is a circuit for detecting a pseudo lock state between the input clock CLK1 and the output clock CLK2. Note that the pseudo lock detecting unit 203 may also be referred to as "pseudo lock disengaging unit".

Note that in the present embodiment, an OR gate 205 for sharing the phase inversion/non-inversion unit 25 between the phase relation determining unit 33 and the pseudo lock detecting unit 203 is also provided. That is to say, a gate circuit which generates the logical sum of the phase conversion control signal Pcont and a pseudo lock detecting signal WNG is provided.

Figure 37A:
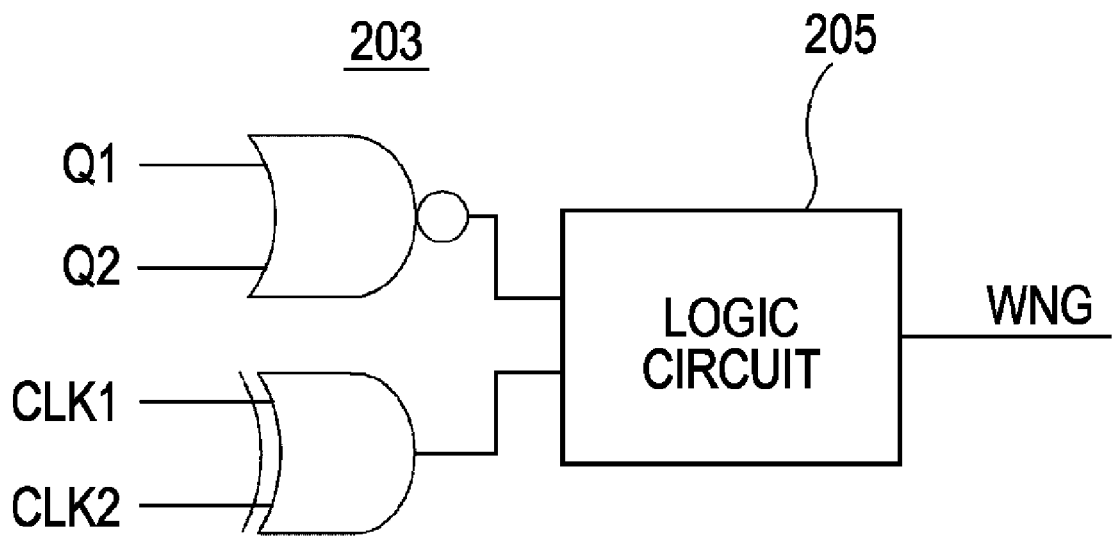
FIG. 37 is a diagram illustrating a configuration example of a pseudo lock detecting unit.
Figure 37B:
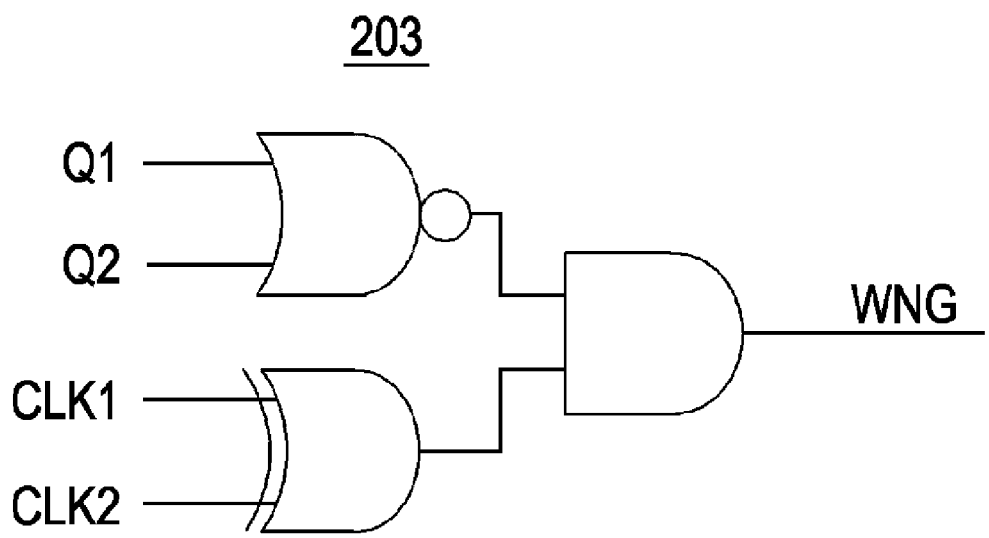

FIGS. 37A and 37B illustrate the circuit configuration of the pseudo lock detecting unit 203. FIG. 37A shows a circuit configuration in a case of combining gate circuits and the logic circuit 205, and FIG. 37B shows a circuit configuration in a case of combining gate circuits alone.

FIG. 38 illustrates the input/output relation regarding the pseudo lock detecting unit 203. As indicated by heavy lines in FIG. 38, in the event that the determination outputs Q1 and Q2 are both "L" level and also the signal levels of the input clock CLK1 and the output clock CLK2 differ, the pseudo lock detecting unit 203 determines that the input clock CLK1 and the output clock CLK2 are in a pseudo lock state.

Detection of both determination outputs Q1 and Q2 being "L" level is made at a NOR gate in FIGS. 37A and FIG. 37B. Also, the fact that the signal levels of the input clock CLK1 and the output clock CLK2 differ is detected at the XOR gate in FIGS. 37A and FIG. 37B. The logic circuit 205 realizes the same logic operations as an AND gate.

This pseudo lock detecting unit 203 converts the pseudo lock detecting signal WNG to "H" level when detecting a pseudo lock state. In the event that a pseudo lock state is not detected, the pseudo lock detecting unit 203 outputs "L" level pseudo lock detecting signals WNG.

E-3 Operations and Advantages of the Clock Signal Generating Circuit

In the case of the clock signal generating circuit 201 according to this embodiment, even in a case wherein the determination outputs Q1 and Q2 from the phase comparison circuit 29 are both "L" level, and a phase lock state is determined, the pseudo lock detecting unit 203 can determine whether the lock state is true or false.

In the event that determination is made that the lock state is false (pseudo lock), the phase of the output clock of the voltage control type delay line 23 can be inverted by the phase inversion/non-inversion unit 25. The phase difference between a pseudo lock state and a true lock state is 180°, so the output clock CLK2 can be changed to the proper lock phase with this inversion operation.

Of course, in the event that a state wherein the output clock CLK2 is advanced as to the input clock CLK1 is detected before detection of the pseudo lock state, the output clock of the voltage control type delay line 23 is inverted by the phase inversion/non-inversion unit 25. Thus, by using the clock signal generating circuit 201 according to this circuit configuration, even in the event that the phase of the output clock CLK2 is erroneously caught in a pseudo lock state, this state can be escaped and brought in a proper lock state in a sure manner.

F Sixth Embodiment

F-1 Configuration of Display Panel

Figure 39:
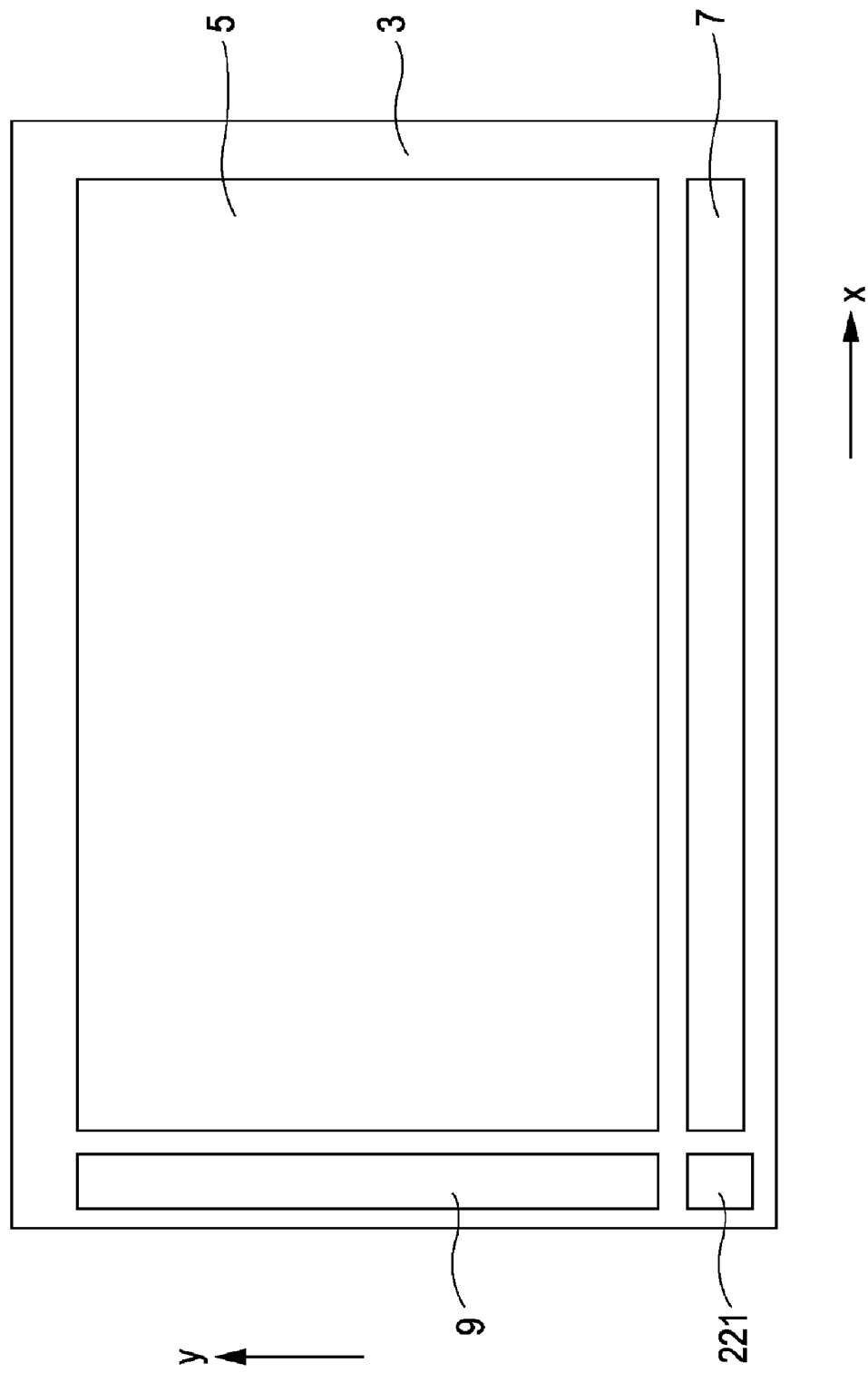
FIG. 39 is a diagram illustrating a plan configuration example of a display panel according to a sixth embodiment.

FIG. 39 illustrates a plan view configuration of a display panel 211 to be described in the present embodiment. In FIG. 39, components corresponding to FIG. 1 are denoted with the same reference numerals. As shown in FIG. 39, the basic configuration of the display panel 211 is the same as that of the display panel 1 according to the first embodiment, except for the clock signal generating circuit 221.

The clock signal generating circuit 221 according to this embodiment has a separating function for separating between the determining period of phase relation and phase adjustment period based on the determination results of phase relation determining. The reason is that in the event of determining phase relation while phase adjustment operations are being executed, the phase relation changes during the determining operation as well, interfering with accurate phase determination.

Accordingly, with the present embodiment, a clock signal generating circuit will be described wherein the phase relation of the input clock CLK1 and the output clock CLK2 is determined during a period in which the delay amount setting operations are stopped (during the reset period), and inversion/non-inversion is executed based on the determination results thereof following the reset period ending.

Figure 40:
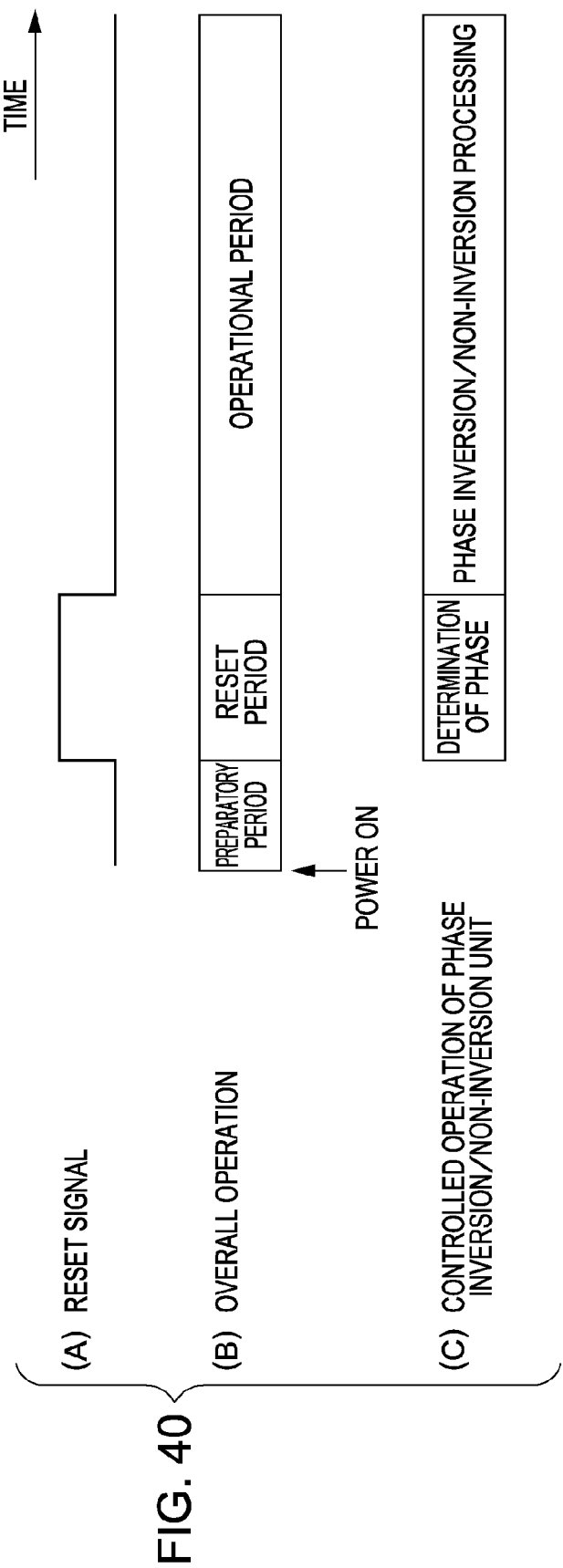
FIG. 40 is a diagram for explaining separation of operation periods.

FIG. 40 illustrates the operations thereof. (A) in FIG. 40 illustrates the supply period of a reset signal. The reset signal is output for a predetermined amount of time following turning the power on. The state of each circuit is reset to the initial state due to the reset signal. (B) in FIG. 40 illustrates the operation timing of the entire clock signal generating circuit, and (C) in FIG. 40 illustrates the operation timing of the phase inversion/non-inversion unit 25. Note that the input phase is fixed to an operation state of being output without change during the phase determining period.

F-2 Configuration of Clock Signal Generating Circuit (Determination Period Separation Type)

Figure 41:
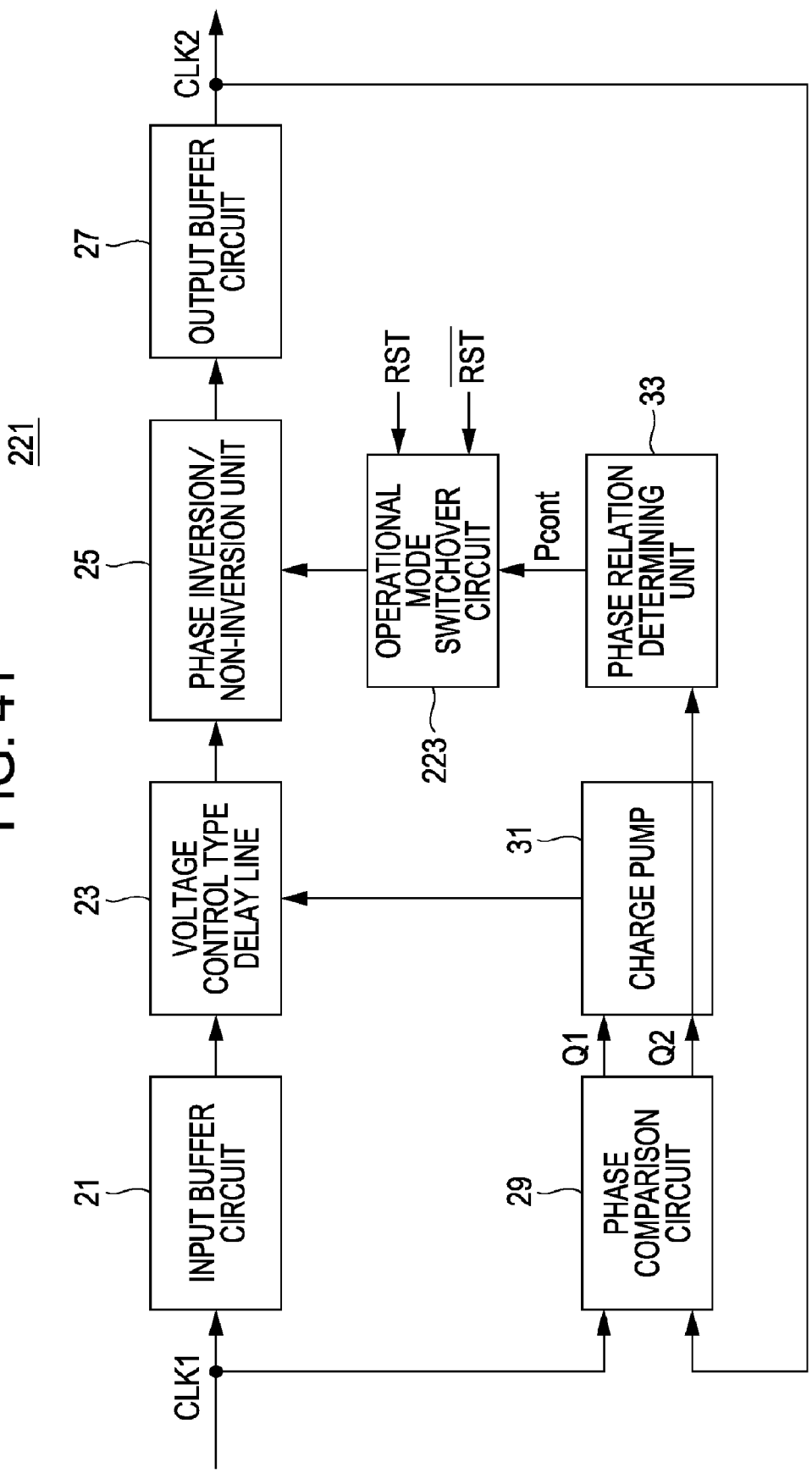
FIG. 41 is a diagram illustrating a configuration example of a clock signal generating circuit according to the sixth embodiment.

FIG. 41 illustrates the circuit configuration of the clock signal generating circuit 221 according to the present embodiment. Note that components in FIG. 41 which are the same as with FIG. 2 are denoted with the same reference numerals.

Figure 42:
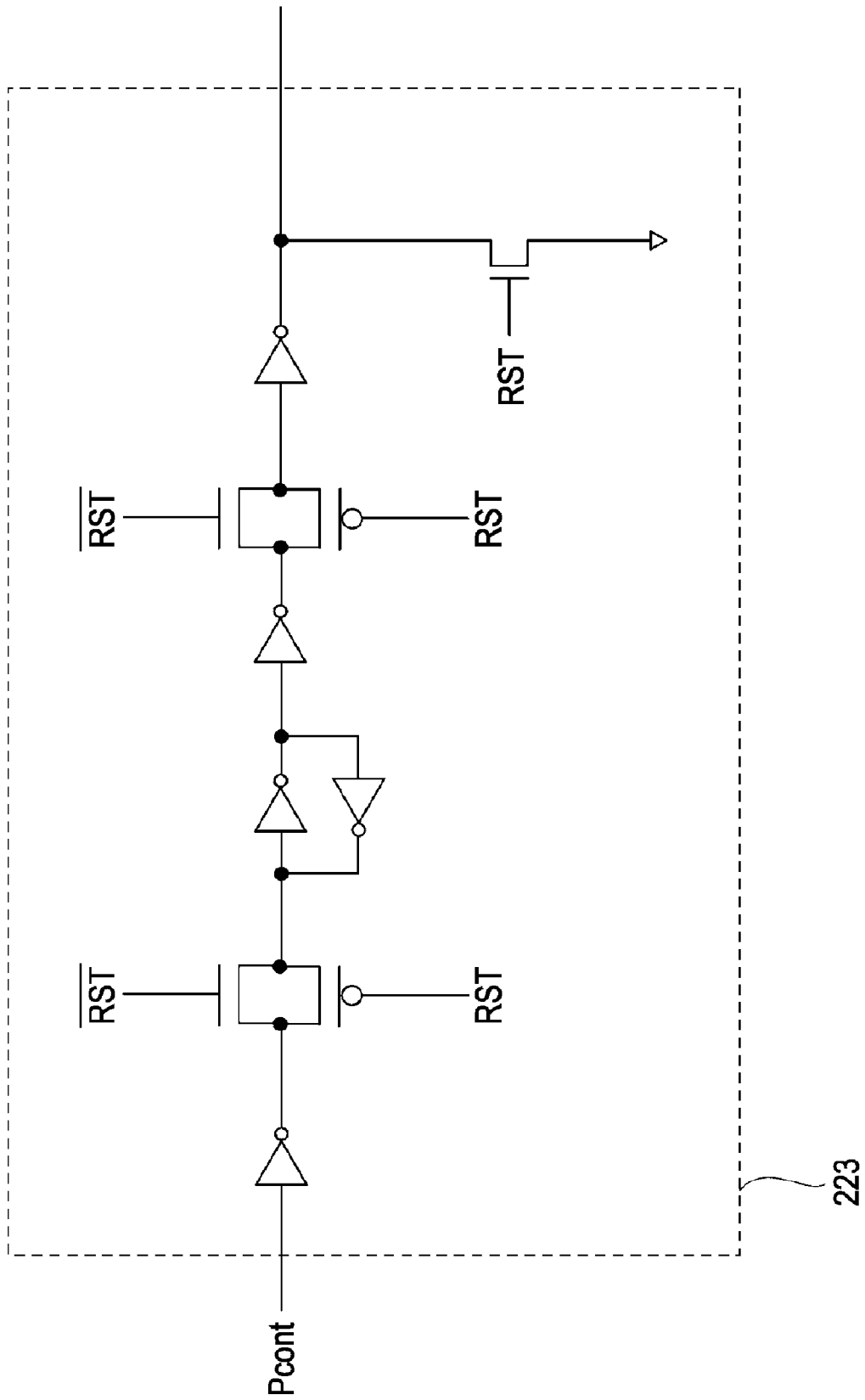
FIG. 42 is a diagram illustrating a configuration example of a operational mode switchover circuit.

The component new to the clock signal generating circuit 221 shown in FIG. 41 is an operational mode switchover circuit 223. This operational mode switchover circuit 223 executes operations of switching over supplied to the phase inversion/non-inversion unit 25 in accordance with input of reset signals. FIG. 42 shows the circuit configuration of the operational mode switchover circuit 223. The operational mode switchover circuit 223 shown in FIG. 42 is a circuit example assuming that the phase inversion/non-inversion unit 25 has the circuit configuration shown in FIG. 4.

With the operational mode switchover circuit 223, four inverter circuits, including inverter circuits making up a latch, are serially disposed on the phase conversion control signal Pcont transmission path. That is to say, the input level is the output level with no change. However, a switch is disposed on the phase conversion control signal Pcont transmission path which opens at the time of input of a reset signal, and forbids new latch operations and output operations. Also, a switch (thin-film transistor) which closes at the time of input of a reset signal to forcibly control the output stage of the operational mode switchover circuit 223 to "L" level is connected to the output stage.

F-3 Operations and Advantages of the Clock Signal Generating Circuit

Figure 43:
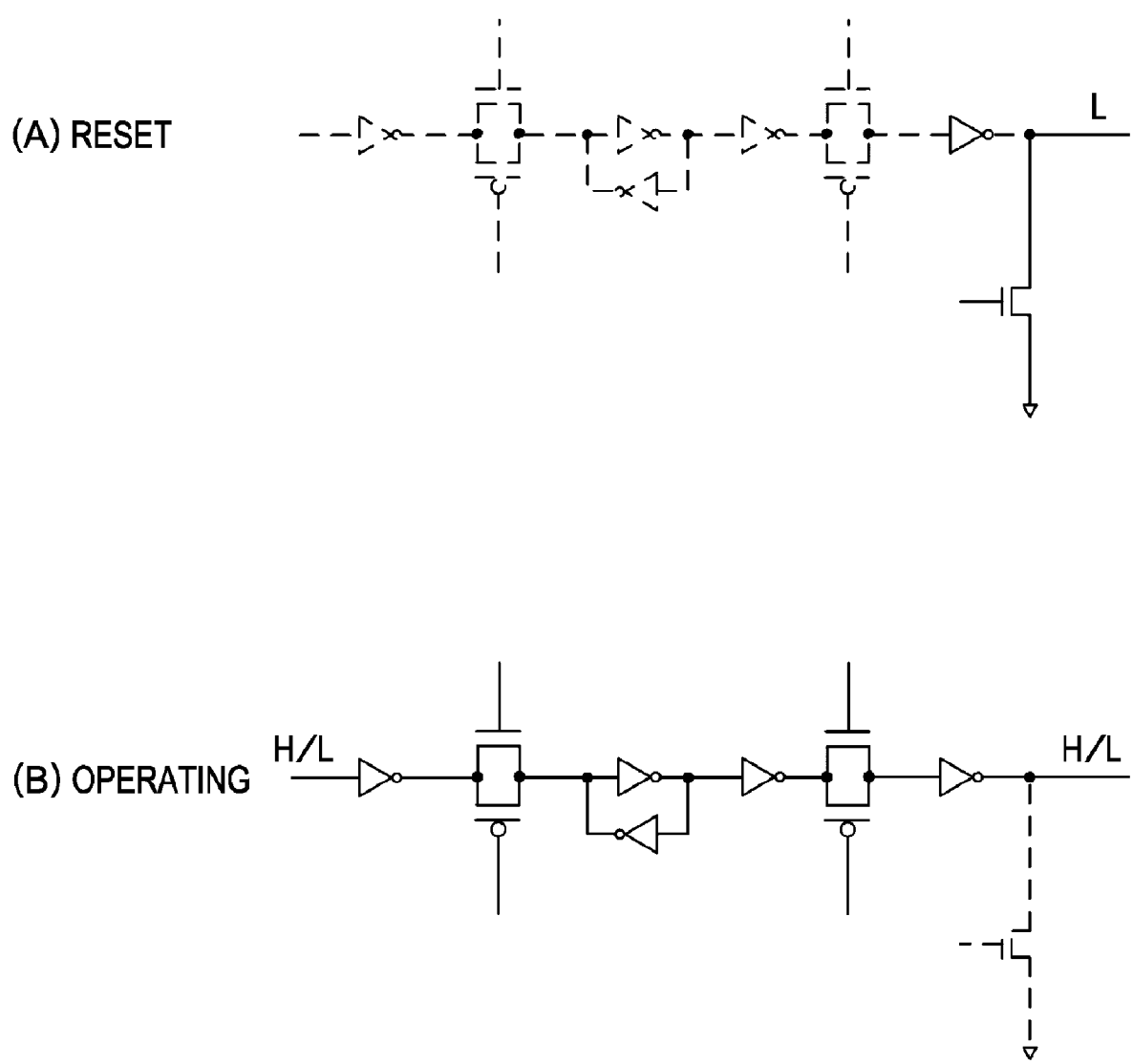
FIG. 43 is a diagram for explaining the operating state of the operational mode switchover circuit.

FIG. 43 illustrates how connection within the circuit changes depending on the signal level of the reset signal. (A) in FIG. 43 illustrates the connection state when resetting. As shown in the drawing, at the time of resetting, a fixed "L" level signal is output to the phase inversion/non-inversion unit 25 from the output end of the operational mode switchover circuit 223. The phase inversion/non-inversion unit 25 has the configuration shown in FIG. 4, and accordingly, the phase inversion/non-inversion unit 25 acts as a buffer. On the other hand, a signal level according to the determination results at the phase relation determining unit 33 is output to the phase inversion/non-inversion unit 25 during normal operations. Accordingly, the determining period of phase relation and phase adjustment period based on the determination results of phase relation determining are separated, and accurate determining operations and accurate phase control can be realized.

F-4 Other Circuit Configurations

Figure 44:
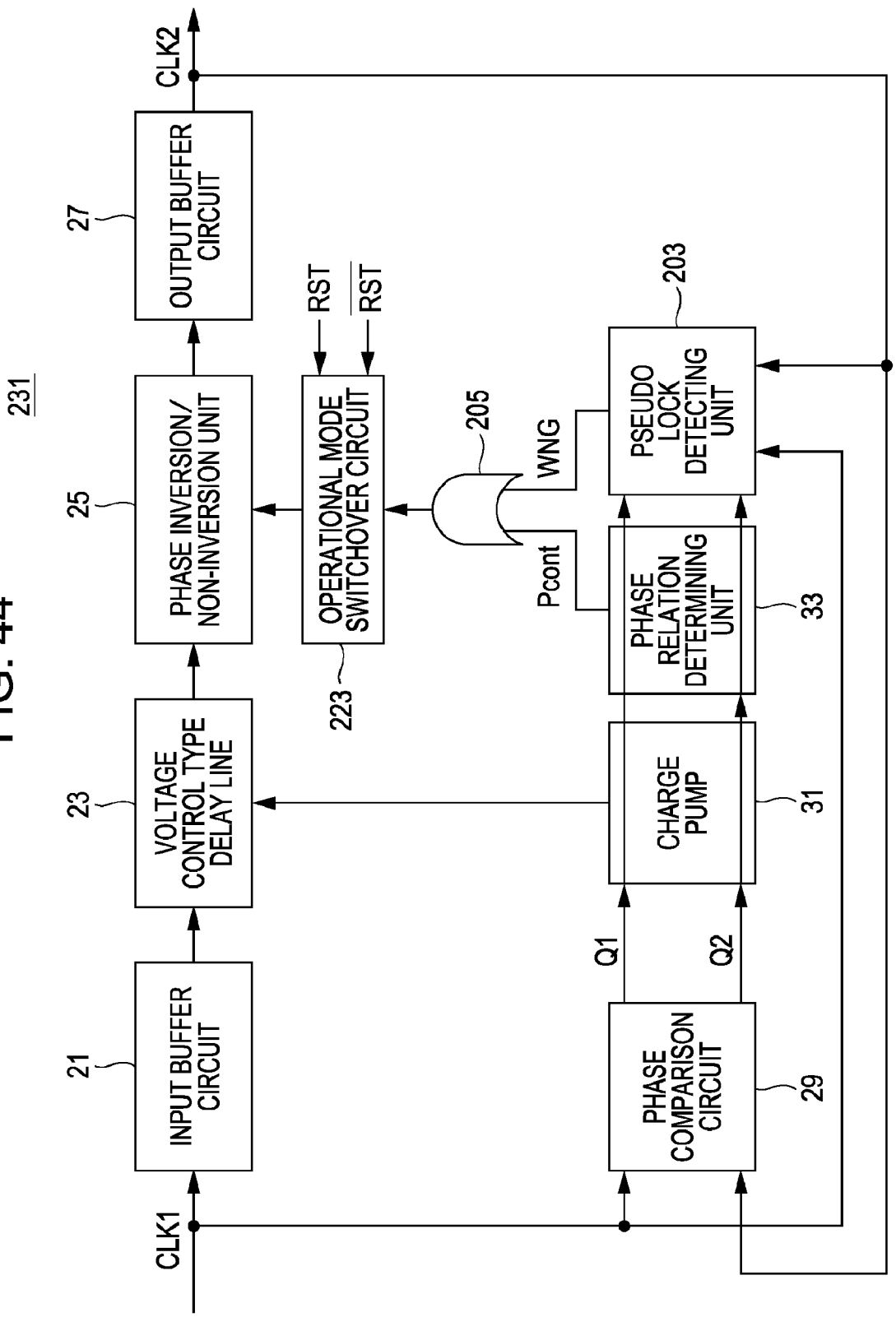
FIG. 44 is a diagram illustrating another configuration example of the clock signal generating circuit according to the sixth embodiment.

While an arrangement has been described above wherein the determining period of phase relation by the phase relation determining unit 33 and the phase adjustment period based on the determination results are separated, an arrangement may be made wherein the above-describe pseudo lock detection function is also used for separating between the determining period and phase control period based on the determination results, as with the clock signal generating circuit 231 shown in FIG. 44.

G Other Configuration Examples

G-1 Insulating Substrate

The above embodiments have been described regarding active elements making up the clock signal generating circuit being directly formed on the glass substrate 3, which is an insulating substrate, using thin-film forming techniques or printing techniques using polysilicon (regardless of whether high temperature or low temperature), amorphous silicon, organic material, and so forth. However, the insulating substrate on which the clock signal generating circuit is formed is not restricted to this, and may be another insulating substrate such as plastic mounted on the glass substrate 3, or the like.

G-2 Examples of Application to Display Panels

The clock signal generating circuit described in the above embodiments is not restricted to application to liquid crystal panels, and can also be applied to organic EL panels, plasma displays, field-emission displays, and other light-emitting display panels.

G-3 Example of Application to Electronic Equipment (a) System Example

The above-described clock signal generating circuit is not restricted to application to system displays, and can be applied to other electronic equipment as well. An example of electronic equipment is described below.

Figure 45:
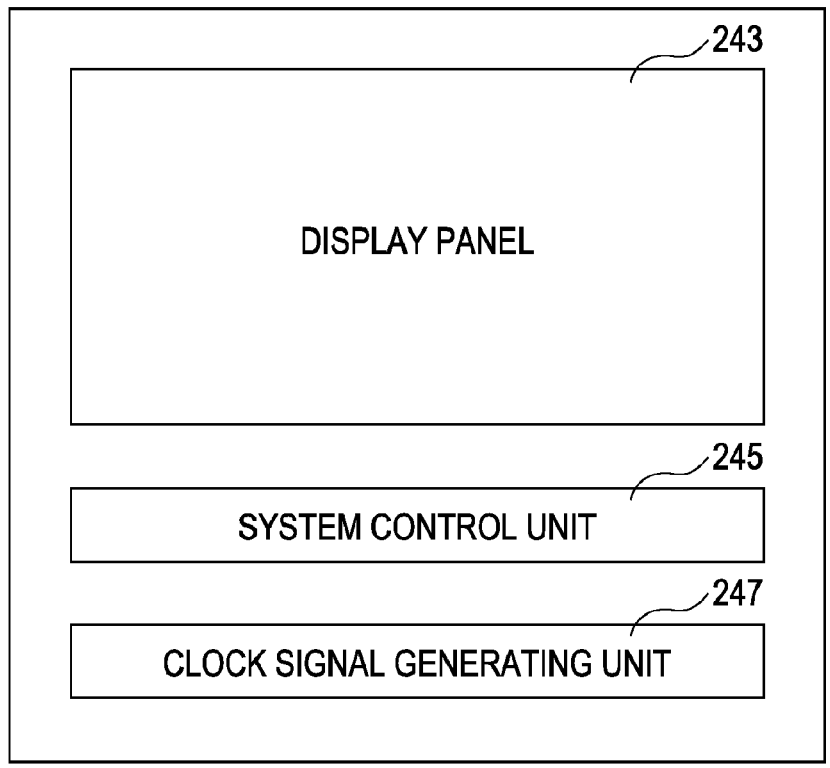
FIG. 45 is a diagram illustrating a system configuration example of electronic equipment.

FIG. 45 shows a system configuration example of electronic equipment to which a display panel is mounted. This electronic equipment is configured of a display panel 243, a system control unit 245, and a clock signal generating unit 247. The clock signal generating circuit 247 may be formed on the substrate of the display panel 243, or may be formed on a separate substrate.

The system control unit 245 is a processing unit for controlling the operations of the entire system, and is configured of a CPU, for example. Also provided are interfaces in accordance with the usage of the electronic equipment.

Figure 46:
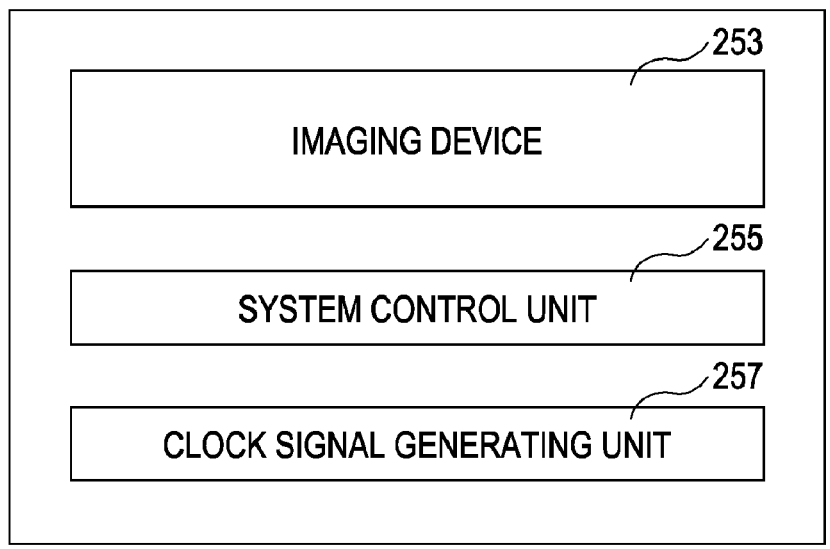
FIG. 46 is a diagram illustrating a system configuration example of electronic equipment.

FIG. 46 illustrates a system configuration example wherein an imaging device (imager) is mounted on the electronic equipment. This electronic equipment 251 is configured of the imaging device 253, system control unit 255, and clock signal generating circuit 257. The clock signal generating circuit 257 here is a circuit for generating operating clocks of the imaging device, and as with the case of the above embodiment, the clock signal generating circuit 257 may be formed on the substrate of the imaging device 257 or may be formed on another substrate.

The system control unit 255 is a processing unit for controlling the operations of the entire system, and is configured of CPU, for example. Also provided are interfaces in accordance with the usage of the electronic equipment. A configuration may also be conceived as a lone sensing device, with no system control unit 255 provided.

(b) Example of External Appearance of Electronic Equipment

The following is a description of examples of the external appearance of the electronic equipment. The clock signal generating circuit is built into some part of the casing.

Figure 47:
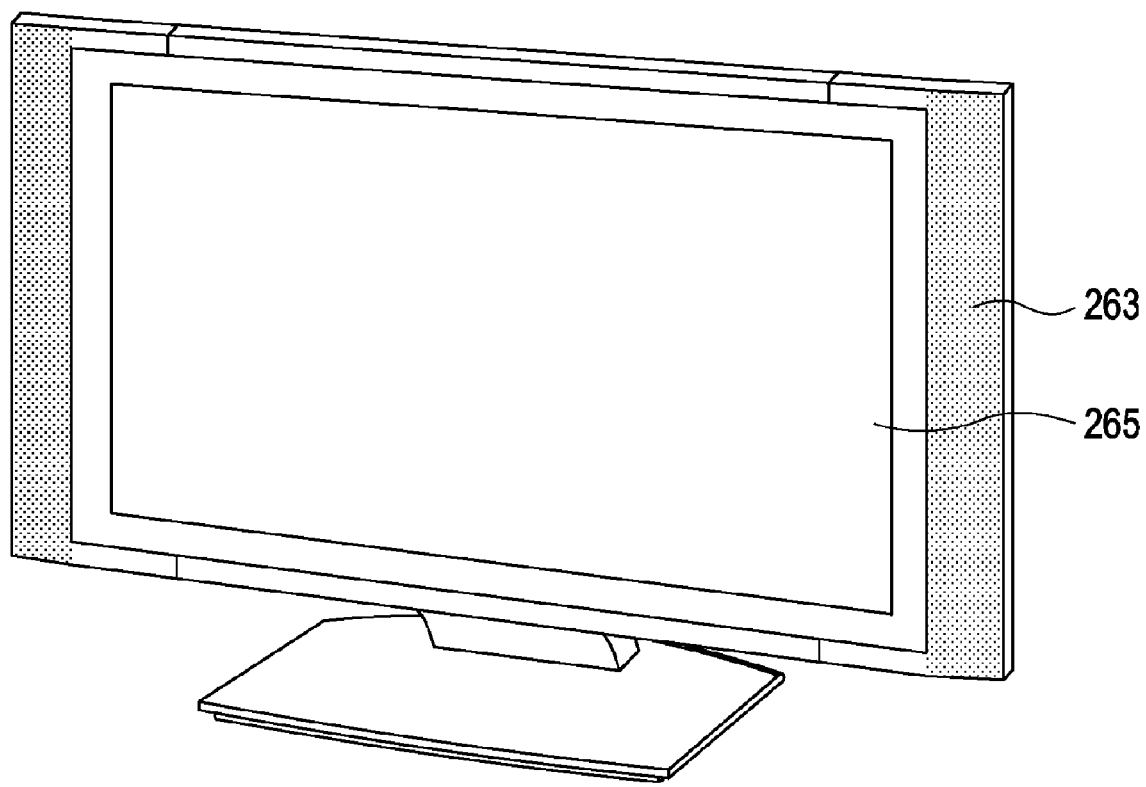
FIG. 47 is a diagram illustrating an external view of electronic equipment.

FIG. 47 is an example of the external view of a television receiver 261. The television receiver 261 has a configuration wherein a display panel 265 is positioned at the front face of a front panel 263 serving as the casing.

Figure 48A:
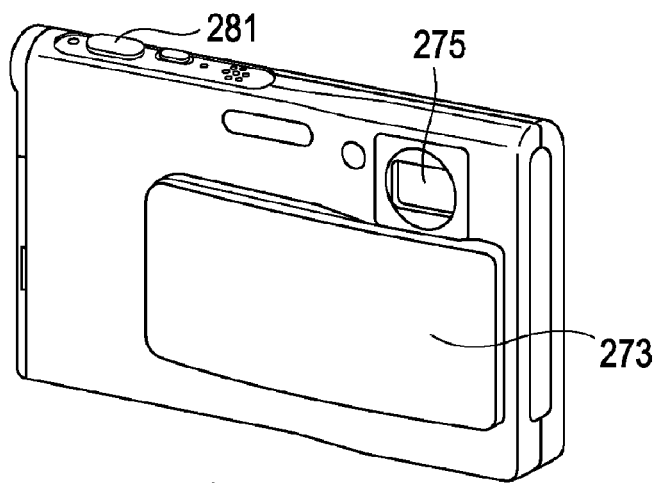
FIGS. 48A and 48B are diagram illustrating external views of electronic equipment.
Figure 48B:
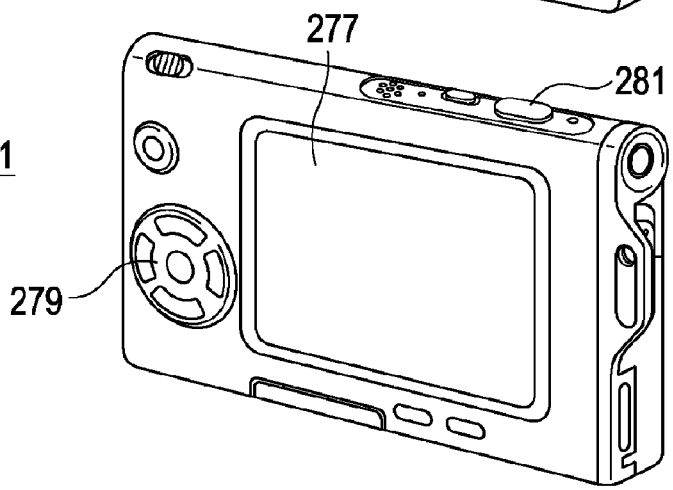

FIGS. 48A and 48B are examples of the external view of a digital camera 271. FIG. 48A is an example of the external view of the digital camera from the front side (subject side), and FIG. 48B is an example of the external view of the digital camera from the rear side (photographer side). The digital camera 271 has a protective cover 273, photography lens unit 275, display panel 277, control switch 279, a shutter button 281, and so forth, disposed on the casing.

Figure 49:
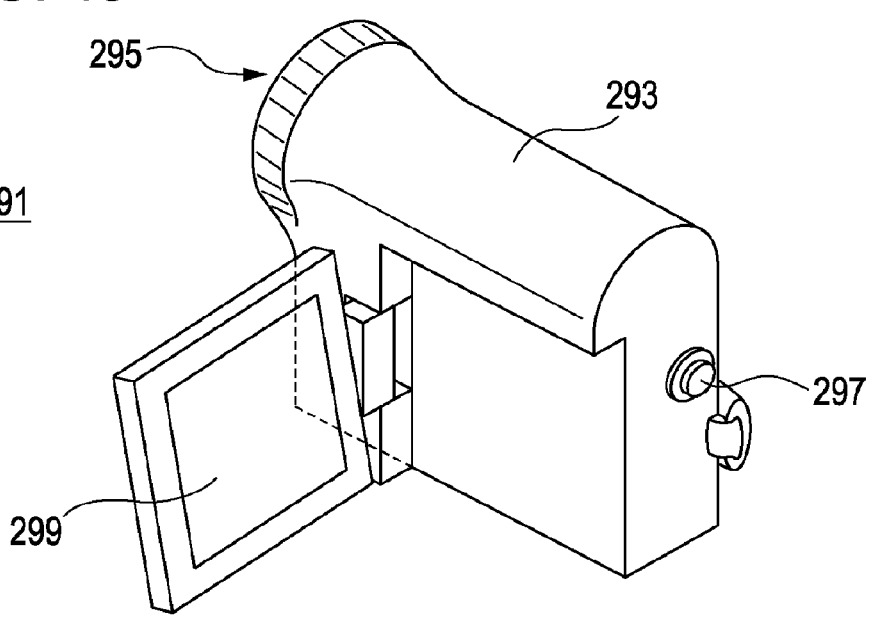
FIG. 49 is a diagram illustrating an external view of electronic equipment.

FIG. 49 is an example of the external view of a video camera 291. The video camera 291 has a video lens 295 for shooting a subject at the front side of a main unit 293, and a shooting start/stop switch 297 disposed on the rear face of the main unit 293, with a display panel 299 provided to a side face of the main unit 293.

Figure 50A:
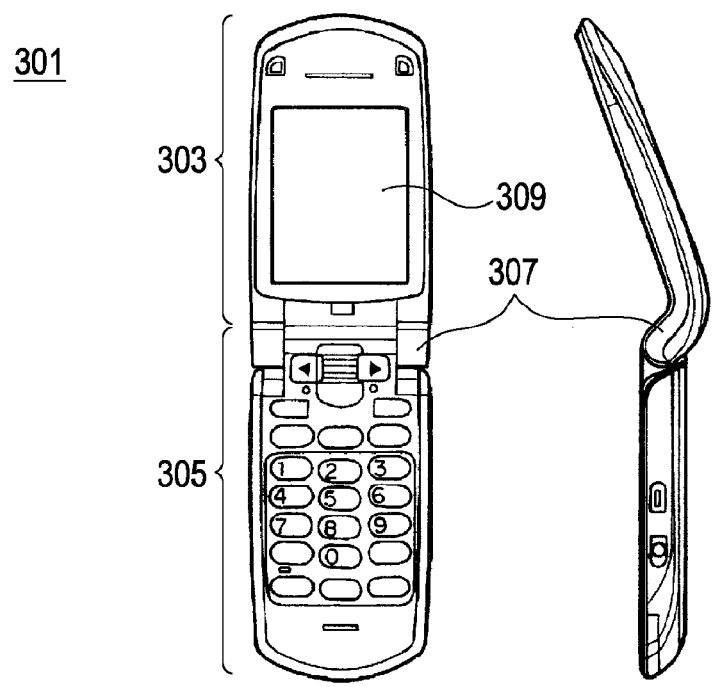
FIGS. 50A and 50B are diagram illustrating external views of electronic equipment.
Figure 50B:
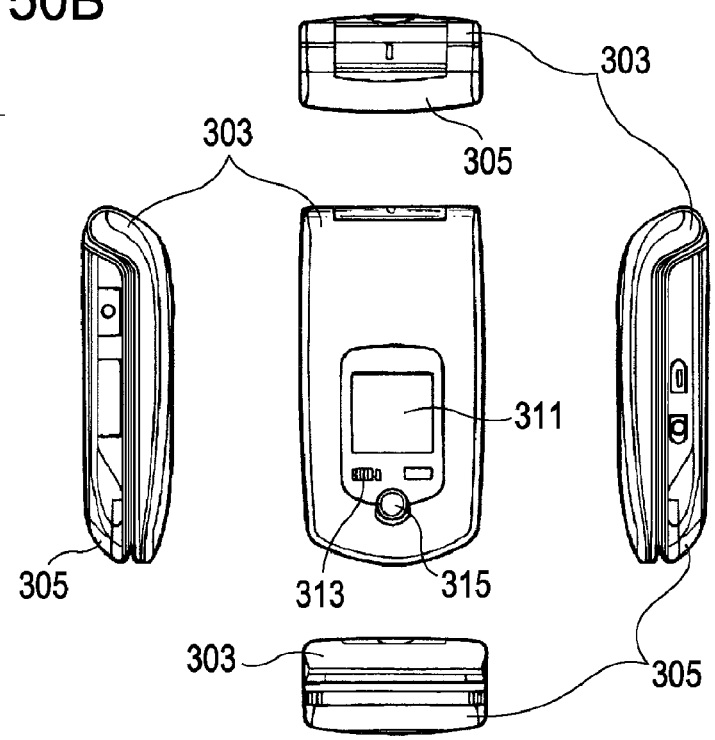

FIGS. 50A and 50B are examples of the external view of a clamshell cellular telephone 301. FIG. 50A is an example of the external view of the cellular telephone 301 when opened, and FIG. 50B is an example of the external view of the cellular telephone 301 when folded. The cellular telephone 301 has a configuration wherein an upper casing 303, lower casing 305, linkage unit (hinge unit in this example) 307, main display panel 309, supplementary display panel 311, picture light 313, and photography lens 315 are disposed on the face of the casing.

Figure 51:
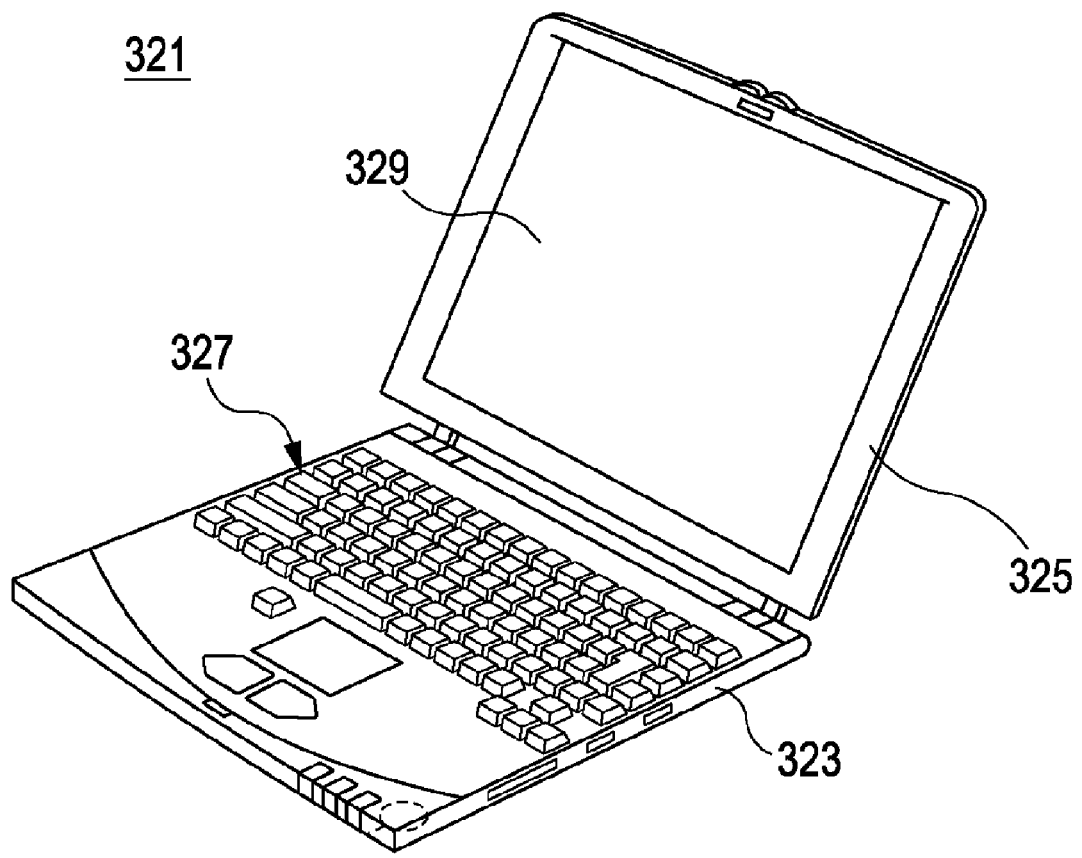
FIG. 51 is a diagram illustrating an external view of electronic equipment.

FIG. 51 is an example of the external view of a computer 321. The computer 321 is configured of a lower casing 323, side casing 325, keyboard 327, and display panel 329.

In addition to these examples, the clock signal generating circuit can be implemented in other electronic equipment, such as audio players, gaming consoles, electronic book readers, electronic dictionaries, and so forth.

G-4 Phase Comparison Circuit

Embodiments have been described above with regard to a case wherein the output buffer circuit 27 includes the circuit configuration shown in FIG. 5. However, in the case of an embodiment using a digital delay line for the delay line, the circuit configuration shown in FIG. 52 can be employed for the output buffer circuit 27. That is to say, the output buffer circuit 27 can be configured as a D flip-flop 271 operating with the output clock CLK2 as the clock thereof. In this case, the input clock CLK1 can be connected to the D input terminal.

Figures 52, 53:
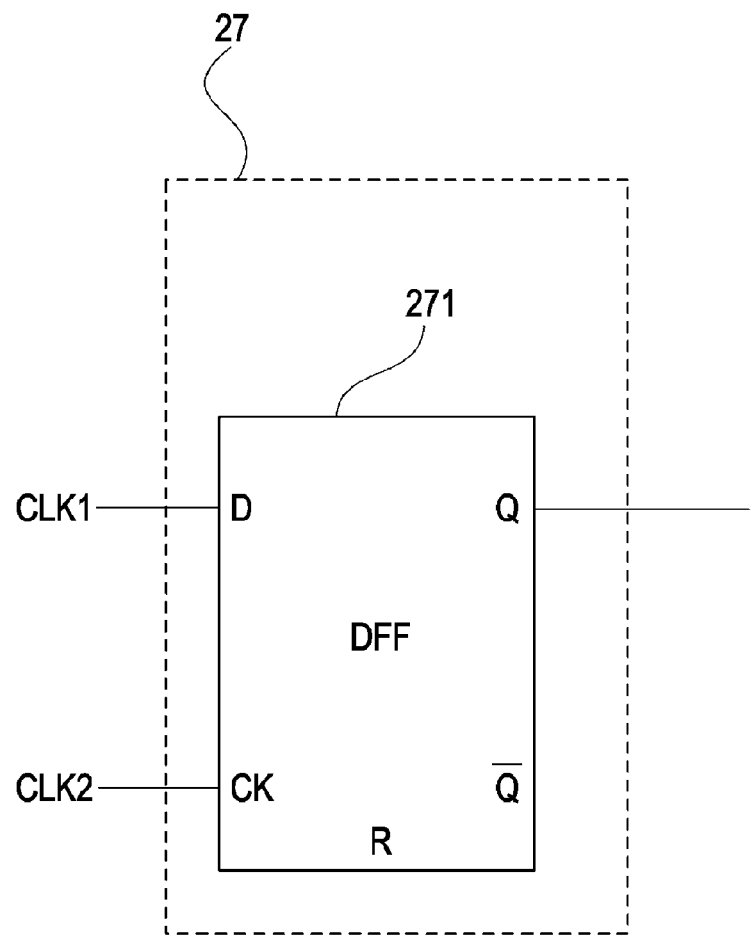
FIG. 52 is a diagram illustrating another configuration example of a phase comparison circuit.
FIG. 53 is a diagram for describing the operating state of the phase comparison circuit shown in FIG. 52.

In the case of this circuit configuration, the output buffer circuit 27 operates with the relation shown in FIG. 53. That is to say, in the event that the state is a locked state or the phase of the output clock CLK2 is behind the phase of the input clock CLK1, the Q output is "H" level, and in the event that the phase of the output clock CLK2 is ahead of the phase of the input clock CLK1, the Q output is "L" level.

Figure 54:
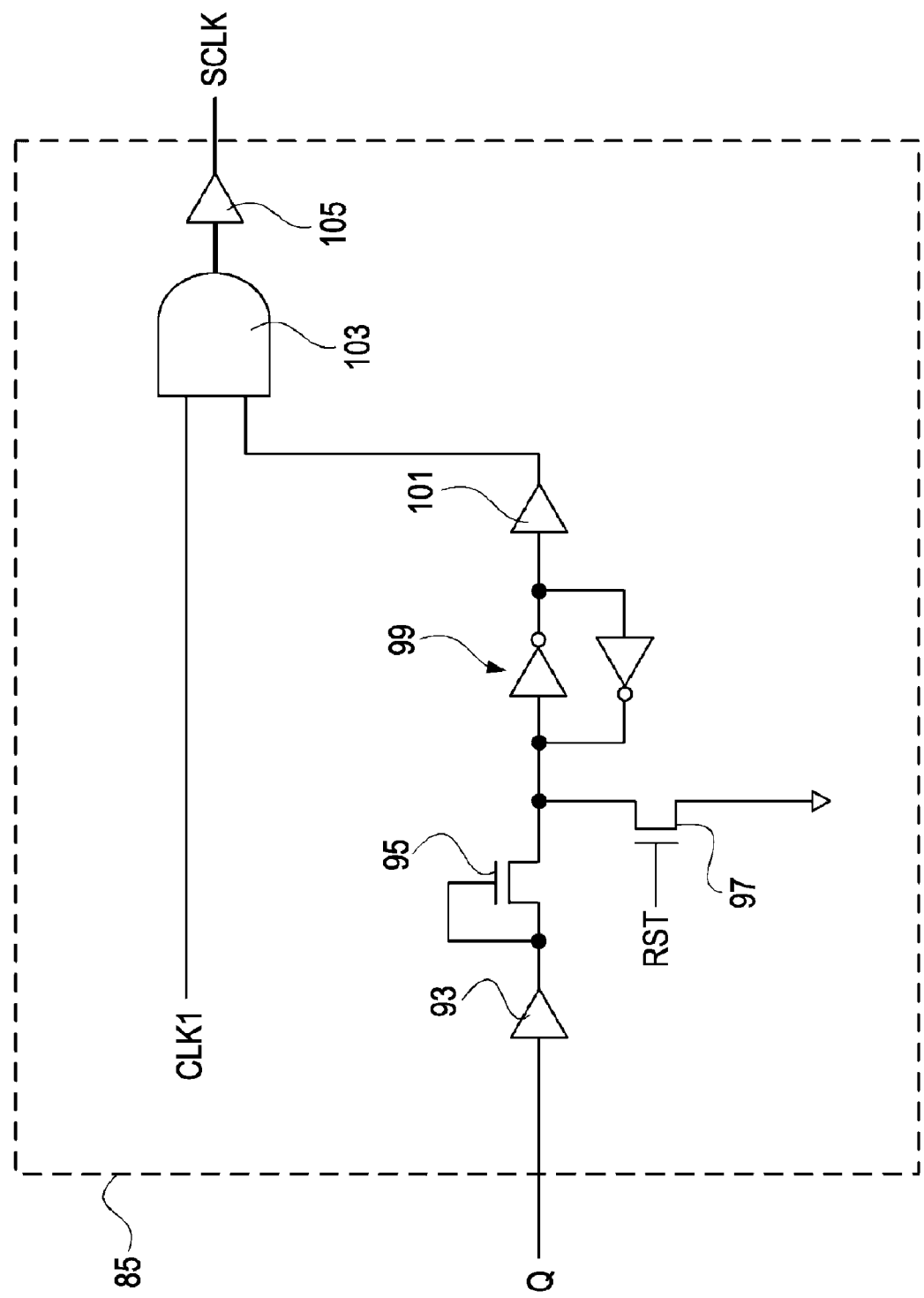
FIG. 54 is a diagram illustrating a configuration example of a shift clock generating unit to which the phase comparison circuit shown in FIG. 52 has been applied.

This Q output is the same as the output of the charge pump 91 (FIG. 19) making up the shift clock generating unit 85. Accordingly, in the event of using the output buffer circuit 27 having the circuit configuration shown in FIG. 52, the circuit configuration of the shift clock generating unit 85 can be that shown in FIG. 54. That is to say, a circuit configuration wherein the charge pump 91 is omitted from the circuit configuration of the shift clock generating unit 85 described with FIG. 19 will suffice.

Figure 55:
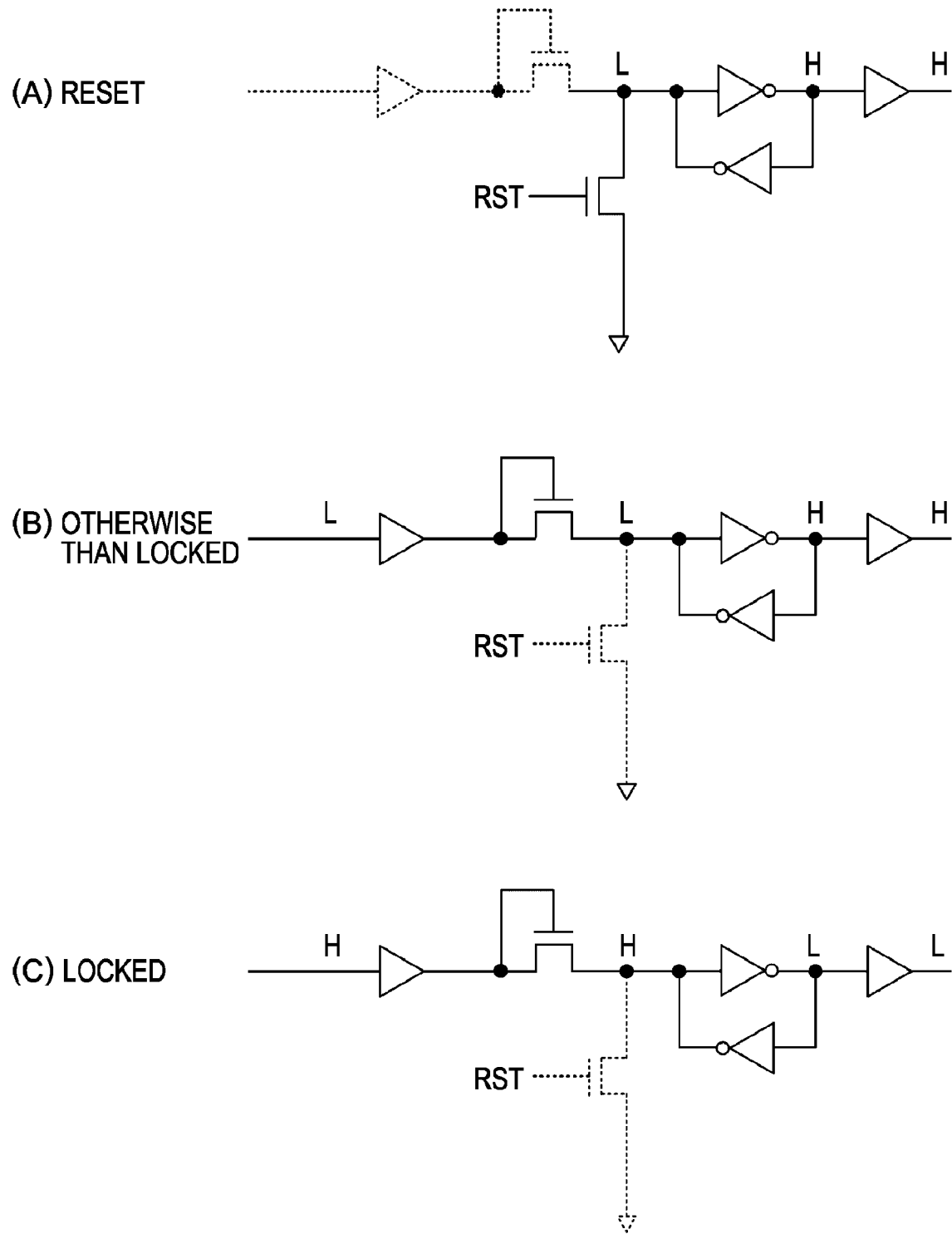
FIG. 55 is a diagram for explaining the operating state of the shift clock generating unit shown in FIG. 54.

The operations of the shift clock generating unit 85 in the event of employing this circuit configuration are shown in FIG. 55. The operations shown in FIG. 55 are identical to the operations shown in FIG. 21, described with the first embodiment.

G-5 Others

Various modifications may be made of the above-described embodiments within the spirit and scope of the present invention, including for example, various modifications and applications created or obtained as combinations, based on the descriptions in the present Specification. It should be understood by those skilled in the art that various modifications, combinations, sub-combinations and alterations may occur depending on design requirements and other factors insofar as they are within the scope of the appended claims or the equivalents thereof.

What is claimed is:

1. A delay synchronization loop type clock signal generating circuit, comprising:
 a delay line for delaying a first clock signal by a set delay amount;
 a delay time length setting unit for setting a delay time length of said delay line, based on a phase difference between a second clock signal output from an output terminal and said first clock signal;
 a phase relation determining unit that detects whether or not the phase relation of said first clock signal and said second clock signal are in a particular phase relation; and
 a phase inversion/non-inversion unit that performs phase inversion of said first clock signal on a transmission path including said delay line, at the time of detecting said particular phase relation,
 wherein,
 the phase inversion/non-inversion unit sends the first clock signal through one transmission path having two inverters or another transmission path having one inverter.

2. The delay synchronization loop type clock signal generating circuit according to claim 1, further comprising:
 a pseudo lock state detecting unit for detecting a pseudo lock state between said first clock signal and said second clock signal; and
 a pseudo lock state disengaging unit for instructing said phase inversion/non-inversion unit to perform phase inversion upon detecting a pseudo lock state.

3. The delay synchronization loop type clock signal generating circuit according to claim 1, wherein said phase relation determining unit determines whether or not said particular phase relation has occurred during a reset period, and instructs inversion or non-inversion to said phase inversion/non-inversion unit following ending of the reset period.

4. The delay synchronization loop type clock signal generating circuit according to claim 1, wherein said particular phase relation is a state in which the phase of said second clock signal is advanced as to that of said first clock signal.

5. The delay synchronization loop type clock signal generating circuit according to claim 1, wherein said particular phase relation is a state in which the phase of said second clock signal is delayed as to that of said first clock signal.

6. The delay synchronization loop type clock signal generating circuit according to claim 1, wherein active elements configuring said delay synchronization loop type clock signal generating circuit are formed on an insulating substrate using thin-film forming techniques or printing techniques.

* * * * *